(12) United States Patent
Cho et al.

(10) Patent No.: US 9,751,453 B2
(45) Date of Patent: Sep. 5, 2017

(54) LAMP UNIT PRODUCING VARIOUS BEAM PATTERNS

(71) Applicant: LG INNOTEK CO., LTD., Seoul (KR)

(72) Inventors: Yun Min Cho, Seoul (KR); Gun Kyo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/064,324

(22) Filed: Mar. 8, 2016

(65) Prior Publication Data

US 2016/0185277 A1 Jun. 30, 2016

Related U.S. Application Data

(63) Continuation of application No. 13/939,842, filed on Jul. 11, 2013, now Pat. No. 9,308,858.

(30) Foreign Application Priority Data

Jul. 13, 2012 (KR) .................. 10-2012-0076858
Jul. 3, 2013 (KR) .................. 10-2013-0077499

(51) Int. Cl.
*B60Q 1/08* (2006.01)
*F21S 8/10* (2006.01)
(Continued)

(52) U.S. Cl.
CPC ............. *B60Q 1/085* (2013.01); *B60Q 1/06* (2013.01); *F21S 48/115* (2013.01);
(Continued)

(58) Field of Classification Search
CPC .. F21S 48/115; F21S 48/1109; F21S 48/1747; F21S 48/212; F21S 48/215; F21V 7/22
See application file for complete search history.

(56) References Cited

U.S. PATENT DOCUMENTS 5,837,994 A 11/1998 Stam et al.
6,406,173 B1 6/2002 Serizawa et al.
(Continued)

FOREIGN PATENT DOCUMENTS

CN 1752514 3/2006
CN 101451666 6/2009
(Continued)

OTHER PUBLICATIONS

U.S. Office Action issued in parent U.S. Appl. No. 13/939,842 dated Jul. 2, 2015.
(Continued)

*Primary Examiner* — Joseph L Williams
(74) *Attorney, Agent, or Firm* — KED & Associates, LLP

(57) ABSTRACT

A lamp unit may be provided that includes: a first substrate; a second substrate disposed on the first substrate; and a plurality of light sources disposed on the second substrate, wherein at least two light source arrays are provided, in each of which a plurality of the light sources are disposed in a row, wherein at least a first light source array and a second light source array among the light source arrays are individually driven, wherein the second substrate comprises an upper surface including a first surface on which the first light source array is disposed and a second surface on which the second light source array, and wherein the first surface is higher than the second surface.

20 Claims, 53 Drawing Sheets

(51) Int. Cl.
  *B60Q 1/06* (2006.01)
  *F21V 7/22* (2006.01)
  *H05B 33/08* (2006.01)
  *H01L 25/075* (2006.01)

(52) U.S. Cl.
  CPC ....... *F21S 48/1109* (2013.01); *F21S 48/1747* (2013.01); *F21S 48/212* (2013.01); *F21S 48/215* (2013.01); *F21V 7/22* (2013.01); *H05B 33/0803* (2013.01); *H01L 25/0753* (2013.01); *H01L 25/0756* (2013.01)

(56) References Cited

U.S. PATENT DOCUMENTS

| | | | |
|---|---|---|---|
| 6,412,971 | B1 | 7/2002 | Wojnarowski et al. |
| 6,431,728 | B1 | 8/2002 | Fredericks et al. |
| 6,520,669 | B1 | 2/2003 | Chen et al. |
| 7,896,512 | B2 | 3/2011 | Tatara et al. |
| 8,899,782 | B2 | 12/2014 | Sikkens et al. |
| 2004/0136197 | A1 | 7/2004 | Ishida |
| 2007/0120137 | A1 | 5/2007 | Wilson et al. |
| 2008/0062712 | A1 | 3/2008 | Woodward |
| 2009/0184330 | A1 | 7/2009 | Okimura |
| 2012/0170300 | A1 | 7/2012 | Kathmann et al. |
| 2012/0188489 | A1 | 7/2012 | Baba et al. |
| 2012/0201040 | A1 | 8/2012 | Naganawa |
| 2012/0256560 | A1 | 10/2012 | Yun |
| 2012/0320591 | A1 | 12/2012 | Liao et al. |
| 2013/0051014 | A1 | 2/2013 | Sikkens et al. |
| 2013/0107517 | A1 | 5/2013 | Shih et al. |
| 2013/0128603 | A1 | 5/2013 | Chen |
| 2013/0134446 | A1 | 5/2013 | Wang |
| 2013/0258662 | A1 | 10/2013 | Treanton et al. |
| 2013/0343051 | A1 | 12/2013 | Holman et al. |
| 2014/0098556 | A1 | 4/2014 | Von Malm et al. |

FOREIGN PATENT DOCUMENTS

| | | |
|---|---|---|
| CN | 201736886 | 2/2011 |
| CN | 102519003 | 6/2012 |
| JP | 2004-158294 | 6/2004 |
| JP | 2004-21414 | 7/2004 |
| JP | 2007-115577 | 5/2007 |
| JP | 2008-513967 | 5/2008 |
| JP | 2009-99715 | 5/2009 |
| JP | 2009-176809 | 8/2009 |
| JP | 2009-184642 | 8/2009 |
| JP | 2011-90903 | 5/2011 |
| WO | WO 2011/114270 | 9/2011 |

OTHER PUBLICATIONS

U.S. Notice of Allowance issued in U.S. Appl. No. 13/939,842 dated Dec. 9, 2015.
U.S. Office Action dated Feb. 12, 2015 issued in co-pending U.S. Appl. No. 13/738,872.
U.S. Office Action dated Aug. 13, 2015 issued in co-pending U.S. Appl. No. 13/738,872.
U.S. Office Action dated Jan. 14, 2016 issued in co-pending U.S. Appl. No. 13/738,872.
U.S. Office Action dated Feb. 14, 2016 issued in co-pending U.S. Appl. No. 13/738,872.
U.S. Office Action dated Mar. 21, 2017 issued in co-pending U.S. Appl. No. 13/738,872.
U.S. Office Action dated Jul. 14, 2016 issued in co-pending U.S. Appl. No. 13/738,872.

LAMP UNIT PRODUCING VARIOUS BEAM PATTERNS

CROSS-REFERENCE TO RELATED APPLICATIONS

This application is a Continuation Application of prior U.S. patent application Ser. No. 13/939,842, filed Jul. 11, 2013 (U.S. Pat. No. 9,308,858 issued on Apr. 12, 2016), which claims priority under 35 U.S.C. §119 to Korean Patent Application Nos. 10-2012-0076858, filed Jul. 13, 2012, and 10-2013-0077499, filed Jul. 3, 2013, whose entire disclosures are hereby incorporated by reference.

BACKGROUND

1. Field

The embodiment relates to a lamp unit and a lighting system for a vehicle.

2. Description of Related Art

In general, a lamp refers to a device for providing or controlling light for the specific purpose. An incandescent bulb, a fluorescent lamp, a neon lamp, etc., may be used as a light source of the lamp, and recently, a light emitting diode (LED) is also being used. The LED is a device which converts an electrical signal into infrared ray or light by using compound semiconductor characteristics. Unlike the fluorescent lamp, the LED does not use harmful substances such as mercury or the like and causes less environmental pollution. The LED has a longer lifespan than those of the incandescent bulb, the fluorescent lamp and the neon lamp. Compared with the incandescent bulb, the fluorescent lamp and the neon lamp, the LED has low power consumption, less glare and excellent visibility due to high color temperature.

A lamp unit may be used in a backlight, a display device, a lighting lamp, an indicating lamp for a vehicle, or a head lamp, etc. In particular, since the lamp unit used in the vehicle is very closely related to safe driving of the vehicle, it is very important to allow a driver of the vehicle adjacent to a traveling vehicle to clearly identify the light emitting states. Therefore, it is necessary that the lamp unit used in the vehicle should obtain not only the light intensity appropriate for safe driving standards but also the aesthetic features of the vehicle's appearance.

Also, the vehicle includes a lighting device which is used to allow a driver to see objects well in a traveling direction when driving and is used to cause drivers of other vehicles and road users to recognize the driving conditions of his/her own vehicle.

Here, the lighting device is a head lamp which is attached to the front of the vehicle and functions to throw light on the road along which the vehicle moves forward. Usually, the head lamp is formed by integrally attaching a low beam for irradiating a short distance and a high beam for irradiating a long distance, so that the low beam or the high beam is lighted according to the driver's choice.

The lighting pattern of the head lamp is required to meet a basic objective to throw light as much as possible in such a manner that the driver is able to obtain the best driving visibility, and is required to also meet an objective to maintain the minimum glare in such a manner that a driver of another vehicle coming from the opposite lane is able to safely drive.

However, such a head lamp for a vehicle provides only fixed directional lighting irrespective of the variously changing ambient conditions, road conditions and the state of the vehicle, and cannot reflect the changes according to the ambient conditions when driving.

Therefore, in a condition where a front visibility is extremely unfavorable, for example, fog, heavy rain or the like, it is hard for the conventional head lamp to obtain sufficient visibility required for safe driving of the driver. Further, in a highway where vehicles travel at a high speed, a larger amount of light capable of traveling a longer distance is necessary due to the speed of the vehicle. However, the conventional head lamp provides a lighting pattern of a general road without satisfying the requirement.

Also, while it is important to obtain ambient visibility and short distance visibility rather than long distance visibility in roads in cities well-equipped with lighting, the conventional head lamp is configured to be suitable for a medium distance and a long distance, so that energy cannot be efficiently utilized.

Additionally, the conventional head lamp is configured to light only the front of the vehicle. Therefore, when the vehicle is tilted by driving on the sloping road of an intersection or a curved road, it is not possible to light in such a manner that the driver can obtain visibility appropriate for this case.

The above references are incorporated by reference herein where appropriate for appropriate teachings of additional or alternative details, features and/or technical background.

SUMMARY

One embodiment is a lamp unit. The lamp unit includes: a first substrate; a second substrate disposed on the first substrate; and a plurality of light sources disposed on the second substrate. At least two light source arrays are provided, in each of which a plurality of the light sources are disposed in a row. At least a first light source array and a second light source array among the light source arrays are individually driven.

The plurality of the light sources included in the first light source array may be individually driven. The plurality of the light sources included in the second light source array may be interlinked with the plurality of the light sources included in the first light source array.

At least one of the numbers of, luminous fluxes of, distances between, light emission directions of, and disposition planes of the light sources included in the first light source array and the light sources included in the second light source array may be mutually different.

A distance between a first parallel line extending from an upper surface of the light source included in the first light source array and a second parallel line extending from an upper surface of the light source included in the second light source array may be less than a distance between the upper surface and a lower surface of the light source included in the first light source array or the second light source array.

A first parallel line extending from an upper surface of the light source included in the first light source array may meet an upper surface or a side surface of the light source included in the second light source array.

The first light source array may be supported by a first area of the second substrate. The second light source array may be supported by a second area of the second substrate. An angle between a surface of the first area of the second substrate facing the first light source array and a surface of the second area of the second substrate facing the second light source array may be from 91 to 179 degrees.

In the light sources included in the light source array, a luminous flux of the light source disposed in the central area of the light source array may be larger than a luminous flux of the light source disposed in the edge area of the light source array.

A distance between the light sources included in the light source array may be increased toward the edge area from the central area of the light source array.

At least two of the light sources included in the light source array may be disposed on different planes or have different luminous fluxes.

The first substrate may be a metal substrate having a first thermal conductivity. The second substrate may be an insulating substrate having a second thermal conductivity.

The first thermal conductivity of the first substrate may be greater than the second thermal conductivity of the second substrate.

The first substrate may include a cavity formed in a predetermined area thereof. The second substrate may be disposed in the cavity of the first substrate.

The first substrate and the second substrate may be formed of the same material.

A surface of the second substrate may be a concave surface.

The second substrate may include at least one projection protruding from the surface thereof by a predetermined height.

The lamp unit may further include a barrier disposed around a plurality of the light sources. The barrier may include a metallic reflective material.

A distance d11 between the light sources included in the first light source array is less than a distance d13 between the light source included in the first light source array and the light source included in the second light source array.

A ratio of the distance d11 and the distance d13 may be 1:1.1~1:10.

Another embodiment is a vehicle lamp device. The vehicle lamp device includes: a lamp unit generating light; a reflector which reflects the light generated from the lamp unit and changes a direction of the light; and a lens which refracts the light reflected from the reflector. The lamp unit may use the above-described lamp unit.

Further another embodiment is a vehicle lighting system. The vehicle lighting system includes: a sensor unit sensing ambient conditions of the vehicle; a head lamp including a lamp unit which includes a first substrate, a second substrate disposed on the first substrate, and n number of light source arrays (n is an integer equal to or greater than 2) formed by disposing a plurality of light sources on the second substrate, wherein the light source array includes a first light source array and a second light source array, which are adjacent to each other, are electrically isolated from each other and are individually driven; and an electronic control unit individually driving the first light source array and the second light source array in accordance with the sensing result produced by the sensor unit.

BRIEF DESCRIPTION OF THE DRAWINGS

The embodiments will be described in detail with reference to the following drawings in which like reference numerals refer to like elements wherein.

DETAILED DESCRIPTION

Figure 1:
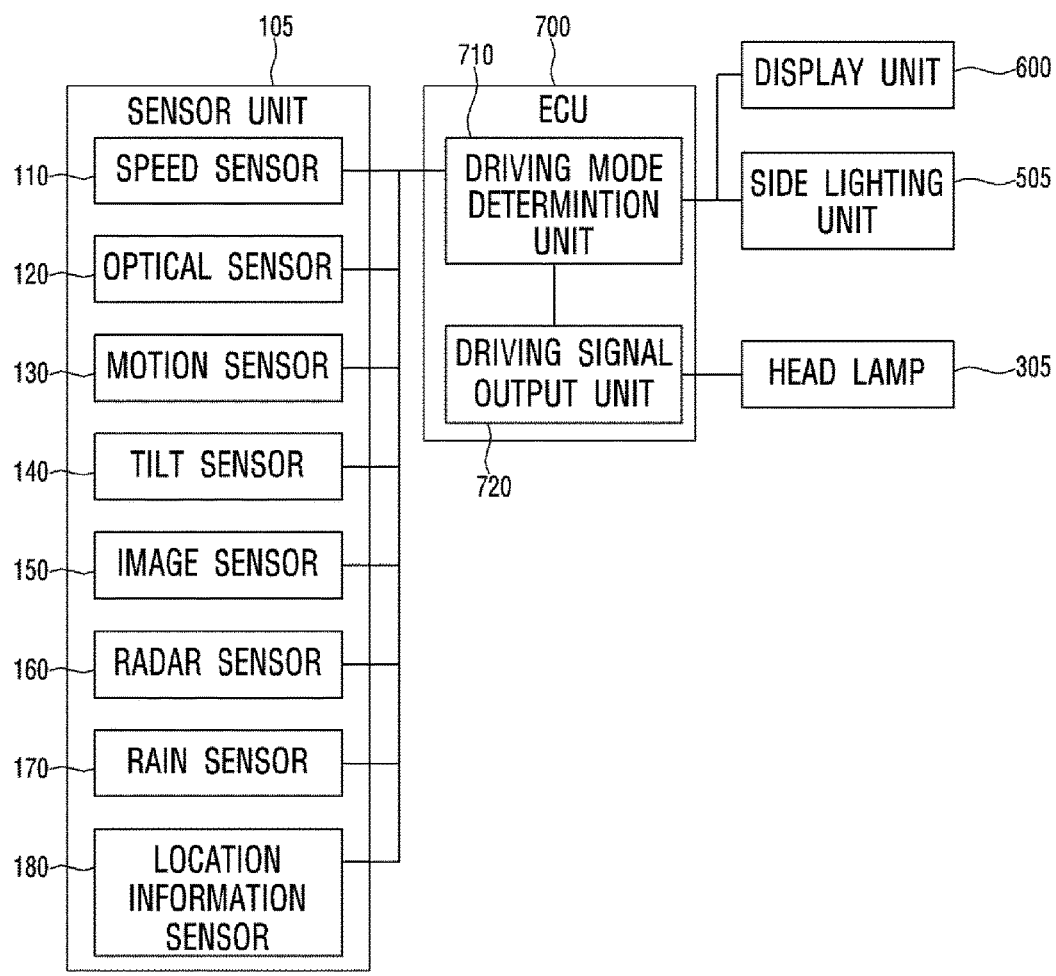
FIG. 1 is a block diagram showing a configuration of a lighting system according to an embodiment.

Hereafter, exemplary embodiments that can be easily embodied by a person having ordinary skill in the art to which the embodiment belongs will be described in detail with reference to the accompanying drawings. However, the embodiments and the constitution illustrated in the drawings are merely preferable embodiments, so that it should be understood that various equivalents and modifications can exist which can replace the embodiments described in the time of the application. Also, in the detailed description of the operation principle of the exemplary embodiment, the detailed description of known functions and configurations incorporated herein is omitted to avoid making the subject matter of the present invention unclear. The below-mentioned terms are defined in consideration of the functions of the embodiment. The meaning of each term should be construed based on this entire specification. Throughout the drawings, parts having similar functions and operations are given the same reference numeral.

The embodiment provides a lighting system for a vehicle. In the lighting system for a vehicle in accordance with the embodiment of the present invention, a sensor unit capable of sensing ambient conditions of the vehicle is interlinked with an electronic control unit capable of controlling the head lamp of the vehicle, and individually operable lamp units are employed, so that it is possible to implement a variety of lighting patterns appropriate for the ambient conditions of the vehicle, to improve the convenience for users by more efficiently controlling the vehicle, and to save energy.

[Lighting System According to the Embodiment]

FIG. 1 is a block diagram showing a configuration of a lighting system according to an embodiment.

Referring to FIG. 1, a vehicle lighting system 10 according to the embodiment may include a sensor unit 100, an electronic control unit (ECU) 700 and a head lamp 305 including a lamp unit. The sensor unit 100 is able to sense the ambient conditions of the vehicle. The sensor unit 100 may include at least any one of a speed sensor 110 sensing the speed of the vehicle, an optical sensor 120 sensing the light intensity, a motion sensor 130 sensing the movement of the vehicle, for example, forward and backward movement, right and left turning, etc., a tilt sensor 140 sensing the tilt of the vehicle, an image sensor 150 like CMOS or CCD, etc., sensing the ambient images of the vehicle, a radar sensor 160 sensing a distance between an obstacle and the vehicle or between the vehicle and another vehicle, a rain sensor 170 sensing moisture like rainwater, and a location information sensor 180. However, the sensor unit 100 is not limited to include the aforementioned sensors, and may include any sensor capable of sensing the ambient conditions of the vehicle. For example, the sensor unit 100 may include a sensor capable of sensing sound, wind, smoke, gravity, location, etc. Through the sensor unit 100, it is possible to sense various ambient conditions of the vehicle.

The ECU 700 is able to individually drive light sources constituting a lamp unit in accordance with the sensing result produced by the sensor unit 100. For example, when the lamp unit includes a plurality of light source arrays, the ECU 700 is able to individually drive the plurality of the light source arrays in accordance with the sensing result produced by the sensor unit 100. Therefore, a lighting pattern can be implemented, which is appropriate for the ambient conditions of the vehicle.

The ECU 700 may include a driving mode determination unit 710 which determines the driving mode of the vehicle in accordance with the driving environment by means of the sensing value sensed by the sensor unit 100 and may include a driving signal output unit 720 which outputs a driving signal for driving the lamp unit on the basis of the driving mode determined by the driving mode determination unit 710.

Here, the driving mode determined by the driving mode decision unit 710 may be comprised of a normal driving mode, a high-speed driving mode, a slow driving mode, a parking mode, a stop mode, an city driving mode, a suburban driving mode, a curve driving mode, a slope driving mode, a rain driving mode, an oncoming vehicle anti-glare driving mode. This will be described in detail with reference to the following drawings.

The head lamp 305 may include the lamp unit which includes a first substrate, a second substrate disposed on the first substrate, and a plurality of light source arrays formed by disposing a plurality of the light sources on the second substrate. A first light source array and a second light source array are adjacent to each other and are electrically isolated from each other. The first light source array and the second light source array may be individually driven.

Here, the head lamp 305 may further include a reflector which changes the direction of light generated from the lamp unit, and a lens which refracts the light reflected from the reflector. The light source may be a light emitting diode.

As such, through the use of the lamp unit which can be individually driven, it is possible to provide a variety of beam patterns, light colors and luminous fluxes of light in accordance with the ambient conditions of the vehicle. An optimum luminous flux can be provided by a small number of the light sources and the overall size of the lamp unit can be reduced. Also, there is no need to provide a separate driving device which pivots the lamp unit in the up, down, right and left directions.

The lamp unit will be described in detail later in FIGS. 10 to 19.

The vehicle lighting system according to the embodiment may further include a display unit 600 which displays an image sensed by the sensor unit 100. For example, the vehicle lighting system may further include the display unit 600 which displays an image sensed by the image sensor 150. The display unit 600 may be disposed within the vehicle such that the driver can watch the display unit 600. For instance, the display unit 600 may be disposed on the rearview mirror.

Also, the vehicle lighting system according to the embodiment may further include a side lighting unit 505 disposed on both sides of the vehicle, e.g., the side or rear of the outside mirror, etc.

When the parking mode is determined by the driving mode determination unit 710, the side lighting unit 505 is operated, and then light is provided on both sides of the parking vehicle, so that the convenience for the driver can be enhanced.

[Patterns of Beams Irradiated from the Lamp Unit]

FIGS. 2 to 9 are front views showing patterns of beams irradiated from a lamp unit of a heat lamp shown in FIG. 1 in accordance with the embodiment. Referring to FIGS. 1 to 9, based on the driving mode determined by the driving mode determination unit 710 in accordance with the sensing value sensed by the sensor unit 100, patterns of the beams irradiated from the head lamp 305 including the lamp unit are shown.

Figure 2:
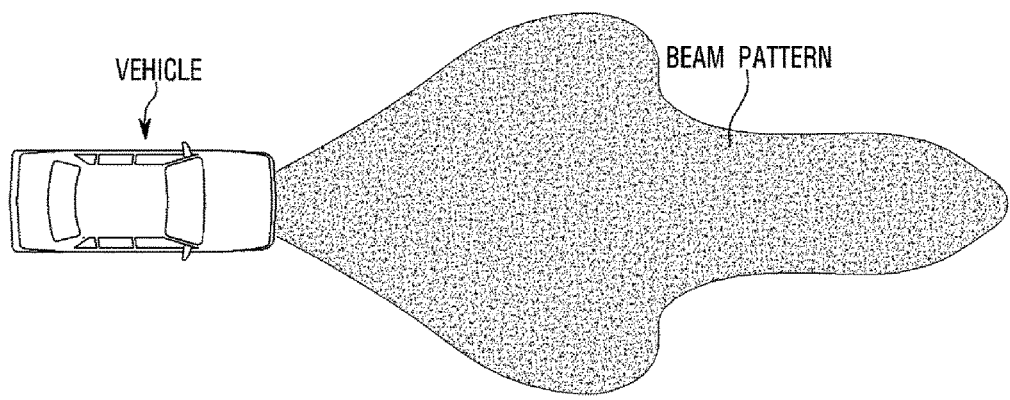
FIGS. 2 to 9 are front views showing patterns of beams irradiated from a lamp unit of a heat lamp shown in FIG. 1 in accordance with the embodiment.

FIG. 2 is a front view showing a beam pattern when the driving mode of the vehicle is determined to the normal driving mode by the driving mode determination unit 710 in accordance with the sensing value sensed by the sensor unit 100. When the vehicle travels on a normal road, the driving mode determination unit 710 may determine the driving mode of the vehicle to the normal driving mode by using at least one of the speed sensor 110, the motion sensor 130 and the image sensor 150. When the speed sensor 110 detects a normal speed or when the motion sensor 130 detects the forward movement of the vehicle or when the image sensor 150 detects a front object, the driving mode determination unit 710 may determine the driving mode of the vehicle to the normal driving mode. Here, the normal speed may be within a predetermined range of a reference speed.

In the embodiment, while the normal driving mode is determined by using the speed sensor 110, the motion sensor 130 and the image sensor 150, the kind of the sensor is not limited to this. The normal driving mode may be determined by using another kind of sensor.

When the driving mode of the vehicle is determined to the normal driving mode, through the individual operation of the light sources included in the lamp unit in a normal environment, it is possible to implement a beam pattern of a low beam which widely irradiates the short-distance front and a portion of the long-distance front.

Figure 3:
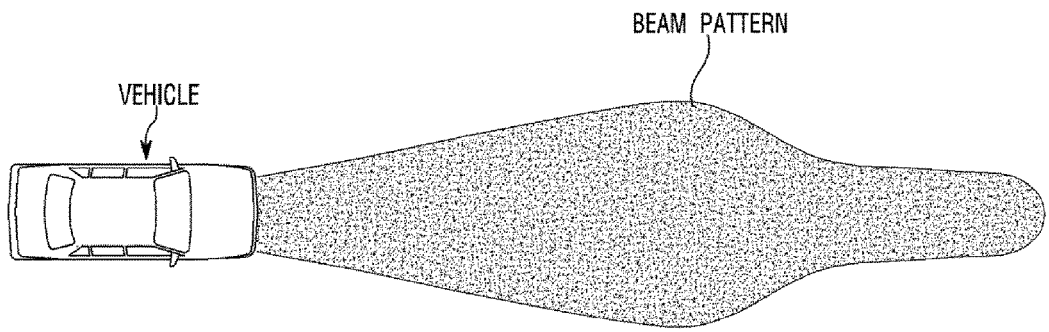

FIG. 3 is a front view showing a beam pattern when the driving mode of the vehicle is determined to the high-speed driving mode by the driving mode determination unit 710. When the vehicle travels on a highway at a high speed, the driving mode determination unit 710 may determine the driving mode of the vehicle to the high-speed driving mode by using at least one of the speed sensor 110, the optical sensor 120, the motion sensor 130 and the image sensor 150.

For example, when the speed sensor 110 detects a high speed or when the motion sensor 130 detects the forward movement of the vehicle or when the image sensor 150 detects a front object, the driving mode determination unit 710 may determine the driving mode of the vehicle to the high-speed driving mode. Here, the high speed may be within a predetermined range of a reference speed.

In the embodiment, while the normal driving mode is determined by using the speed sensor 110, the motion sensor 130 and the image sensor 150, the kind of the sensor is not limited to this. The normal driving mode may be determined by using another kind of sensor.

When the driving mode of the vehicle is determined to the high-speed driving mode, through the individual operation of the light sources included in the lamp unit, it is possible to implement a beam pattern of the high-speed driving mode, which is capable of irradiating the short-distance, medium-distance and long-distance fronts and of more widely irradiating the medium-distance front.

Figure 4:
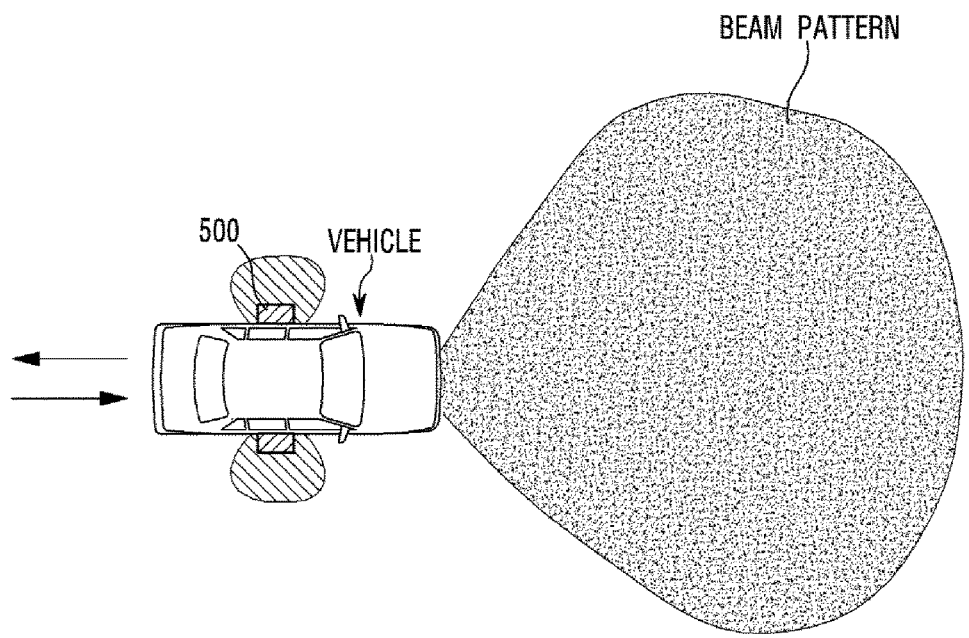

FIG. 4 is a front view showing a beam pattern when the driving mode of the vehicle is determined to the parking driving mode by the driving mode determination unit 710. When the vehicle is parked through the forward and backward movement, the driving mode determination unit 710 may determine the driving mode of the vehicle to the parking mode by using at least one of the speed sensor 110, the motion sensor 130, the image sensor 150 and the radar sensor 160.

When the speed sensor 110 detects a low speed, or when the motion sensor 130 detects the forward and backward movement and stop or when the image sensor 150 detects an approaching object in the font or rear or when the radar sensor detects an object, the driving mode determination unit 710 may determine the driving mode of the vehicle to the parking mode. Here, the low speed may be within a predetermined range of a reference speed.

In the embodiment, while the parking mode is determined by using the speed sensor 110 and the motion sensor 130, the kind of the sensor is not limited to this. The parking mode may be determined by using another kind of sensor.

When the driving mode of the vehicle is determined to the parking mode, through the individual operation of the light sources included in the lamp unit, it is possible to implement a beam pattern of the parking mode, which is capable of more widely irradiating the short-distance front. Here, as described above, the side lighting unit 505 is operated, which helps the driver to park the vehicle, and the driver is able to identify the image, which is outputted by the image sensor 150, through the display unit 600.

Figure 5:
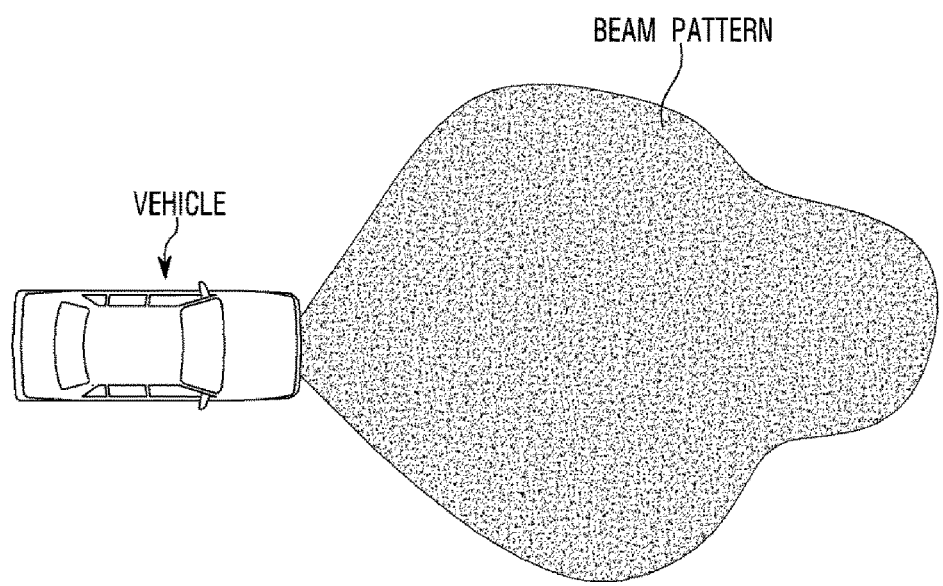

FIG. 5 is a front view showing a beam pattern when the driving mode of the vehicle is determined to the city driving mode by the driving mode determination unit 710. When the vehicle travels on a road in cities well-equipped with exterior lighting like a street lamp, a signboard and the like, the driving mode determination unit 710 may determine the driving mode of the vehicle to the city driving mode by using at least one of the speed sensor 110, the optical sensor 120 and the location information sensor 180.

When the speed sensor 110 detects the normal speed or when the optical sensor 120 detects the light intensity greater than a certain value or when the location information sensor 180 detects that the vehicle is located in the city, the driving mode determination unit 710 may determine the driving mode of the vehicle to the city driving mode. A global positioning system (GPS) may be used as the location information sensor 180.

In the embodiment, while the city driving mode is determined by using the speed sensor 110, the optical sensor 120 and the location information sensor 180, the kind of the sensor is not limited to this. The city driving mode may be determined by using another kind of sensor.

When the driving mode of the vehicle is determined to the city driving mode, through the individual operation of the light sources included in the lamp unit, it is possible to implement a beam pattern of the city driving mode, which is capable of very widely irradiating the short-distance front.

Figure 6:
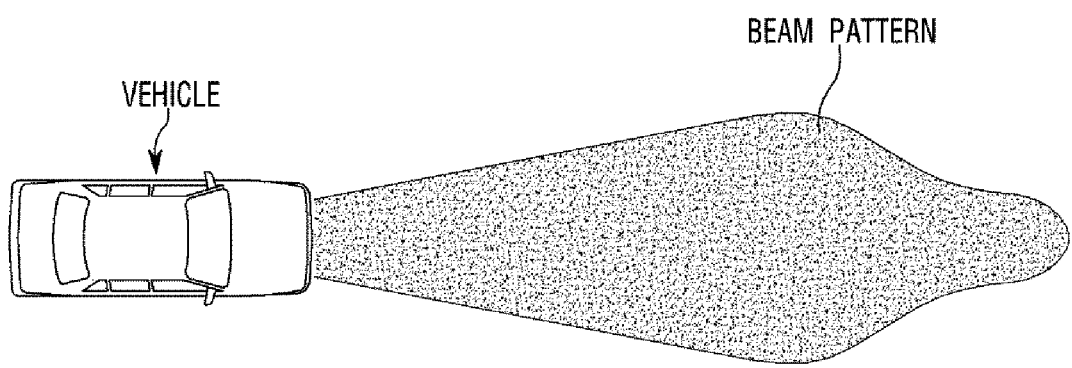

FIG. 6 is a front view showing a beam pattern when the driving mode of the vehicle is determined to the suburban driving mode by the driving mode determination unit 710. When the vehicle travels in the suburbs like a country road, the driving mode determination unit 710 may determine the driving mode of the vehicle to the suburban driving mode by using at least one of the speed sensor 110, the optical sensor 120, the radar sensor 160 and the location information sensor 180.

When the speed sensor 110 detects the normal speed or when the optical sensor 120 detects the light intensity less than a certain value or when the radar sensor 160 detects a plurality of front objects or when the location information sensor 180 detects that the vehicle is located in the suburbs, the driving mode determination unit 710 may determine the driving mode of the vehicle to the suburban driving mode. A global positioning system (GPS) may be used as the location information sensor 180.

In the embodiment, while the suburban driving mode is determined by using the speed sensor 110, the optical sensor 120, the radar sensor 160 and the location information sensor 180, the kind of the sensor is not limited to this. The suburban driving mode may be determined by using another kind of sensor.

When the driving mode of the vehicle is determined to the suburban driving mode, through the individual operation of the light sources included in the lamp unit, it is possible to implement a beam pattern of the suburban driving mode, which is capable of irradiating the short-distance, medium-distance and long-distance fronts by tilting the lamp unit more downward than the beam pattern of the high-speed driving mode.

Figure 7:
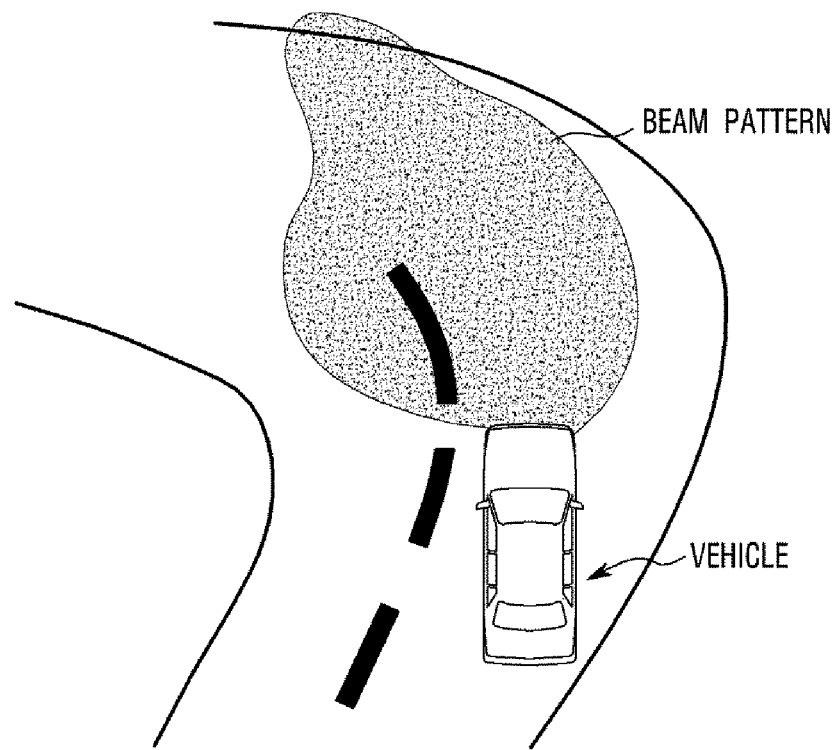

FIG. 7 is a front view showing a beam pattern when the driving mode of the vehicle is determined to the curve driving mode by the driving mode determination unit 710. When the vehicle travels on a curved road, the driving mode determination unit 710 may determine the driving mode of the vehicle to the curved driving mode by using at least one of the speed sensor 110, the motion sensor 130 and the tilt sensor 140.

When the speed sensor 110 detects a low speed or a normal speed or when the motion sensor 130 detects turning or when the tilt sensor 140 detects the tilt of the vehicle, the driving mode determination unit 710 may determine the driving mode of the vehicle to the curved driving mode.

In the embodiment, while the curved driving mode is determined by using the speed sensor 110, the motion sensor 130 and tilt sensor 140, the kind of the sensor is not limited to this. The curved driving mode may be determined by using another kind of sensor.

When the driving mode of the vehicle is determined to the curved driving mode, through the individual operation of the light sources included in the lamp unit, it is possible to implement a beam pattern of the curved driving mode, which is capable of irradiating the road in the turning direction.

Figure 8:
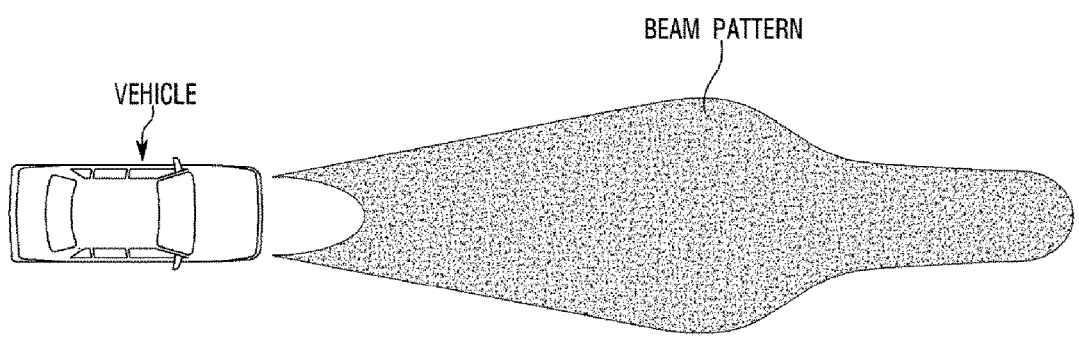

FIG. 8 is a front view showing a beam pattern when the driving mode of the vehicle is determined to the rain driving mode by the driving mode determination unit 710. When the vehicle travels on a wet road, the driving mode determination unit 710 may determine the driving mode of the vehicle to the rain driving mode by using at least one of the optical sensor 120, the radar sensor 160 and the rain sensor 170.

When the optical sensor 120 detects the light intensity less than a certain value or when the radar sensor 160 or the rain sensor 170 detects rain, etc., the driving mode determination unit 710 may determine the driving mode of the vehicle to the rain driving mode.

In the embodiment, while the rain driving mode is determined by using the optical sensor 120, the radar sensor 160 and the rain sensor 170, the kind of the sensor is not limited to this. The rain driving mode may be determined by using another kind of sensor.

When the driving mode of the vehicle is determined to the rain driving mode, through the individual operation of the light sources included in the lamp unit, it is possible to implement a beam pattern of the rain driving mode, which is capable of blocking a portion of the short-distance front and of irradiating portions of the medium-distance and long-distance fronts.

Figure 9:
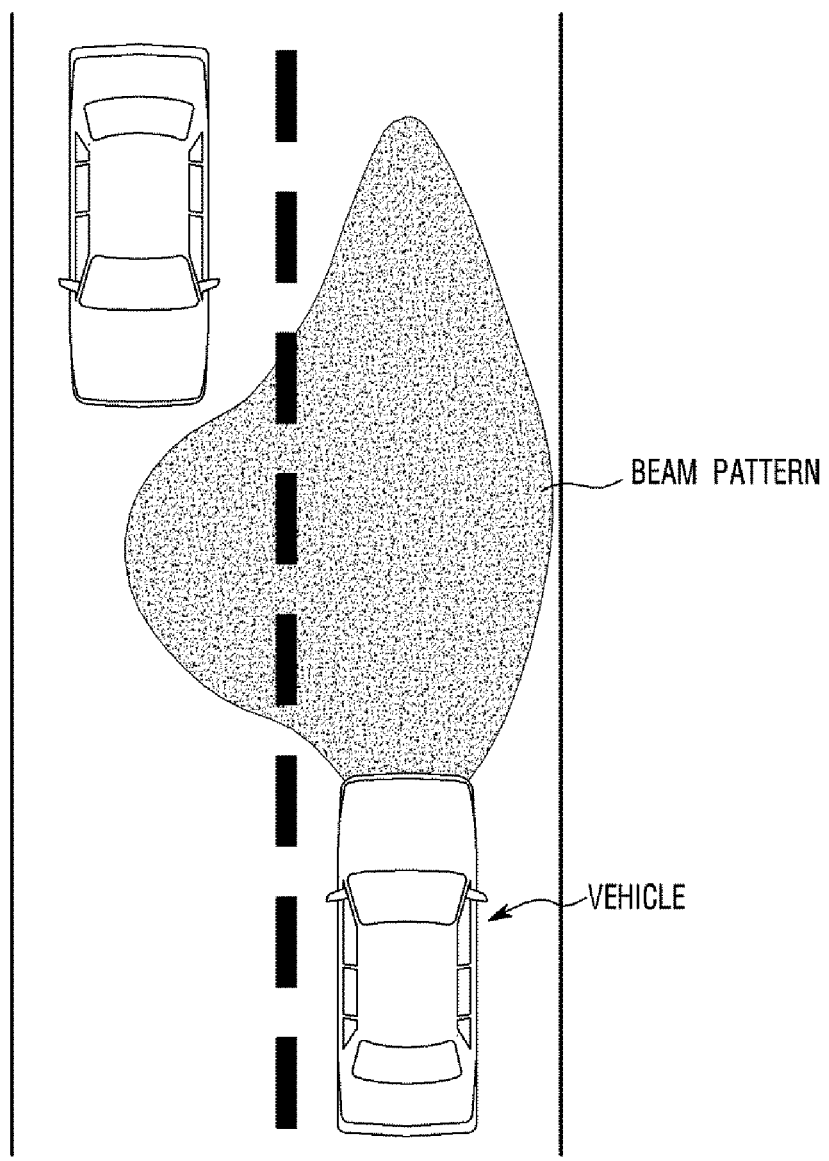

FIG. 9 is a front view showing a beam pattern when the driving mode of the vehicle is determined to the oncoming vehicle anti-glare driving mode by the driving mode determination unit 710. When another vehicle comes from the opposite lane of a traveling vehicle, the driving mode determination unit 710 may determine the driving mode of the vehicle to the oncoming vehicle anti-glare driving mode by using at least one of the optical sensor 120, the motion sensor 130, the image sensor 150 and the radar sensor 160.

When the optical sensor 120 detects the light generated from a lamp of the oncoming vehicle or when the motion sensor 130 detects the forward movement of the vehicle or when the image sensor 150 or the radar sensor 160 recognizes the oncoming vehicle, the driving mode determination unit 710 may determine the driving mode of the vehicle to the oncoming vehicle anti-glare driving mode.

In the embodiment, while the oncoming vehicle anti-glare driving mode is determined by using the optical sensor 120, the motion sensor 130, the image sensor 150 and the radar sensor 160, the kind of the sensor is not limited to this. The oncoming vehicle anti-glare driving mode may be determined by using another kind of sensor.

When the driving mode of the vehicle is determined to the oncoming vehicle anti-glare driving mode, through the individual operation of the light sources included in the lamp unit, it is possible to implement a beam pattern of the oncoming vehicle anti-glare driving mode, which is capable of irradiating the road other than another vehicle coming from the opposite lane in order to prevent a driver of the another vehicle from feeling glare.

[Configuration of the Lamp Unit]

Figure 10:
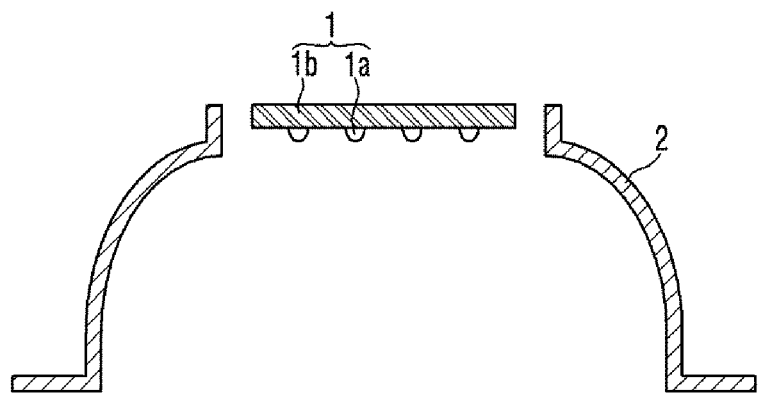
FIG. 10 is a view showing the overall structure of the lamp unit.

FIG. 10 is a view showing the overall structure of the lamp unit.

As shown in FIG. 10, the lamp unit may include a light source module 1 and a reflector 2 determining an angle of orientation of light emitted from the light source module 1. Here, the light source module 1 may include at least one LED light source 1a disposed on a printed circuit board (PCB) 1b. The reflector 2 collects light emitted from the LED light source 1a and allows the light to have a certain angle of orientation and to be emitted through an opening. A reflective surface may be disposed on the inner surface of the reflector 2.

Figure 11A:
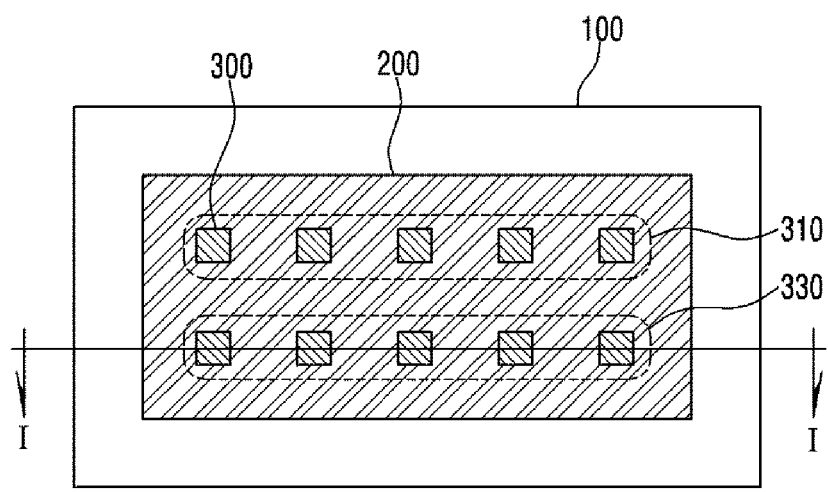
FIGS. 11a and 11b are a plan view and a cross sectional view, respectively for describing the lamp unit according to the embodiment.
Figure 11B:
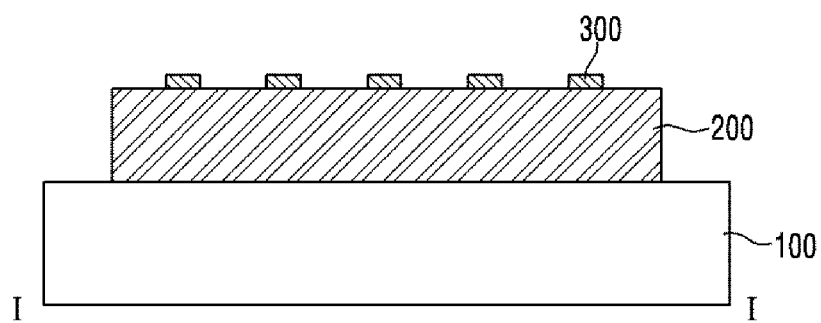

FIGS. 11a and 11b are a plan view and a cross sectional view, respectively for describing the lamp unit according to the embodiment.

As shown in FIGS. 11a and 11b, the embodiment may include a first substrate 100, a second substrate 200 and a plurality of light sources 300.

Here, the second substrate 200 may be disposed on the first substrate 100. The plurality of the light sources 300 may be disposed on the second substrate 200.

Here, the area of the second substrate 200 may be less than that of the first substrate 100. According to the circumstances, the area of the second substrate 200 may be equal to that of the first substrate 100.

A circuit pattern may be formed on the second substrate 200. The light source 300 may be electrically connected to the circuit pattern of the second substrate 200 via wires.

Subsequently, the first substrate 100 may be a metal substrate having a first thermal conductivity. The second substrate 200 may be an insulating substrate having a second thermal conductivity.

Here, the first thermal conductivity of the first substrate 100 may be different from the second thermal conductivity of the second substrate 200. For example, the first thermal conductivity of the first substrate 100 may be greater than the second thermal conductivity of the second substrate 200. This intends that the heat generated from the light source 300 disposed on the second substrate 200 is rapidly discharged to the outside.

For example, the first substrate 100 may be a metal cored printed circuit board (MCPCB).

Also, the first substrate 100 may be a heat dissipation plate having high thermal conductivity. The first substrate 100 may be made of any one selected from the group consisting of copper (Cu), aluminum (Al), silver (Ag), gold (Au), or of an alloy thereof.

The second substrate 200 may be made of a nitride, such as AlN, exhibiting high thermal conductivity.

According to circumstances, the second substrate 200 may include an anodized layer.

The first substrate 100 and the second substrate 200 may be formed in various shapes. For example, the first substrate 100 may include a cavity formed in a predetermined area thereof, and the second substrate 200 may be disposed in the cavity of the first substrate 100.

In this case, the first substrate 100 may include at least one of Al, Cu, and Au, and the second substrate 200 may include AlN.

As another example, the first substrate 100 and the second substrate 200 may be sequentially stacked to form a laminated structure.

In this case, the first substrate 100 may include at least one selected from among Al, Cu, and Au, and the second substrate 200 may include an anodized layer.

As yet another example, the first substrate 100 and the second substrate 200 may be formed of the same material. In this case, the first substrate 100 and the second substrate 200 may include at least one of AlN, Al, Cu, and Au.

The second substrate 200 may have a flat upper surface, on which the light sources 300 are disposed. According to circumstances, the second substrate 200 may have a concave upper surface or a convex upper surface.

In another case, the upper surface of the second substrate 200 may be a combination of at least two among a concave upper surface, a convex upper surface, and a flat upper surface.

The second substrate 200 may include at least one projection (not shown) protruding from the upper surface thereof, on which the light sources 300 are disposed, by a predetermined height.

An angle between the upper surface of the second substrate 200 and a side of the projection may be a right angle or an obtuse angle.

This intends that the light source 300 may be disposed on the projection as described above to vary light emission directions of the light source 300, thereby realizing various beam patterns.

Here, at least one light source 300 may be disposed on at least one of the side and an upper surface of the projection (not shown).

Meanwhile, the plurality of the light sources 300 may be disposed on the second substrate 200 at regularly spaced intervals.

Here, the plurality of the light sources 300 may be eutectic bonded or die bonded to the second substrate 200.

The plurality of the light sources 300 may be top view type light emitting diodes. According to circumstances, the plurality of the light sources 300 may be side view type light emitting diodes.

In another case, the plurality of the light sources 300 may be formed by mixing the top view type light emitting diodes and the side view type light emitting diodes.

Here, the light source 300 may be a light emitting diode (LED) chip. The LED chip may be a red LED chip, a blue LED chip, or an ultraviolet LED chip. Alternatively, the LED chip may be at least one selected from the group consisting of a red LED chip, a green LED chip, a blue LED chip, a yellow LED chip and a white LED chip, or may be formed in the form of a package obtained by combining them.

A white LED may be realized by using a yellow phosphor on a blue LED or simultaneously using a red phosphor and green phosphor on a blue LED. Also, a white LED may be realized by simultaneously using a yellow phosphor, red phosphor, and green phosphor on a blue LED. As an example, in a case in which the lamp unit is applied to a head lamp of a vehicle, the light source 300 may be a vertical lighting emitting chip, such as a white lighting emitting chip. However, embodiments are not limited thereto.

Subsequently, a light source array may include the plurality of the light sources 300 arranged in a row. The light source arrays may be disposed in parallel with each other.

Here, a neighboring first light source array 310 and a second light source array 330 may be electrically isolated from each other and individually driven.

Here, the light sources included in the first light source array 310 may be electrically isolated from each other and individually driven, and the light sources included in the second light source array 330 may be electrically isolated from each other and individually driven.

According to circumstances, the light sources included in the first light source array 310 may be electrically connected to each other and simultaneously driven, and the light sources included in the second light source array 330 may be electrically connected to each other and simultaneously driven.

In another case, the light sources included in the first light source array 310 may be electrically isolated from each other and individually driven, and the light sources included in the second light source array 330 may be electrically connected to each other and simultaneously driven.

The number of the light sources included in the first light source array 310 may be equal to that of the light sources included in the second light source array 330. According to circumstances, the number of the light sources included in the first light source array 310 may be different from that of the light sources included in the second light source array 330.

For example, the number of the light sources included in the first light source array 310 may be greater than that of the light sources included in the second light source array 330.

Also, the luminous flux of the light sources included in the first light source array 310 may be equal to that of the light sources included in the second light source array 330. According to circumstances, the luminous flux of the light sources included in the first light source array 310 may be different from that of the light sources included in the second light source array 330.

For example, the luminous flux of the light sources included in the first light source array 310 may be greater than that of the light sources included in the second light source array 330.

The distance between the light sources included in the first light source array 310 may be equal to the distance between the light sources included in the second light source array 330. According to circumstances, the distance between the light sources included in the first light source array 310 may be different from the distance between the light sources included in the second light source array 330.

For example, the distance between the light sources included in the first light source array 310 may be less than the distance between the light sources included in the second light source array 330.

According to circumstances, the first light source array 310 and the second light source array 330 may be spaced apart from each other by a first distance, and the light sources included in the first light source array 310 or the second light source array 330 may be spaced apart from each other by a second distance. The first distance may be equal to the second distance. According to circumstances, the first distance may be different from the second distance.

For example, the first distance may be greater than the second distance.

A ratio of the first distance and the second distance may be about 1.1:1 to 10:1.

Also, the light sources included in the first light source array 310 and the light sources included in the second light source array 330 may be disposed in parallel with each other.

When the number of the light sources included in the first light source array 310 is equal to that of the light sources included in the second light source array 330, the light sources included in the first light source array 310 and the light sources included in the second light source array 330 may be disposed one to one corresponding to each other.

According to circumstances, the light sources included in the first light source array 310 and the light sources included in the second light source array 330 may be disposed alternately with each other.

Next, the light sources included in the first light source array 310 and the light sources included in the second light source array 330 may be disposed on the same plane. According to circumstances, the light sources included in the first light source array 310 and the light sources included in the second light source array 330 may be disposed on different planes.

For example, the light sources included in the first light source array 310 may be disposed higher than the light sources included in the second light source array 330.

This intends that the light sources included in the first light source array 310 and the light sources included in the second light source array 330 are disposed on different planes as described above to vary light emission directions of the light sources 300, thereby realizing various beam patterns.

Among the light sources 300 included in the light source array, the luminous flux of the light source 300 disposed in the central area of the light source array may be equal to that of the light sources 300 located at the edge of the light source array. According to circumstances, the luminous flux of the light source 300 disposed in the central area of the light source array may be different from that of the light sources 300 located at the edge of the light source array.

For example, the luminous flux of the light source 300 disposed in the central area of the light source array may be greater than that of the light sources 300 located at the edge of the light source array.

This intends that a luminance of the central area is heightened in a beam pattern emitted to the outside.

Also, the distances between the light sources 300 included in the light source array may be equal to each other or may be different from each other according to circumstances.

For example, the distance between the light sources 300 included in the light source array may be gradually increased toward the edge from the central area of the light source array.

This intends that a luminance of the central area is heightened in a beam pattern emitted to the outside.

Also, the light sources 300 included in the light source array may be disposed on the same plane. According to circumstances, at least one of the light sources 300 included in the light source array may be disposed on a plane different from the plane on which the other light sources 300 are disposed.

The light sources 300 included in the light source array may have the same light emission direction. According to circumstances, at least one of the light sources 300 included in each light source array may have a light emission direction different from that of the other light sources 300.

The light sources 300 included in the light source array may have the same luminous flux. According to circumstances, at least one of the light sources 300 included in the light source array may have a luminous flux different from that of the other light sources 300.

Also, the light sources 300 included in the light source array may generate the same color light. According to circumstances, at least one of the light sources 300 included in the light source array may generate color light different from that of the other light sources 300.

Meanwhile, the embodiment may further include a barrier (not shown). The barrier may be disposed around the plurality of the light sources 300.

Here, the barrier is provided to protect the light sources 300 and wires for electrical connection of the light sources 300. The barrier may be formed in various shapes based on the shape of the second substrate 200.

For example, the barrier may be formed in a polygonal or ring shape.

The barrier may include a metallic reflective material. The barrier may reflect light generated from the light source 300 to improve light extraction efficiency of the light source 300.

Here, the barrier may include at least one of aluminum (Al), silver (Ag), platinum (Pt), rhodium (Rh), radium (Rd), palladium (Pd), and chrome (Cr).

Subsequently, the distance between the barrier and the light source 300 and the height of the barrier may be adjusted to control an orientation angle of light emitted from the light source 300.

Also, the embodiment may further include a cover glass (not shown). The cover glass may be spaced apart from the plurality of the light sources 300 by a predetermined interval.

Here, the distance between the cover glass (not shown) and the light sources 300 may be about 0.1 mm to 50 mm.

The cover glass may protect the light source 300 and transmit light generated from the light source 300.

The cover glass may be anti-reflectively coated to improve the transmittance of the light generated from the light source 300.

Here, an anti-reflective coating film may be attached to a glass-based material, or an anti-reflective coating solution may be applied to a glass-based material by spin coating or spray coating to form an anti-reflective coating layer, so that the anti-reflective coating may be performed.

For example, the anti-reflective coating layer may include at least one of $TiO_2$, $SiO_2$, $Al_2O_3$, $Ta_2O_3$, $ZrO_2$, and $MgF_2$.

The cover glass may include a hole (not shown) or an opening (not shown). Gas caused by heat generated from the light source 300 may be discharged through the hole or the opening.

The cover glass may be formed in the shape of a dome having a hole or an opening. According to circumstances, the cover glass may include a color filter which transmits only light having a specific wavelength among the light generated from the light source 300.

In another case, the cover glass may include a particular pattern (not shown) capable of adjusting an orientation angle of the light generated from the light source 300.

Here, the kind and shape of the pattern are not limited.

The embodiment may further include a phosphor layer (not shown). The phosphor layer may be disposed on the plurality of the light sources.

Here, the phosphor layer may be disposed corresponding respectively to the plurality of the light sources 300.

The phosphor layer may include at least one of a red fluorescent substance, a yellow fluorescent substance, and a green fluorescent substance.

In the embodiment configured as such, the plurality of the light source arrays that can be individually driven may be disposed, thereby providing various light colors and luminous fluxes depending upon external environments.

In this embodiment, the plurality of light source arrays are efficiently disposed, thereby providing optimum luminous flux by using a small number of the light sources and reduce the total size of the lamp unit.

Also, in this embodiment, the light source arrays having various light emission directions are disposed, thereby providing various beam patterns depending upon external environments.

Figure 12A:
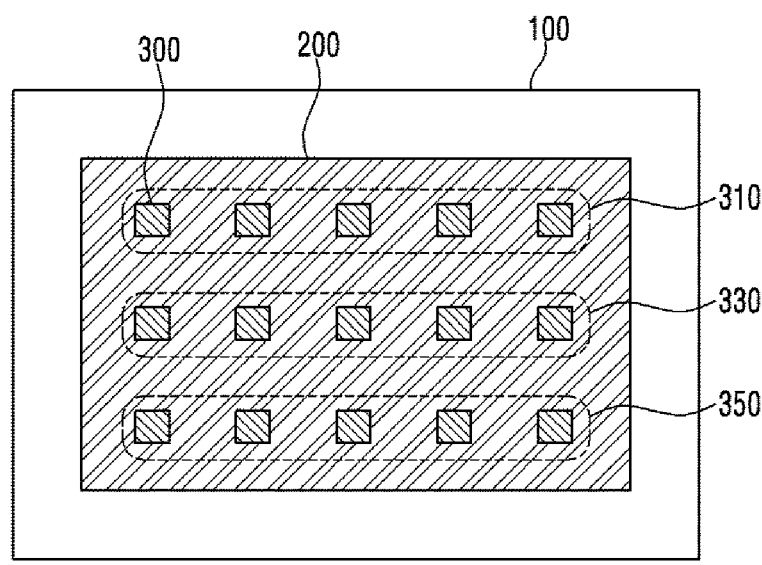
FIGS. 12a and 12b are views showing light source arrays of the lamp unit according to the embodiment.
Figure 12B:
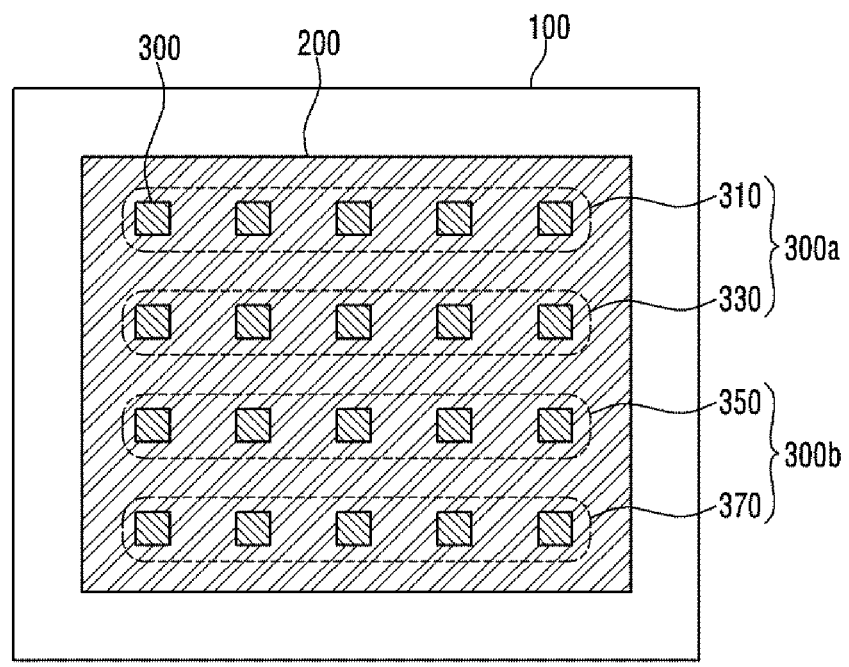

FIGS. 12a and 12b are views showing light source arrays of the lamp unit according to the embodiment. More specifically, FIG. 12a is a plan view showing the lamp unit having an odd number of the light source arrays disposed therein. FIG. 12b is a plan view showing a lamp unit having an even number of the light source arrays disposed therein.

As shown in FIGS. 12a and 12b, the embodiment may include the first substrate 100, the second substrate 200, and the plurality of the light sources 300.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, an odd number of the light source arrays or an even number of the light source arrays may be provided.

For example, as shown in FIG. 12a, an odd number of the light source arrays may be provided. A first light source array 310, a second light source array 330, and a third light source arrays 350 may be disposed on the second substrate 200 in three rows in parallel with one another.

Here, the first, second, and third light source arrays 310, 330 and 350 may be electrically isolated from each other and individually driven.

Also, the light sources included in the first, second, and third light source arrays 310, 330 and 350 may be electrically isolated from each other and individually driven.

According to circumstances, the light sources included in at least one of the first, second, and third light source arrays 310, 330 and 350 may be electrically connected to each other and simultaneously driven, and the light sources included in the other light source arrays may be electrically connected to each other and simultaneously driven.

For example, the light sources included in the first light source array 310 may be electrically connected and simultaneously driven, and the light sources included in the second and third light source arrays 330 and 350 may be electrically connected and simultaneously driven.

Further, in the embodiment of FIG. 12b, an even number of the light source arrays may be provided. The first, second, third, and fourth light source arrays 310, 330, 350 and 370 may be disposed on the second substrate 200 in four rows in parallel with each other.

Here, the neighboring first and second light source arrays 310 and 330 may be included in a first light source array group 300a, and the neighboring third and fourth light source arrays 350 and 370 may be included in a second light source array group 300b.

Here, the first and second light source array groups 300a and 300b may be electrically isolated from each other and individually driven.

Also, the first and second light source arrays 310 and 330 included in the first light source array group 300a and the third and fourth light source arrays 350 and 370 included in the second light source array group 300b may be electrically isolated from each other and individually driven.

Further, the light sources included in the first, second, third, and fourth light source arrays 310, 330, 350 and 370 may be electrically isolated from each other and individually driven.

According to circumstances, the light sources included in at least any one of the first and second light source array groups 300a and 300b may be electrically connected to each other and simultaneously driven, and the light sources included in the other light source array groups may be electrically connected to each other and simultaneously driven.

For example, the light sources included in the first light source array group 300a may be electrically connected to each other and simultaneously driven, and the light sources included in the second light source array group 300b may be electrically connected to each other and simultaneously driven.

As such, the plurality of the light source arrays may be disposed, thereby providing various light colors and luminous fluxes depending upon external environments and, in addition, providing various beam patterns depending upon external environments.

Figure 13:
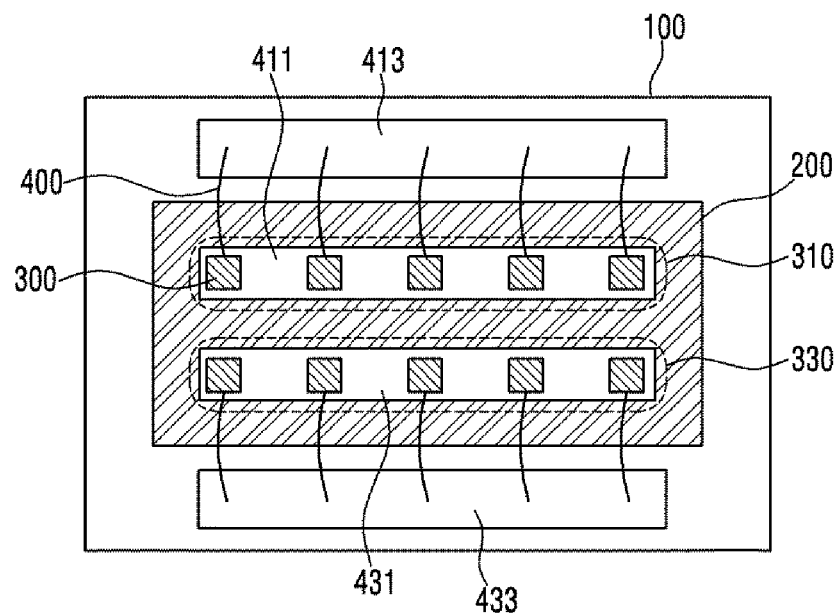
FIG. 13 is a plan view showing that light sources according to a first embodiment are electrically connected to each other.

FIG. 13 is a plan view showing that light sources according to a first embodiment are electrically connected to each other.

As shown in FIG. 13, the first embodiment may include the first substrate 100, the second substrate 200, and a plurality of the light sources 300.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The light sources 300 included in the first light source array 310 may be electrically connected to a first one electrode pattern 411 disposed on the second substrate 200.

Also, the light sources 300 included in the first light source array 310 may be electrically connected to a second one electrode pattern 413 disposed on the first substrate 100 via wires 400.

The light sources 300 included in the second light source array 330 may be electrically connected to a third one electrode pattern 431 disposed on the second substrate 200.

Also, the light sources 300 included in the second light source array 330 may be electrically connected to a fourth one electrode pattern 433 disposed on the first substrate 100 via the wires 400.

Consequently, the neighboring first and second light source arrays 310 and 330 may be electrically isolated from each other and individually driven.

The light sources 300 included in the first light source array 310 may be electrically connected to each other and simultaneously driven, and the light sources 300 included in the second light source array 330 may be electrically connected to each other and simultaneously driven.

As such, the plurality of the light source arrays according to the first embodiment may be individually driven in accordance with the light source arrays, thereby providing various luminous fluxes and beam patterns depending upon external environments.

Figure 14A:
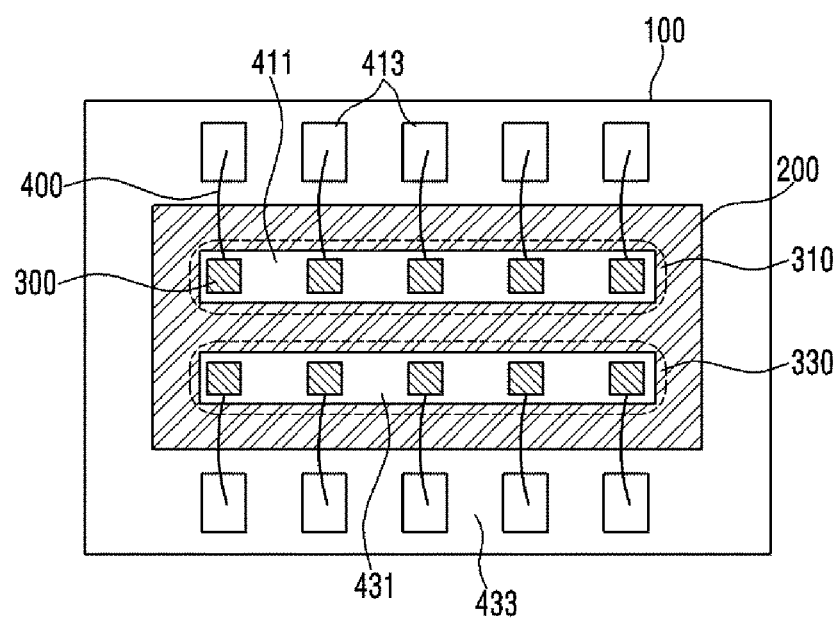
FIGS. 14a and 14b are plan views showing that light sources according to a second embodiment are electrically to each other.
Figure 14B:
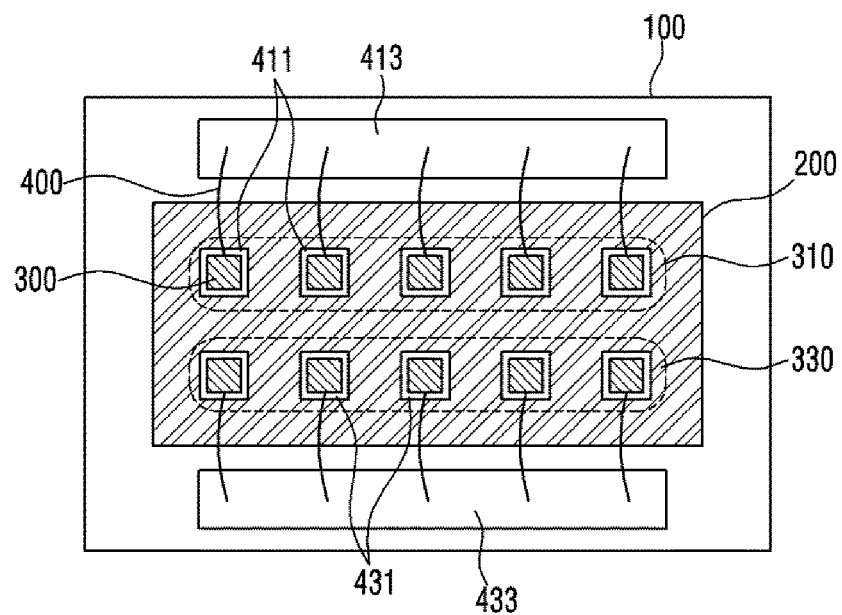

FIGS. 14a and 14b are plan views showing that light sources according to a second embodiment are electrically to each other.

As shown in FIGS. 14a and 14b, the second embodiment may include the first substrate 100, the second substrate 200, and a plurality of the light sources 300.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The second embodiment may include a first electrical connection type of FIG. 14a and a second electrical connection type of FIG. 14b.

For example, in the first electrical connection type, as shown in FIG. 14a, the light sources 300 included in the first light source array 310 may be electrically connected to the first one electrode pattern 411 disposed on the second substrate 200.

Also, the light sources 300 included in the first light source array 310 may be individually electrically connected to a plurality of the second electrode patterns 413 disposed on the first substrate 100 via the wires 400.

The light sources 300 included in the second light source array 330 may be electrically connected to the third one electrode pattern 431 disposed on the second substrate 200.

Also, the light sources 300 included in the second light source array 330 may be individually electrically connected to a plurality of the fourth electrode patterns 433 disposed on the first substrate 100 via the wires 400.

Consequently, the neighboring first and second light source arrays 310 and 330 may be electrically isolated from each other and individually driven.

Also, the light sources 300 included in the first light source array 310 may be electrically isolated from each other and individually driven, and the light sources 300 included in the second light source array 330 may be electrically isolated from each other and individually driven.

Also, in the second electrical connection type, as shown in FIG. 14b, the light sources 300 included in the first light source array 310 may be individually electrically connected to the plurality of the first electrode patterns 411 disposed on the second substrate 200.

Also, the light sources 300 included in the first light source array 310 may be electrically connected to the second one electrode pattern 413 disposed on the first substrate 100 via the wires 400.

The light sources 300 included in the second light source array 330 may be individually electrically connected to the plurality of the third electrode patterns 431 disposed on the second substrate 200.

Also, the light sources 300 included in the second light source array 330 may be electrically connected to the fourth one electrode pattern 433 disposed on the first substrate 100 via the wires 400.

Accordingly, the neighboring first and second light source arrays 310 and 330 may be electrically isolated from each other and individually driven.

Also, the light sources 300 included in the first light source array 310 may be electrically isolated from each other and individually driven, and the light sources 300 included in the second light source array 330 may be electrically isolated from each other and individually driven.

As such, the plurality of the light source arrays according to the second embodiment may be individually driven in accordance with the light source arrays and may be individually driven in accordance with light sources, thereby providing various luminous fluxes and beam patterns depending upon external environments.

Figure 15A:
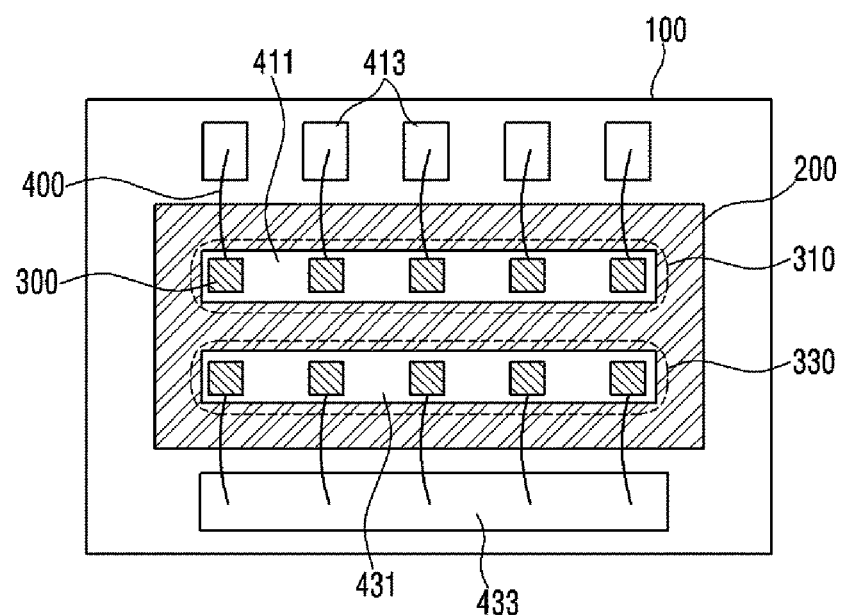
FIGS. 15a and 15b are plan views showing that light sources according to a third embodiment are electrically connected to each other.
Figure 15B:
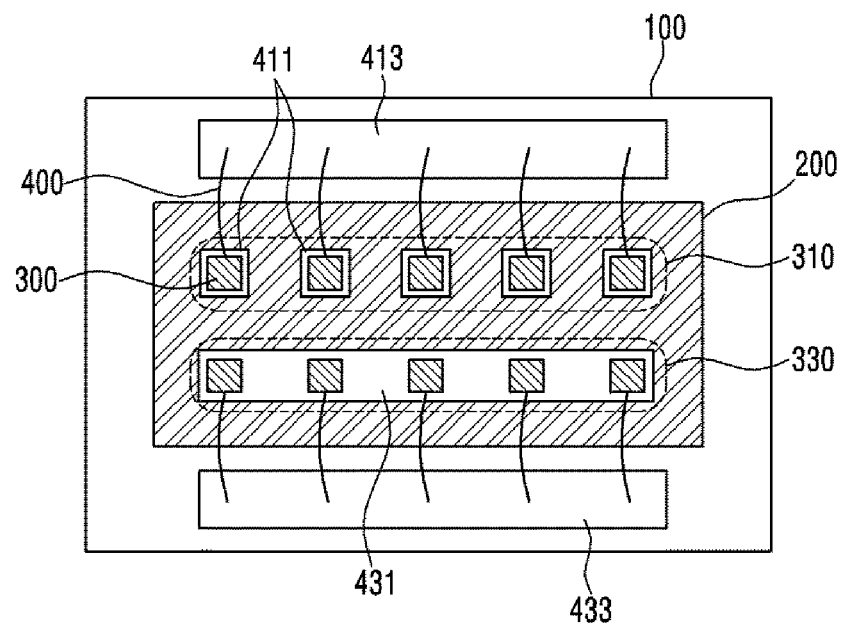

FIGS. 15a and 15b are plan views showing that light sources according to a third embodiment are electrically connected to each other.

As shown in FIGS. 15a and 15b, the third embodiment may include the first substrate 100, the second substrate 200, and a plurality of the light sources 300.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The third embodiment may include a first electrical connection type of FIG. 15a and a second electrical connection type of FIG. 15b.

For example, in the first electrical connection type, as shown in FIG. 15a, the light sources 300 included in the first light source array 310 may be electrically connected to the first one electrode pattern 411 disposed on the second substrate 200.

Also, the light sources 300 included in the first light source array 310 may be individually electrically connected to the plurality of the second electrode patterns 413 disposed on the first substrate 100 via the wires 400.

The light sources 300 included in the second light source array 330 may be electrically connected to the third one electrode pattern 431 disposed on the second substrate 200.

Also, the light sources 300 included in the second light source array 330 may be electrically connected to the fourth one electrode pattern 433 disposed on the first substrate 100 via the wires 400.

Consequently, the neighboring first and second light source arrays 310 and 330 may be electrically isolated from each other and individually driven.

Also, the light sources 300 included in the first light source array 310 may be electrically isolated from each other and individually driven, and the light sources 300 included in the second light source array 330 may be electrically isolated from each other and simultaneously driven.

Also, in the second electrical connection type, as shown in FIG. 15b, the light sources 300 included in the first light source array 310 may be individually electrically connected to the plurality of the first electrode patterns 411 disposed on the second substrate 200.

Also, the light sources 300 included in the first light source array 310 may be electrically connected to the second one electrode pattern 413 disposed on the first substrate 100 via the wires 400.

The light sources 300 included in the second light source array 330 may be electrically connected to the third one electrode pattern 431 disposed on the second substrate 200.

Also, the light sources 300 included in the second light source array 330 may be electrically connected to the fourth one electrode pattern 433 disposed on the first substrate 100 via the wires 400.

Accordingly, the neighboring first and second light source arrays 310 and 330 may be electrically isolated from each other and individually driven.

Also, the light sources 300 included in the first light source array 310 may be electrically isolated from each other and individually driven, and the light sources 300 included in the second light source array 330 may be electrically isolated from each other and simultaneously driven.

As such, in the third embodiment, the driving method of the light sources included in the light source array may be different according to the light source array.

That is, the light sources included in some of the light source arrays are simultaneously driven and the light sources included in the other of the light source arrays are individually driven, thereby providing various luminous fluxes and beam patterns depending upon external environments.

Figure 16A:
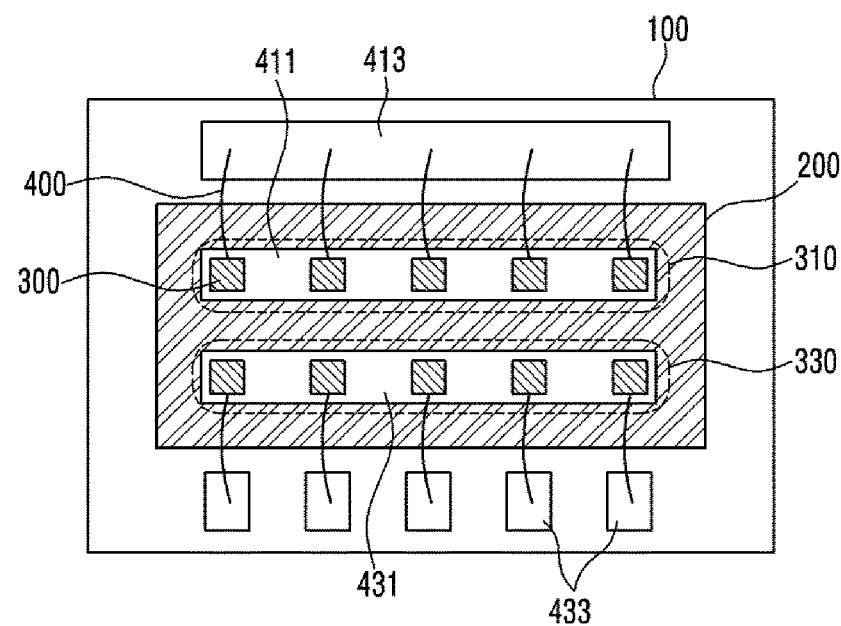
FIGS. 16a and 16b are plan views showing that light sources according to a fourth embodiment are electrically connected to each other.
Figure 16B:
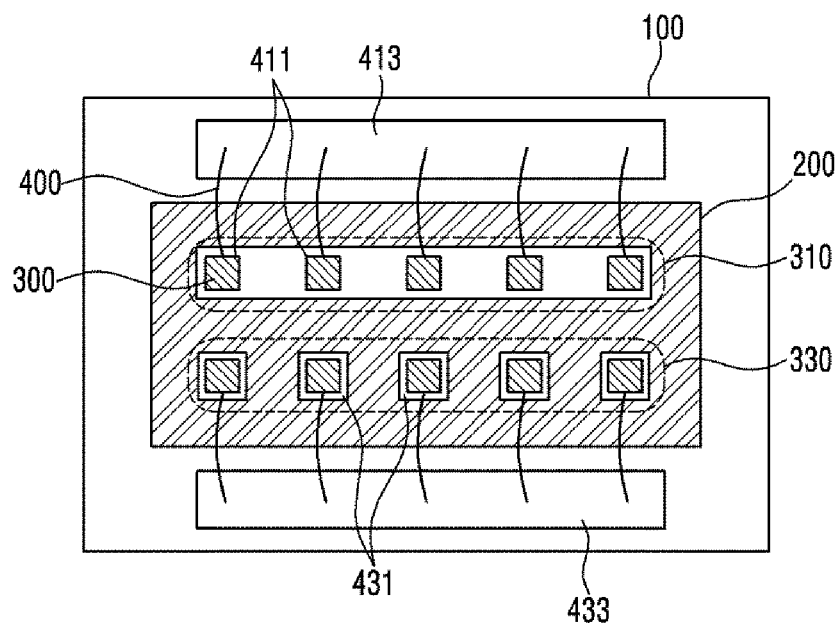

FIGS. 16a and 16b are plan views showing that light sources according to a fourth embodiment are electrically connected to each other.

As shown in FIGS. 16a and 16b, the fourth embodiment may include the first substrate 100, the second substrate 200, and a plurality of the light sources 300.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The fourth embodiment may include a first electrical connection type of FIG. 16a and a second electrical connection type of FIG. 16b.

For example, in the first electrical connection type, as shown in FIG. 16a, the light sources 300 included in the first light source array 310 may be electrically connected to the first one electrode pattern 411 disposed on the second substrate 200.

Also, the light sources 300 included in the first light source array 310 may be electrically connected to the one second electrode pattern 413 disposed on the first substrate 100 via the wires 400.

The light sources 300 included in the second light source array 330 may be electrically connected to the third one electrode pattern 431 disposed on the second substrate 200.

Also, the light sources 300 included in the second light source array 330 may be individually electrically connected to the plurality of the fourth electrode patterns 433 disposed on the first substrate 100 via the wires 400.

Consequently, the neighboring first and second light source arrays 310 and 330 may be electrically isolated from each other and individually driven.

Also, the light sources 300 included in the first light source array 310 may be electrically isolated from each other and simultaneously driven, and the light sources 300 included in the second light source array 330 may be electrically isolated from each other and individually driven.

Also, in the second electrical connection type, as shown in FIG. 16b, the light sources 300 included in the first light source array 310 may be electrically connected to the first one electrode pattern 411 disposed on the second substrate 200.

Also, the light sources 300 included in the first light source array 310 may be electrically connected to the second one electrode pattern 413 disposed on the first substrate 100 via the wires 400.

The light sources 300 included in the second light source array 330 may be individually electrically connected to the plurality of the third electrode patterns 431 disposed on the second substrate 200.

Also, the light sources 300 included in the second light source array 330 may be electrically connected to the fourth one electrode pattern 433 disposed on the first substrate 100 via the wires 400.

Accordingly, the neighboring first and second light source arrays 310 and 330 may be electrically isolated from each other and individually driven.

Also, the light sources 300 included in the first light source array 310 may be electrically connected to each other and simultaneously driven, and the light sources 300 included in the second light source array 330 may be electrically isolated from each other and individually driven.

As such, in the fourth embodiment, the driving method of the light sources included in the light source array may be different according to the light source array.

That is, the light sources included in some of the light source arrays are simultaneously driven and the light sources included in the other of the light source arrays are individually driven, thereby providing various luminous fluxes and beam patterns depending upon external environments.

Figure 17A:
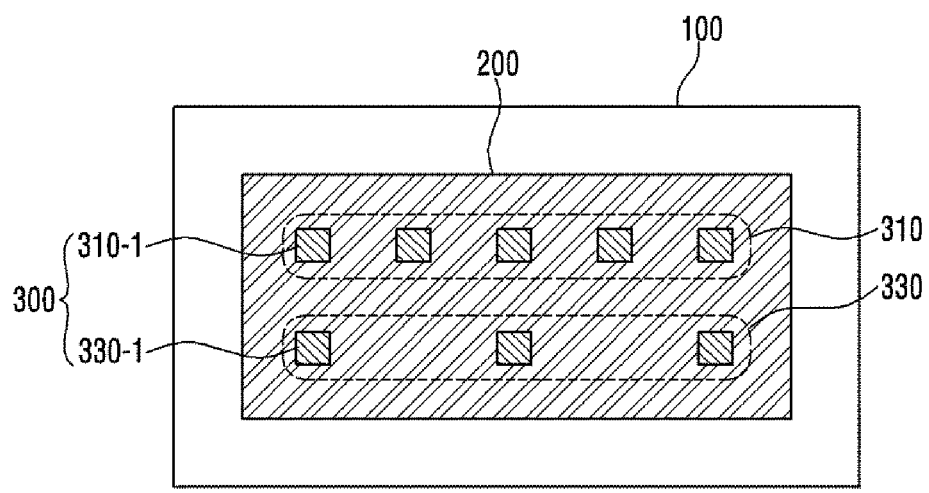
FIGS. 17a to 17c are plan views showing the number of the light sources included in the light source array.
Figure 17B:
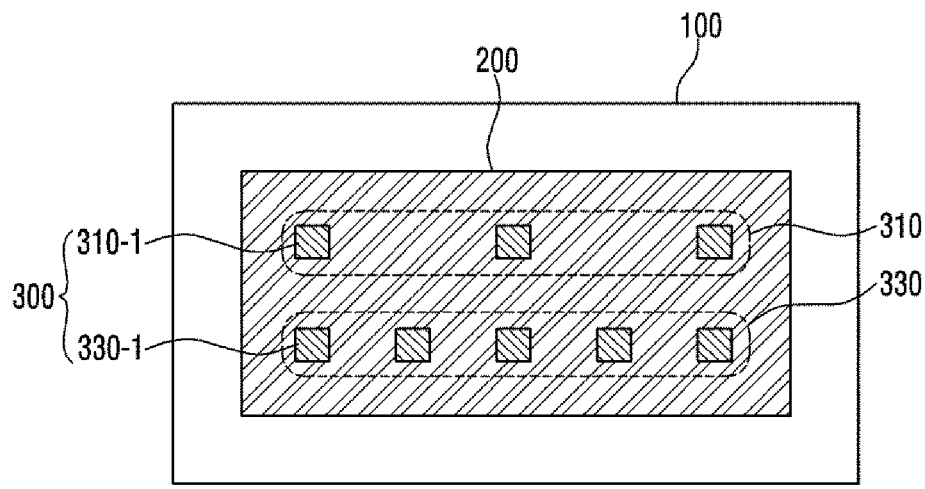
Figure 17C:
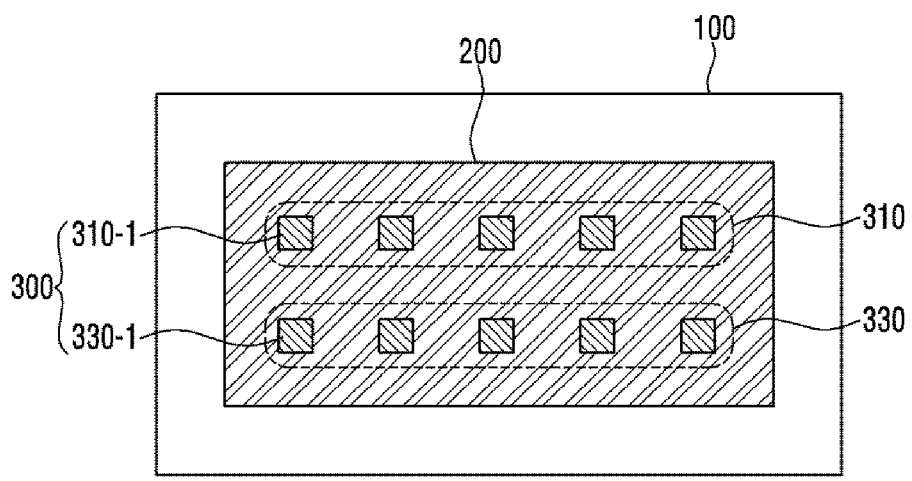

FIGS. 17a to 17c are plan views showing the number of the light sources included in the light source array.

As shown in FIGS. 17a to 17c, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The number of the light sources 310-1 included in the first light source array 310 may be equal to the number of the light sources 330-1 included in the second light source array 330 or may be different from each other according to circumstances.

For example, as shown in FIG. 17a, the number of the light sources 310-1 included in the first light source array 310 may be greater than the number of the light sources 330-1 included in the second light source array 330.

Also, as shown in FIG. 17b, the number of the light sources 310-1 included in the first light source array 310 may be less than the number of the light sources 330-1 included in the second light source array 330.

Also, as shown in FIG. 17c, the number of the light sources 310-1 included in the first light source array 310 may be equal to the number of the light sources 330-1 included in the second light source array 330.

As such, in the embodiment, the number of the light sources included in the light source array is changed according to the light source array, thereby providing various luminous fluxes and beam patterns depending upon external environments.

Figure 18A:
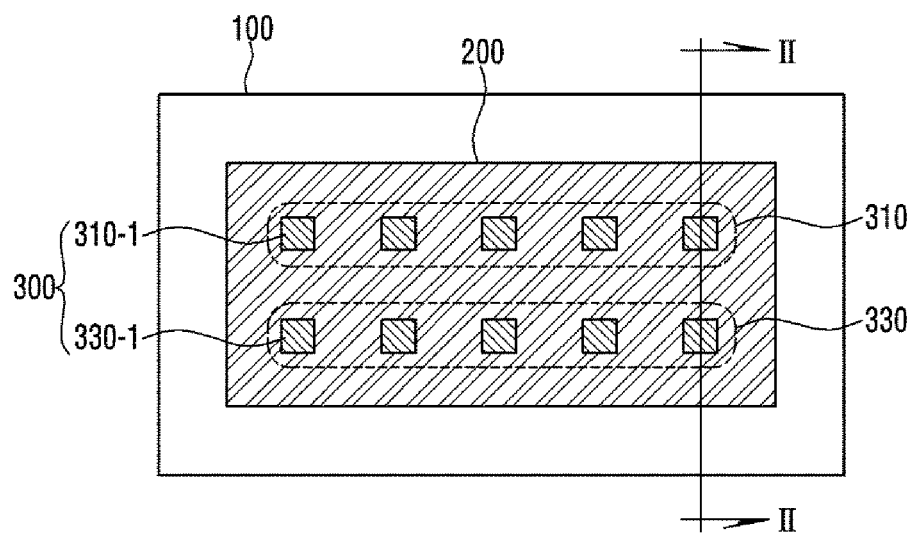
FIGS. 18a to 18c are views showing the luminous flux of the light source included in the light source array.
Figure 18B:
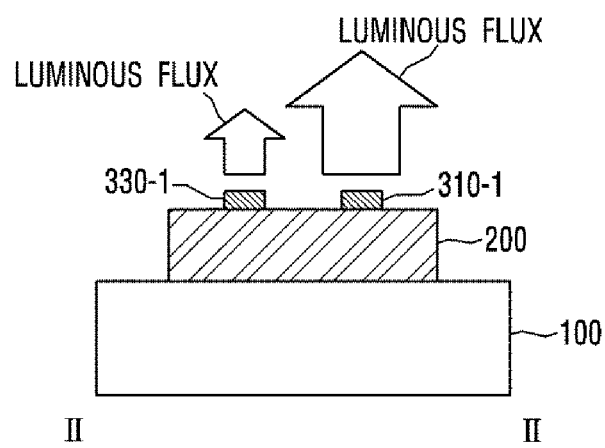
Figure 18C:
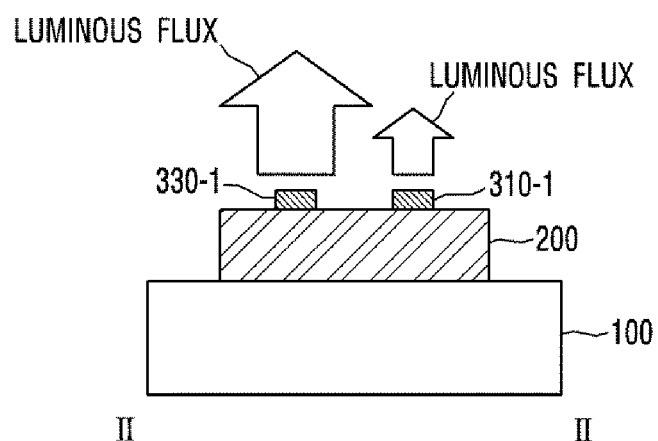

FIGS. 18a to 18c are views showing the luminous flux of the light source included in the light source array.

FIG. 18a is a plan view showing the arrangement of the light source arrays. FIGS. 18b and 18c are cross sectional views taken along line II-II of FIG. 18a.

As shown in FIGS. 18a to 18c, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The luminous flux of the light sources 310-1 included in the first light source array 310 may be equal to the luminous flux of the light sources 330-1 included in the second light source array 330 or may be different from each other according to circumstances.

For example, as shown in FIG. 18b, the luminous flux of the light sources 310-1 included in the first light source array 310 may be larger than the luminous flux of the light sources 330-1 included in the second light source array 330.

Also, as shown in FIG. 18c, the luminous flux of the light sources 310-1 included in the first light source array 310 may be smaller than the luminous flux of the light sources 330-1 included in the second light source array 330.

As such, in the embodiment, the luminous flux of the light sources included in the light source array is changed according to the light source array, thereby providing various luminous fluxes and beam patterns depending upon external environments.

Figure 19A:
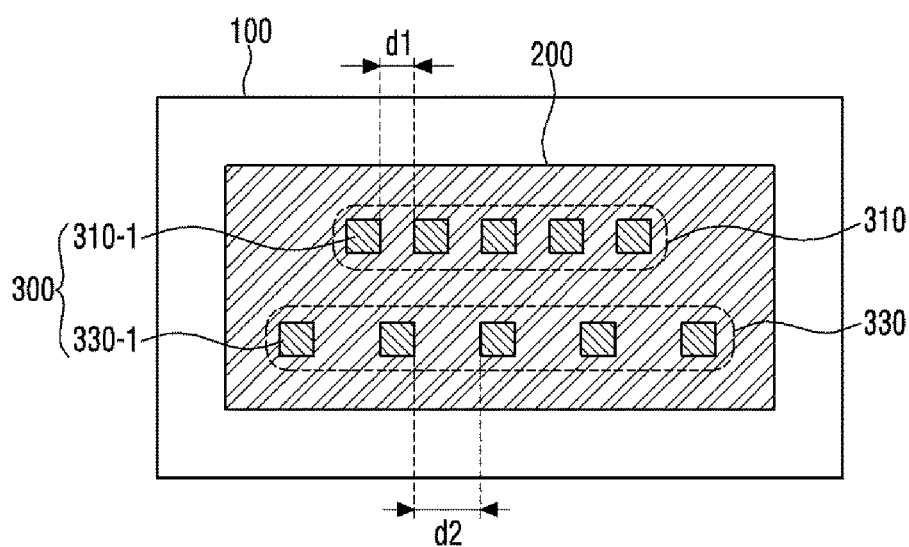
FIGS. 19a to 19c are plan view showing the distance between the light sources included in the light source array.
Figure 19B:
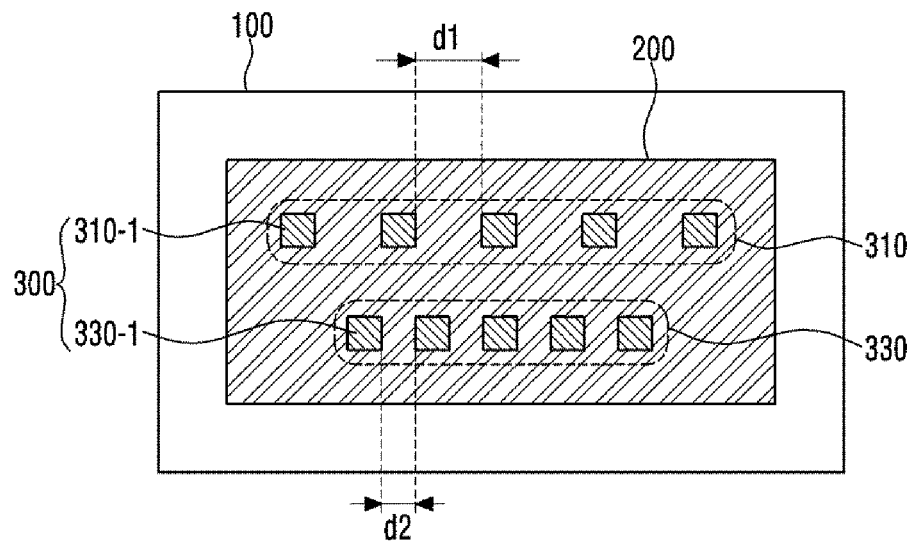
Figure 19C:
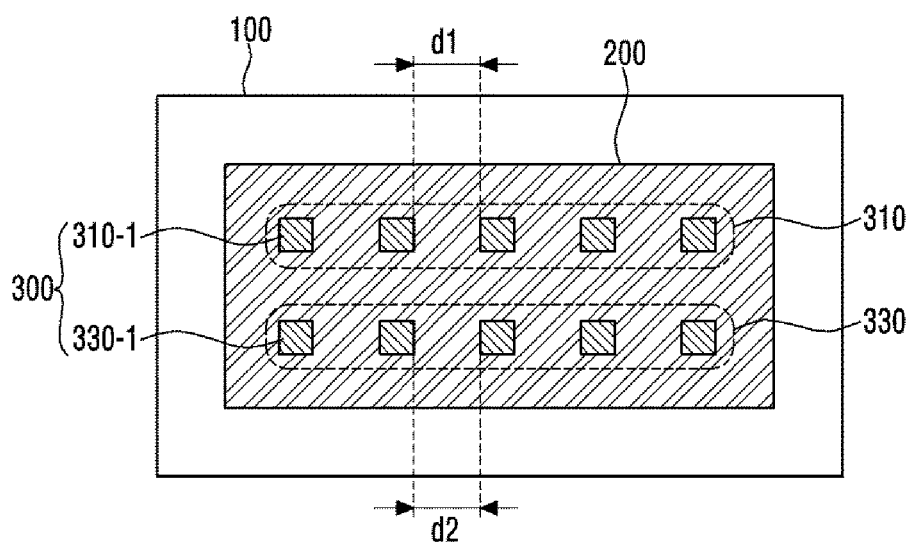

FIGS. 19a to 19c are plan view showing the distance between the light sources included in the light source array.

As shown in FIGS. 19a to 19c, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

A distance d1 between the light sources 310-1 included in the first light source array 310 may be equal to a distance d2 between the light sources 330-1 included in the second light source array 330 or may be different from each other according to circumstances.

For example, as shown in FIG. 19a, the distance d1 between the light sources 310-1 included in the first light source array 310 may be less than the distance d2 between the light sources 330-1 included in the second light source array 330.

Also, as shown in FIG. 19b, the distance d1 between the light sources 310-1 included in the first light source array 310 may be greater than the distance d2 between the light sources 330-1 included in the second light source array 330.

Also, as shown in FIG. 19c, the distance d1 between the light sources 310-1 included in the first light source array 310 may be equal to the distance d2 between the light sources 330-1 included in the second light source array 330.

As such, in the embodiment, the distance between the light sources included in the light source array is changed according to the light source array, thereby providing various luminous fluxes and beam patterns depending upon external environments.

Figure 20A:
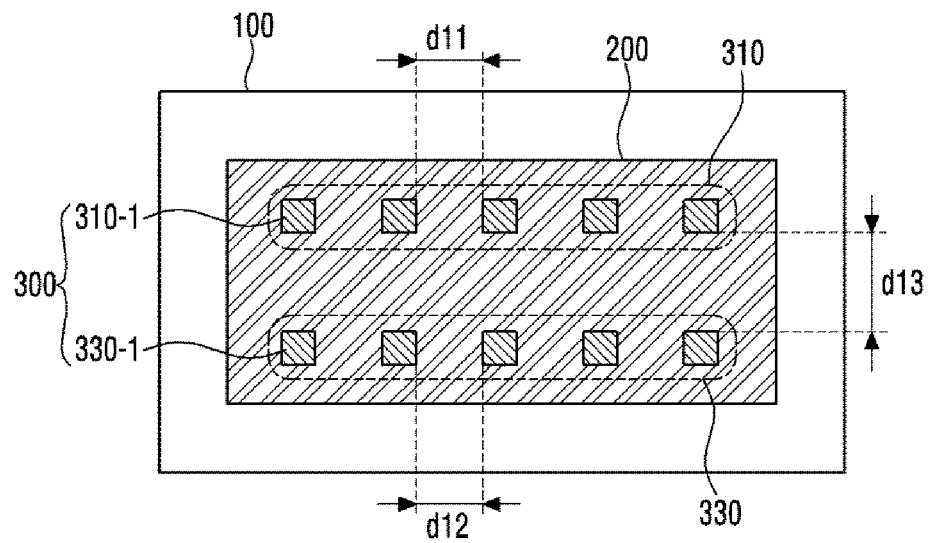
FIGS. 20a and 20b are plan views showing the distance between the light source arrays and the distance between the light sources.
Figure 20B:
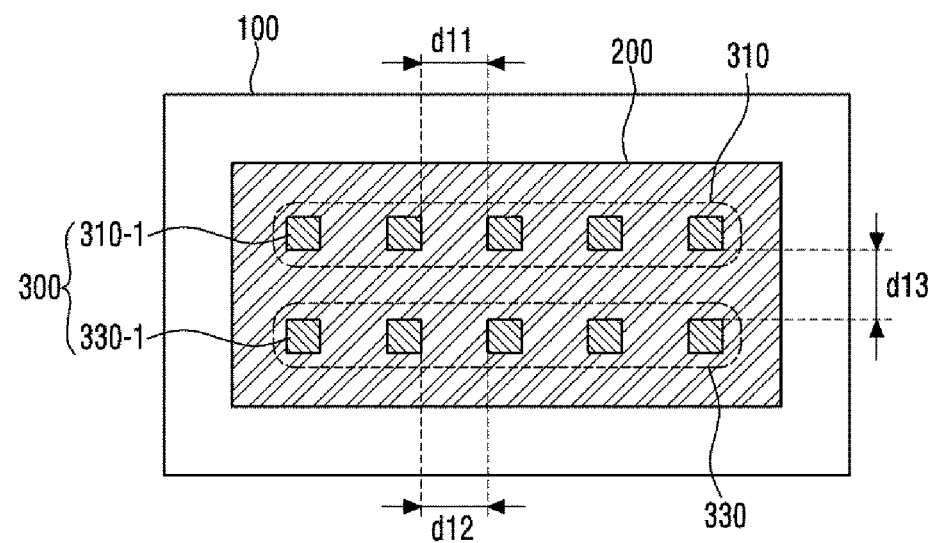

FIGS. 20a and 20b are plan views showing the distance between the light source arrays and the distance between the light sources.

As shown in FIGS. 20a and 20b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The light sources 310-1 included in the first light source array 310 may be spaced apart from each other by a distance d11, the light sources 330-1 included in the second light source array 330 may be spaced apart from each other by a distance d12, and the light sources 310-1 included in the first light source array 310 may be spaced apart from the light sources 330-1 included in the second light source array 330 by a distance d13.

Here, the distance d11 between the light sources 310-1 included in the first light source array 310 may be equal to the distance d12 between the light sources 330-1 included in the second light source array 330.

Also, the distance d11 between the light sources 310-1 included in the first light source array 310 and the distance d12 between the light sources 330-1 included in the second light source array 330 may be equal to the distance d13 between the light sources 310-1 included in the first light source array 310 and the light sources 330-1 included in the second light source array 330. According to circumstances, the distance d11 and the distance d12 may be different from the distance d13.

For example, as shown in FIG. 20a, the distance d11 between the light sources 310-1 included in the first light source array 310 may be equal to the distance d12 between the light sources 330-1 included in the second light source array 330, and the distance d13 between the light sources 310-1 included in the first light source array 310 and the light sources 330-1 included in the second light source array 330 may be greater than the distance d11 and the distance d12.

Here, a ratio of the distance d13 and the distance d11 or a ratio of the distance d13 and the distance d12 may be about 1.1:1 to 10:1.

Also, as shown in FIG. 20b, the distance d11 between the light sources 310-1 included in the first light source array 310 may be equal to the distance d12 between the light sources 330-1 included in the second light source array 330, and the distance d13 between the light sources 310-1 included in the first light source array 310 and the light sources 330-1 included in the second light source array 330 may be equal to the distance d11 and the distance d12.

Here, the distance d11, the distance d12, and the distance d13 may be 10 mm or more. For example, the distance d11, the distance d12, and the distance d13 may be 40 to 80 mm.

As such, in the embodiment, the light sources are arranged such that the distance between the light source arrays and the distance between the light sources are mutually different, thereby providing various luminous fluxes and beam patterns depending upon external environments.

Figure 21A:
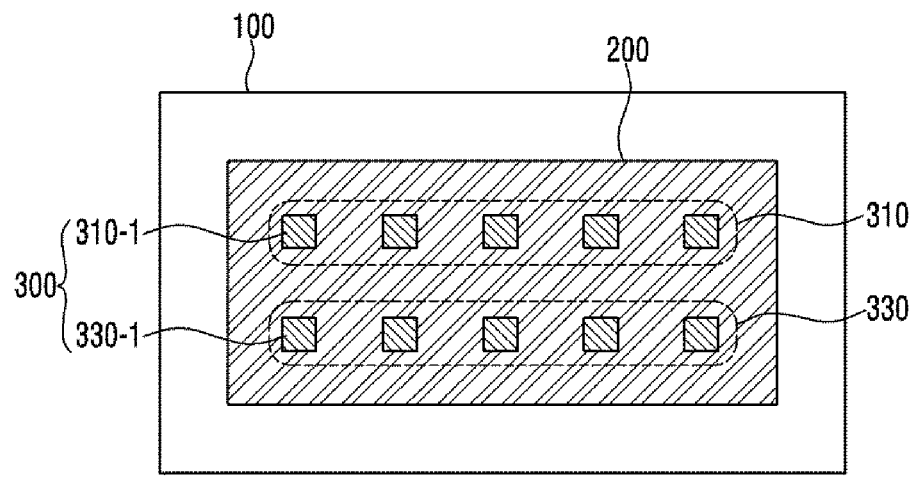
FIGS. 21a and 21b are plan views showing the distribution of light sources according to the first embodiment.
Figure 21B:
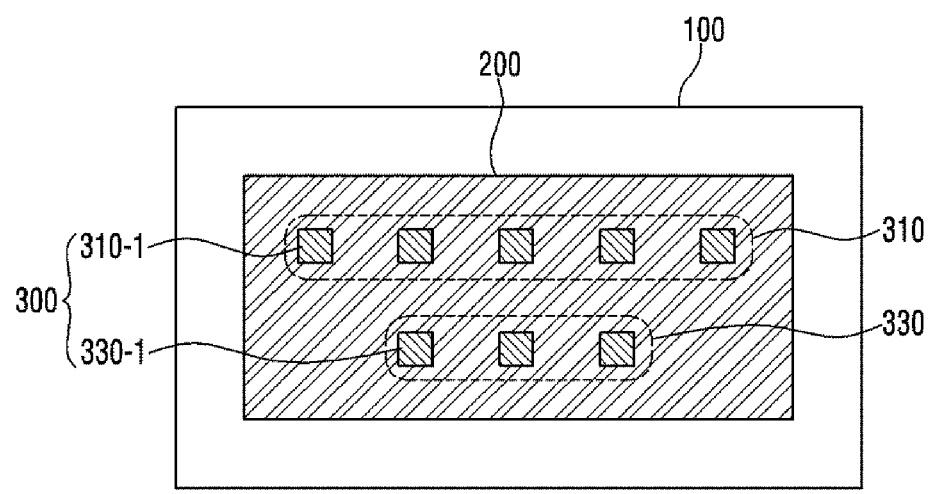

FIGS. 21a and 21b are plan views showing the distribution of light sources according to the first embodiment.

As shown in FIGS. 21a and 21b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The light sources 310-1 included in the first light source array 310 and the light sources 330-1 included in the second light source array 330 may be disposed on the same plane in parallel with each other.

According to circumstances, the light sources 310-1 included in the first light source array 310 and the light sources 330-1 included in the second light source array 330 may be disposed on different planes in parallel with each other.

As shown in FIG. 21a, when the number of the light sources 310-1 included in the first light source array 310 is equal to the number of the light sources 330-1 included in the second light source array 330, the light sources 310-1 included in the first light source array 310 and the light sources 330-1 included in the second light source array 330 may be disposed one to one corresponding to each other on the same plane.

Also, as shown in FIG. 21b, when the number of the light sources 310-1 included in the first light source array 310 is different from the number of the light sources 330-1 included in the second light source array 330, the light sources 310-1 included in the first light source array 310 and the light sources 330-1 included in the second light source array 330 may be disposed corresponding to each other on the same plane.

As such, in the embodiment, the light sources are arranged in parallel with each other in accordance with the light source array, thereby providing various luminous fluxes and beam patterns depending upon external environments.

Figure 22A:
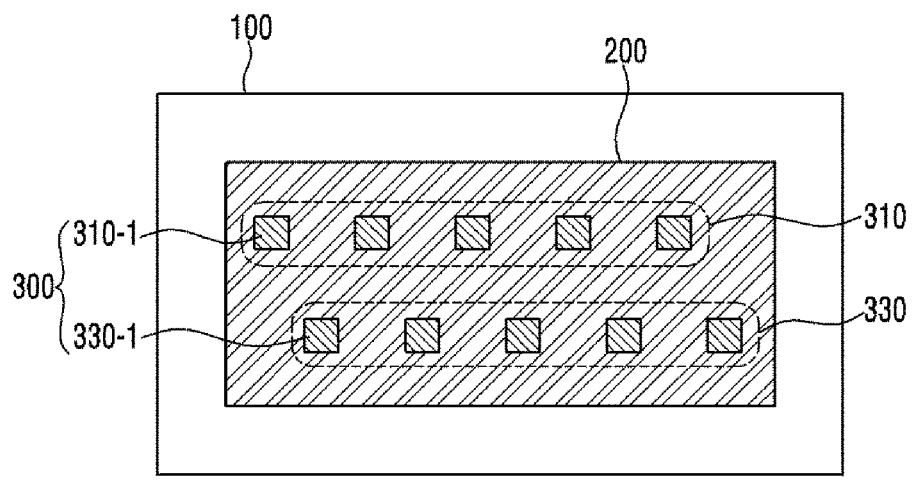
FIGS. 22a and 22b are plan views showing the distribution of light sources according to the second embodiment.
Figure 22B:
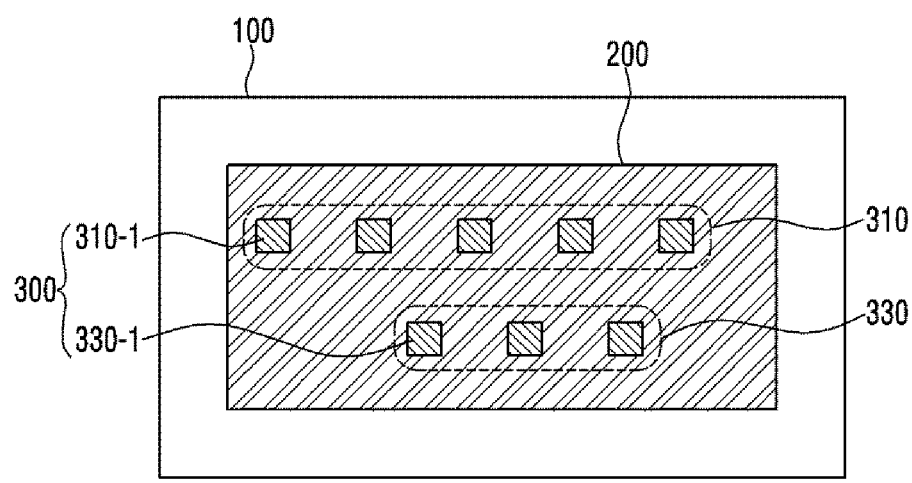

FIGS. 22a and 22b are plan views showing the distribution of light sources according to the second embodiment.

As shown in FIGS. 22a and 22b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The light sources 310-1 included in the first light source array 310 and the light sources 330-1 included in the second light source array 330 may be disposed on the same plane alternately with each other.

According to circumstances, the light sources 310-1 included in the first light source array 310 and the light sources 330-1 included in the second light source array 330 may be disposed on different planes alternately with each other.

As shown in FIG. 22a, when the number of the light sources 310-1 included in the first light source array 310 is equal to the number of the light sources 330-1 included in the second light source array 330, the light sources 310-1 included in the first light source array 310 and the light sources 330-1 included in the second light source array 330 may be disposed alternately with each other on the same plane.

Also, as shown in FIG. 22b, when the number of the light sources 310-1 included in the first light source array 310 is different from the number of the light sources 330-1 included in the second light source array 330, the light sources 310-1 included in the first light source array 310 and the light sources 330-1 included in the second light source array 330 may be disposed alternately with each other on the same plane.

As such, in the embodiment, the light sources are arranged alternately with each other in accordance with the light source array, thereby providing various luminous fluxes and beam patterns depending upon external environments.

Figure 23A:
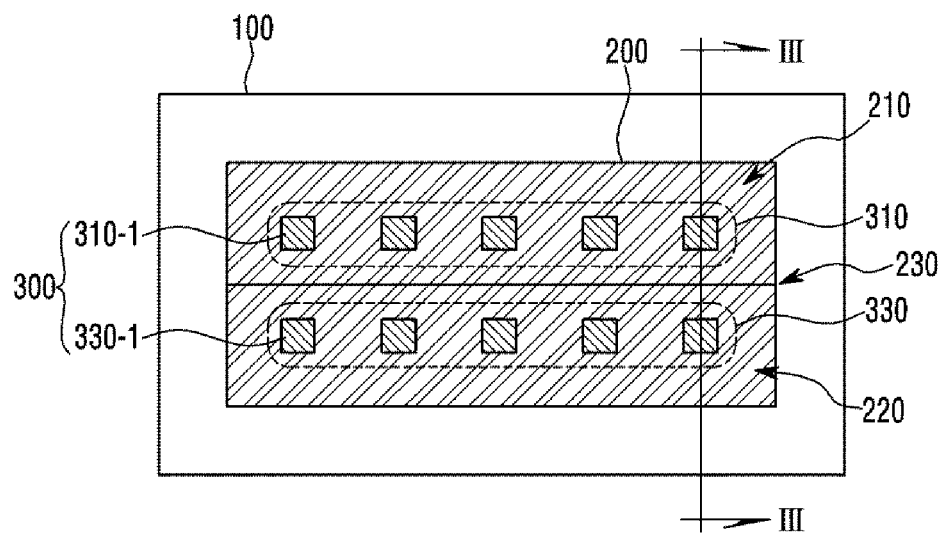
FIGS. 23a and 23b are views showing the distribution of light sources according to the third embodiment.
Figure 23B:
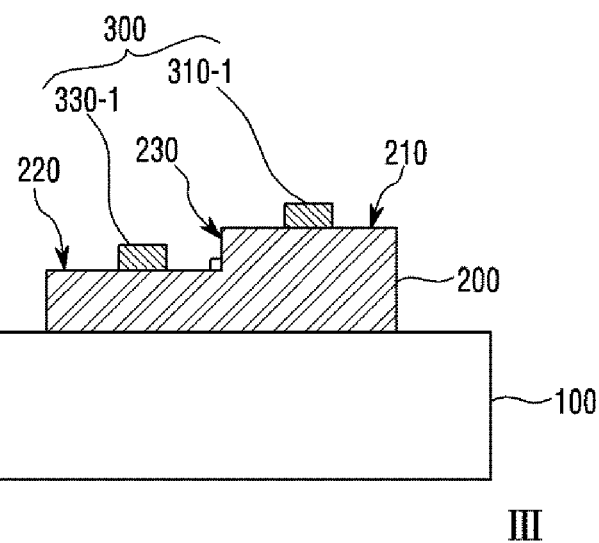

FIGS. 23a and 23b are views showing the distribution of light sources according to the third embodiment.

FIG. 23a is a plan view showing the arrangement of the light source arrays. FIG. 23b is a cross sectional views taken along line III-III of FIG. 23a.

As shown in FIGS. 23a and 23b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The light sources 310-1 included in the first light source array 310 may be disposed on a first upper surface 210 of the second substrate 200, and the light sources 330-1 included in the second light source array 330 may be disposed on a second upper surface 220 of the second substrate 200.

Here, the first upper surface 210 of the second substrate 200 may be higher than the second upper surface 220 of the second substrate 200. A side surface 230 between the first upper surface 210 of the second substrate 200 and the second upper surface 220 of the second substrate 200 may be perpendicular to the first upper surface 210 of the second substrate 200 or the second upper surface 220 of the second substrate 200.

That is, an angle between the side surface 230 of the second substrate 200 and the second upper surface 220 of the second substrate 200 may be a right angle.

Accordingly, the light sources 310-1 included in the first light source array 310 and the light sources 330-1 included in the second light source array 330 may be disposed on different planes.

This is because that the first upper surface 210 of the second substrate 200 is higher than the second upper surface 220 of the second substrate 200.

For example, the light sources 310-1 included in the first light source array 310 may be disposed on an area higher than the light sources 330-1 included in the second light source array 330.

This intends that the light sources 310-1 included in the first light source array 310 and the light sources 330-1 included in the second light source array 330 are disposed on different planes as described above to vary light emission directions of the light sources 300, thereby realizing various beam patterns.

Figure 24A:
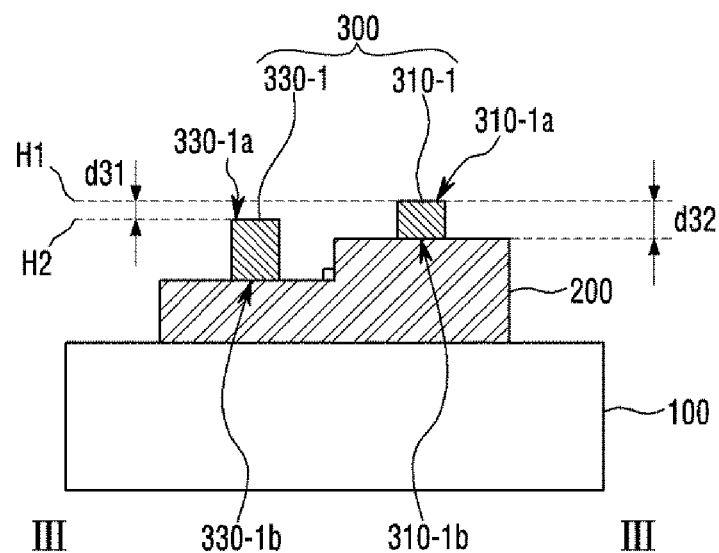
FIGS. 24a to 24c are cross sectional views showing the distribution of light sources according to FIG. 23b.
Figure 24B:
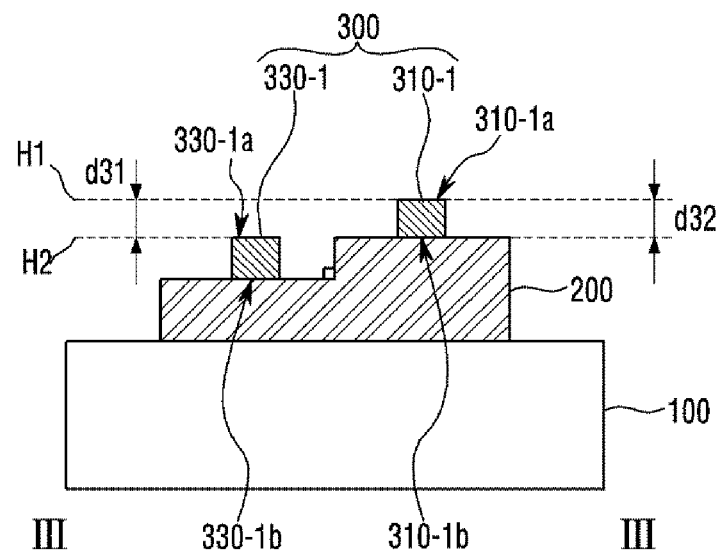
Figure 24C:
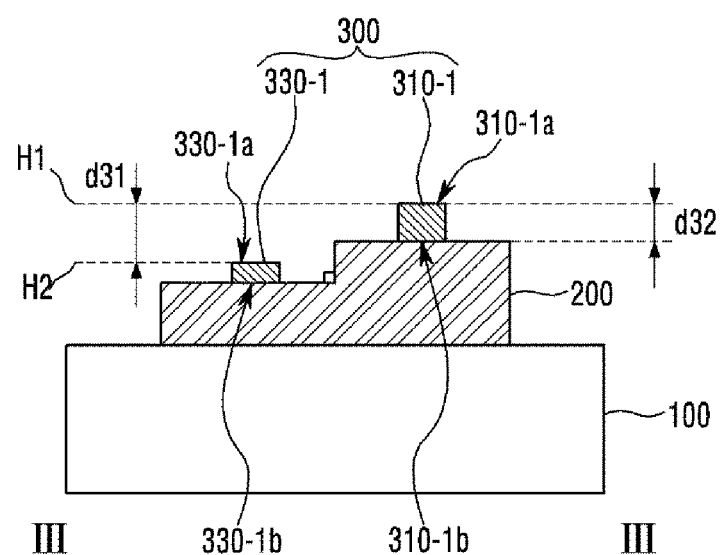

FIGS. 24a to 24c are cross sectional views showing the distribution of light sources according to FIG. 23b.

As shown in FIGS. 24a to 24c, the light sources 310-1 included in the first light source array 310 may be disposed on the first upper surface of the second substrate 200, and the light sources 330-1 included in the second light source array 330 may be disposed on the second upper surface of the second substrate 200.

Here, the light sources 310-1 included in the first light source array 310 and the light sources 330-1 included in the second light source array 330 may be disposed on different planes.

This is because that the first upper surface of the second substrate 200 is higher than the second upper surface of the second substrate 200.

Accordingly, the light sources 310-1 included in the first light source array 310 may be disposed on an area higher than the light sources 330-1 included in the second light source array 330.

Here, as shown in FIG. 24a, a distance d31 between a first parallel line H1 extending from an upper surface 310-1a of the light source 310-1 included in the first light source array 310 and a second parallel line H2 extending from an upper surface 330-1a of the light source 330-1 included in the second light source array 330 may be less than a distance d32 between the upper surface 310-1a and a lower surface 310-1b of the light source 310-1 included in the first light source array 310 or between the upper surface 330-1a and a lower surface 330-1b of the light source 330-1 included in the second light source array 330.

According to circumstances, as shown in FIG. 24b, the distance d31 between the first parallel line H1 extending from the upper surface 310-1a of the light source 310-1 included in the first light source array 310 and the second parallel line H2 extending from the upper surface 330-1a of the light source 330-1 included in the second light source array 330 may be equal to the distance d32 between the upper surface 310-1a and the lower surface 310-1b of the light source 310-1 included in the first light source array 310 or between the upper surface 330-1a and the lower surface 330-1b of the light source 330-1 included in the second light source array 330.

In another case, as shown in FIG. 24c, the distance d31 between the first parallel line H1 extending from the upper surface 310-1a of the light source 310-1 included in the first light source array 310 and the second parallel line H2 extending from the upper surface 330-1a of the light source 330-1 included in the second light source array 330 may be greater than the distance d32 between the upper surface 310-1a and the lower surface 310-1b of the light source 310-1 included in the first light source array 310 or between the upper surface 330-1a and the lower surface 330-1b of the light source 330-1 included in the second light source array 330.

This intends that the light sources 310-1 included in the first light source array 310 and the light sources 330-1 included in the second light source array 330 are disposed on different planes as described above to vary light emission directions of the light sources 300, thereby realizing various beam patterns.

FIGS. 25a to 25d are cross sectional views showing light emission directions of the light sources according to FIG. 23b.

As shown in FIGS. 25a to 25d, the light sources 310-1 included in the first light source array 310 may be disposed on the first upper surface of the second substrate 200, and the light sources 330-1 included in the second light source array 330 may be disposed on the second upper surface of the second substrate 200.

Here, the light sources 310-1 included in the first light source array 310 and the light sources 330-1 included in the second light source array 330 may be disposed on different planes.

This is because that the first upper surface of the second substrate 200 is higher than the second upper surface of the second substrate 200.

Accordingly, the light sources 310-1 included in the first light source array 310 may be disposed on an area higher than the light sources 330-1 included in the second light source array 330.

Here, the light emission direction of the light sources 310-1 included in the first light source array 310 may be the same as that of the light sources 330-1 included in the second light source array 330. According to circumstances, the light emission direction of the light sources 310-1 included in the first light source array 310 may be different from that of the light sources 330-1 included in the second light source array 330.

Figure 25A:
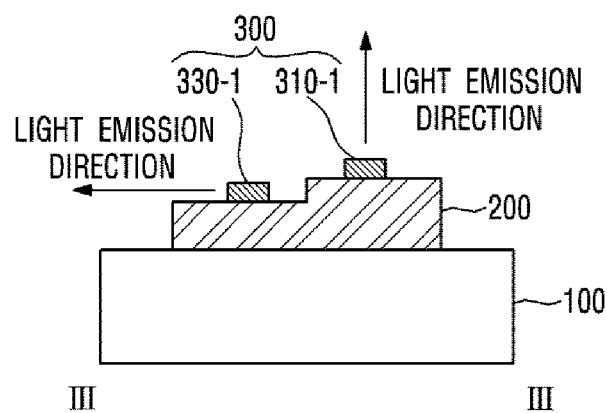
FIGS. 25a to 25d are cross sectional views showing light emission directions of the light sources according to FIG. 23b.

As shown in FIG. 25a, the light sources 310-1 included in the first light source array 310 may emit light in a first direction, and the light sources 330-1 included in the second light source array 330 may emit light in a second direction perpendicular to the first direction.

Figure 25B:
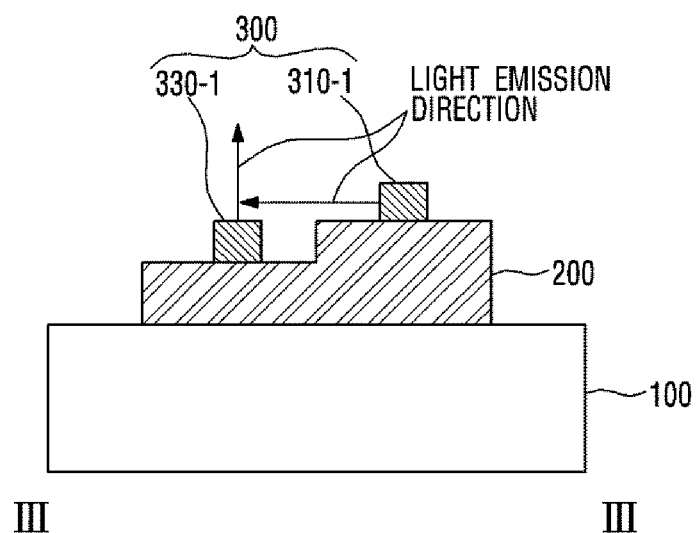

Also, as shown in FIG. 25b, the light sources 310-1 included in the first light source array 310 may emit light in the second direction, and the light sources 330-1 included in the second light source array 330 may emit light in the first direction.

Figure 25C:
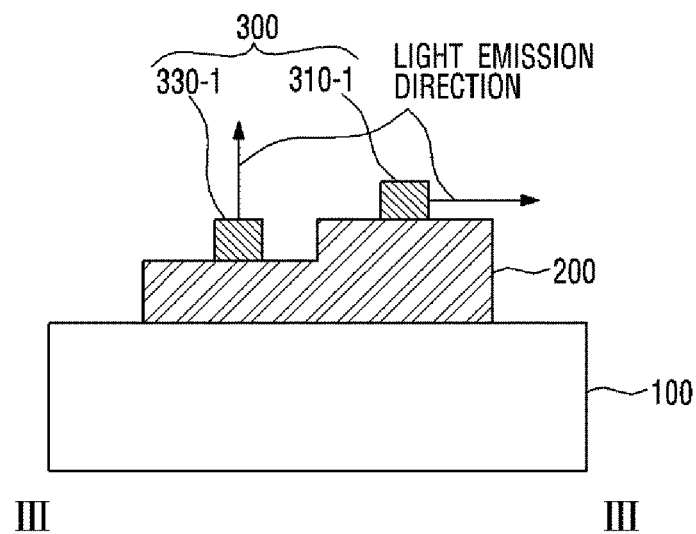

Also, as shown in FIG. 25c, the light sources 310-1 included in the first light source array 310 may emit light in a third direction opposite to the second direction, and the light sources 330-1 included in the second light source array 330 may emit light in the first direction.

Figure 25D:
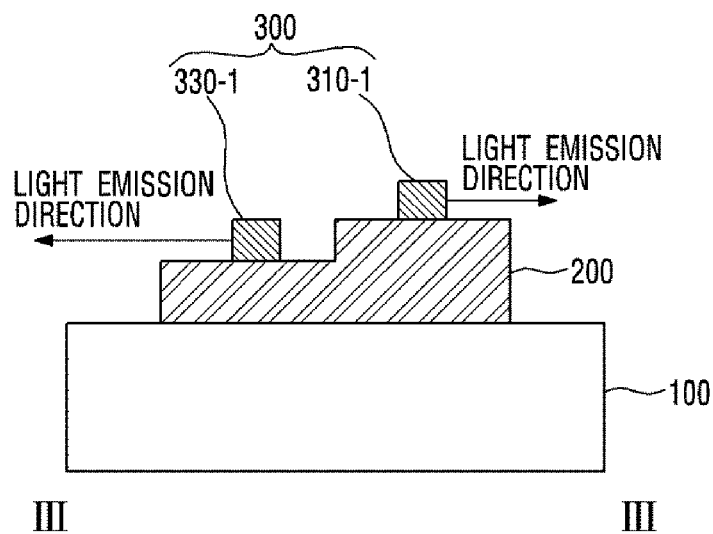

Also, as shown in FIG. 25d, the light sources 310-1 included in the first light source array 310 may emit light in the third direction opposite to the second direction, and the light sources 330-1 included in the second light source array 330 may emit light in the second direction.

As such, in the embodiment, the light emission directions of the light sources 300 may be varied, thereby realizing various beam patterns.

Figure 26A:
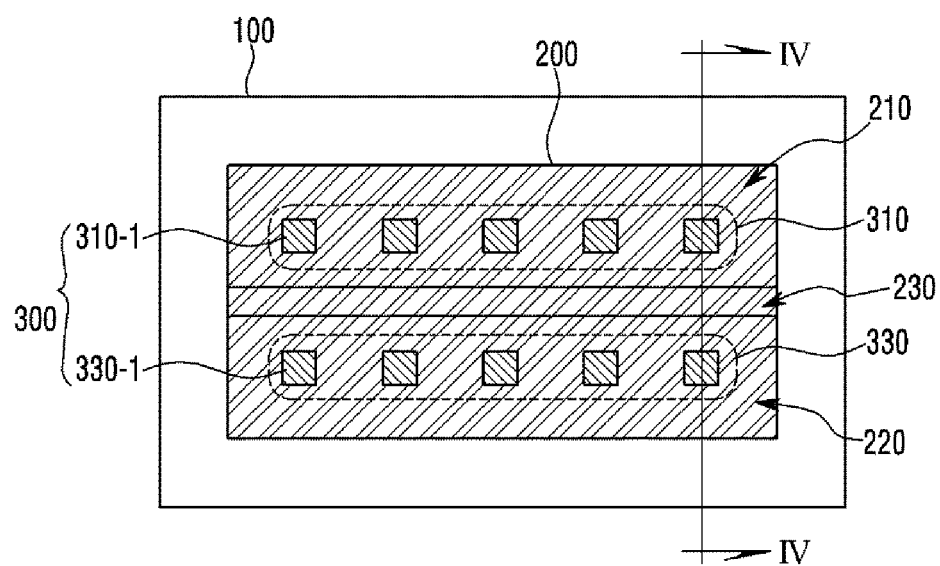
FIGS. 26a and 26b are views showing the distribution of light sources according to the fourth embodiment.
Figure 26B:
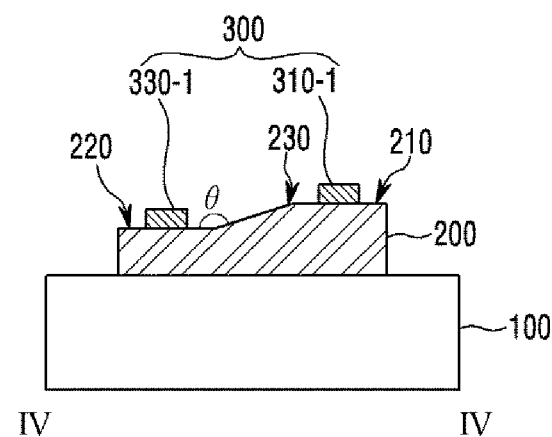

FIGS. 26a and 26b are views showing the distribution of light sources according to the fourth embodiment.

FIG. 26a is a plan view showing the arrangement of the light source arrays. FIG. 26b is a cross sectional views taken along line IV-IV of FIG. 26a.

As shown in FIGS. 26a and 26b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The light sources 310-1 included in the first light source array 310 may be disposed on a first upper surface 210 of the second substrate 200, and the light sources 330-1 included in the second light source array 330 may be disposed on a second upper surface 220 of the second substrate 200.

Here, the first upper surface 210 of the second substrate 200 may be higher than the second upper surface 220 of the second substrate 200. A side surface 230 between the first upper surface 210 of the second substrate 200 and the second upper surface 220 of the second substrate 200 may be tilted at a certain angle with respect to the first upper surface 210 of the second substrate 200 or the second upper surface 220 of the second substrate 200.

That is, an angle between the side surface 230 of the second substrate 200 and the second upper surface 220 of the second substrate 200 may be an obtuse angle.

Accordingly, the light sources 310-1 included in the first light source array 310 and the light sources 330-1 included in the second light source array 330 may be disposed on different planes.

This is because that the first upper surface 210 of the second substrate 200 is higher than the second upper surface 220 of the second substrate 200.

For example, the light sources 310-1 included in the first light source array 310 may be disposed on an area higher than the light sources 330-1 included in the second light source array 330.

This intends that the light sources 310-1 included in the first light source array 310 and the light sources 330-1 included in the second light source array 330 are disposed on different planes as described above to vary light emission directions of the light sources 300, thereby realizing various beam patterns.

Figure 27A:
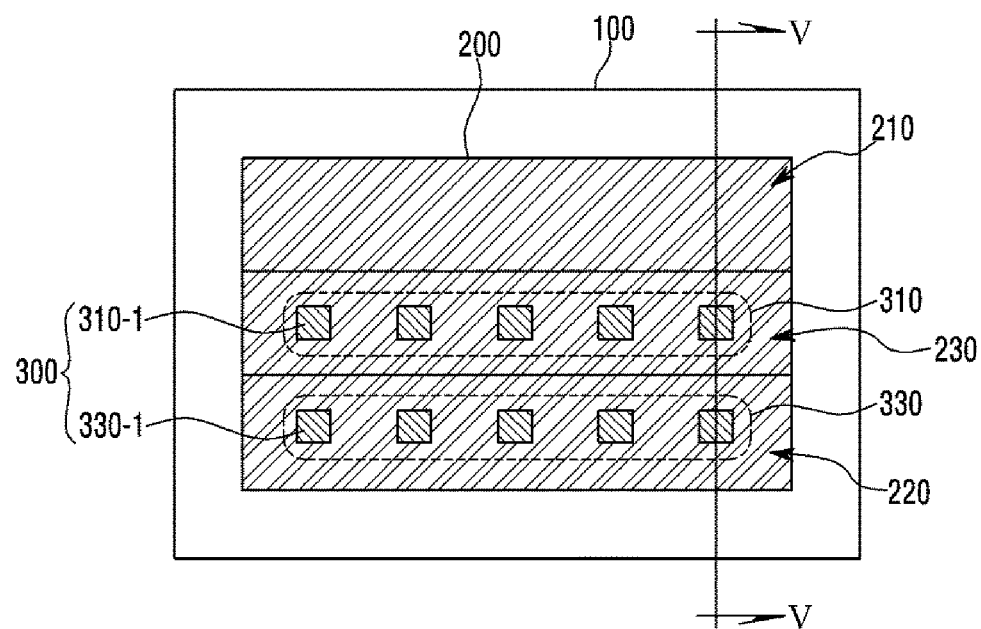
FIGS. 27a and 27b are views showing the distribution of light sources according to a fifth embodiment.
Figure 27B:
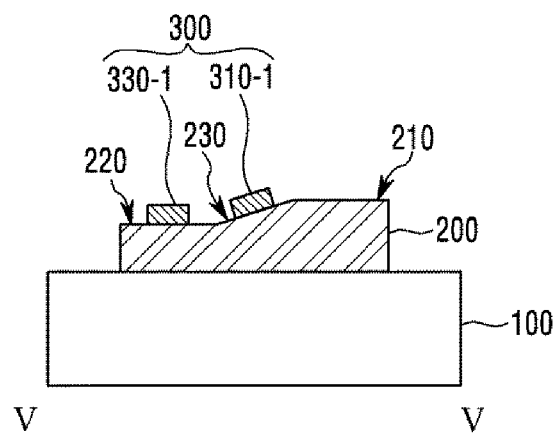

FIGS. 27a and 27b are views showing the distribution of light sources according to a fifth embodiment.

FIG. 27a is a plan view showing the arrangement of the light source arrays. FIG. 27b is a cross sectional views taken along line V-V of FIG. 27a.

As shown in FIGS. 27a and 27b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The second substrate 200 may include the first upper surface 210 and the second upper surface 220, and the side surface 230 between the first upper surface 210 and the second upper surface 220.

Here, the first upper surface 210 of the second substrate 200 may be higher than the second upper surface 220 of the second substrate 200. A side surface 230 between the first upper surface 210 of the second substrate 200 and the second upper surface 220 of the second substrate 200 may be tilted at a certain angle with respect to the first upper surface 210 of the second substrate 200 or the second upper surface 220 of the second substrate 200.

That is, an angle between the side surface 230 of the second substrate 200 and the second upper surface 220 of the second substrate 200 may be an obtuse angle.

For example, the first light source array 310 may be supported by a first area of the second substrate 200, the second light source array 330 may be supported by a second area of the second substrate 200, and an angle between the surface of the first area of the second substrate 200 facing the first light source array 310 and the surface of the second area of the second substrate 200 facing the second light source array 330 may be about 91 to 179 degrees.

The light sources 330-1 included in the second light source array 330 may be disposed on the second upper surface 220 of the second substrate 200, the light sources 310-1 included in the first light source array 310 may be disposed on the side surface 230 of the second substrate 200, and no light source may be disposed on the first upper surface 210 of the second substrate 200.

Accordingly, the light sources 310-1 included in the first light source array 310 and the light sources 330-1 included in the second light source array 330 may be disposed on different planes.

For example, the light sources 310-1 included in the first light source array 310 may be disposed on an area higher than the light sources 330-1 included in the second light source array 330.

This intends that the light sources 310-1 included in the first light source array 310 and the light sources 330-1 included in the second light source array 330 are disposed on different planes as described above to vary light emission directions of the light sources 300, thereby realizing various beam patterns.

Figure 28A:
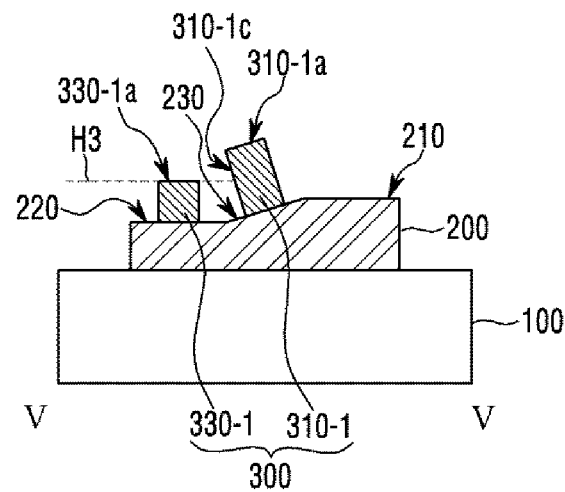
FIGS. 28a and 28b are cross sectional views showing the distribution of light sources according to FIG. 27b.
Figure 28B:
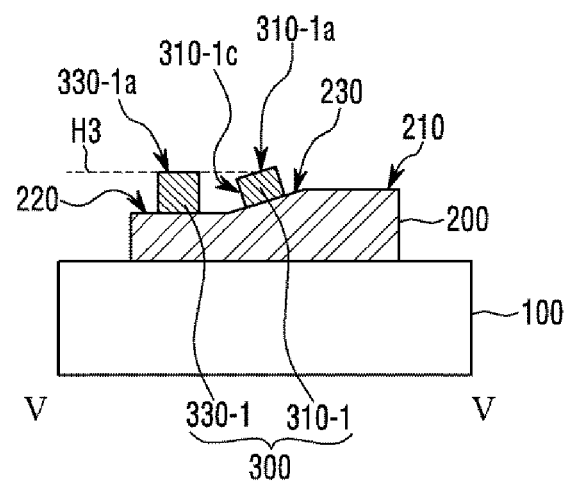

FIGS. 28a and 28b are cross sectional views showing the distribution of light sources according to FIG. 27b.

As shown in FIGS. 28a and 28b, the second substrate 200 may include the first upper surface 210 and the second upper surface 220, and the side surface 230 between the first upper surface 210 and the second upper surface 220.

Here, the first upper surface 210 of the second substrate 200 may be higher than the second upper surface 220 of the second substrate 200. A side surface 230 between the first upper surface 210 of the second substrate 200 and the second upper surface 220 of the second substrate 200 may be tilted at a certain angle with respect to the first upper surface 210 of the second substrate 200 or the second upper surface 220 of the second substrate 200.

That is, an angle between the side surface 230 of the second substrate 200 and the second upper surface 220 of the second substrate 200 may be an obtuse angle.

The light sources 330-1 included in the second light source array 330 may be disposed on the second upper surface 220 of the second substrate 200, the light sources 310-1 included in the first light source array 310 may be disposed on the side surface 230 of the second substrate 200, and no light source may be disposed on the first upper surface 210 of the second substrate 200.

Here, as shown in FIG. 28a, a parallel line H3 extending from the upper surface 330-1a of the light source 330-1 included in the second light source array 330 may meet a side surface 310-1c of the light sources 310-1 included in the first light source array 310.

According to circumstances, as shown in FIG. 28b, the parallel line H3 extending from the upper surface 330-1a of the light source 330-1 included in the second light source array 330 may meet the upper surface 310-1a of the light sources 310-1 included in the first light source array 310.

Accordingly, the light sources 310-1 included in the first light source array 310 and the light sources 330-1 included in the second light source array 330 may be disposed on different planes.

For example, the light sources 310-1 included in the first light source array 310 may be disposed on an area higher than the light sources 330-1 included in the second light source array 330.

This intends that the light sources 310-1 included in the first light source array 310 and the light sources 330-1 included in the second light source array 330 are disposed on different planes as described above to vary light emission directions of the light sources 300, thereby realizing various beam patterns.

Figure 29A:
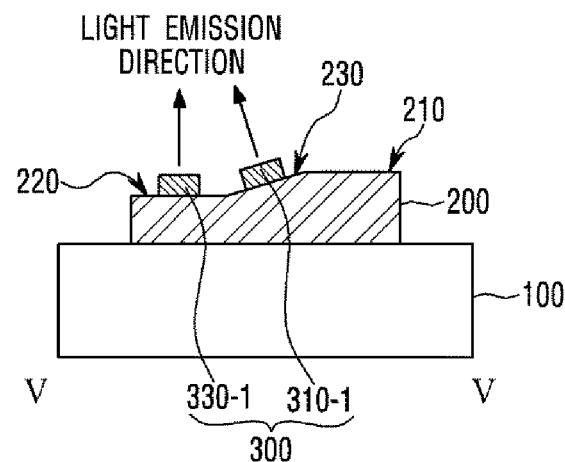
FIGS. 29a to 29c are cross sectional views showing light emission directions of the light sources according to FIG. 18b.
Figure 29B:
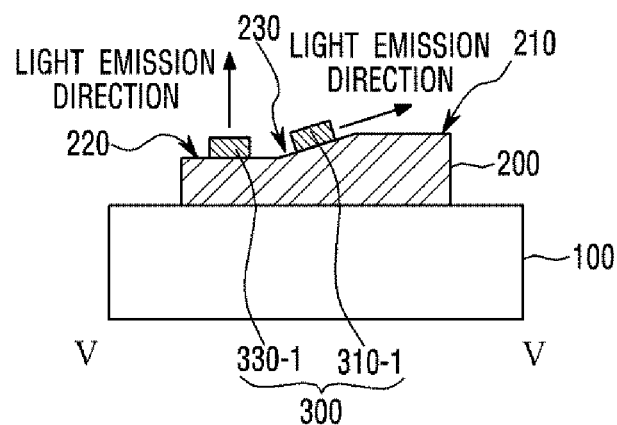
Figure 29C:
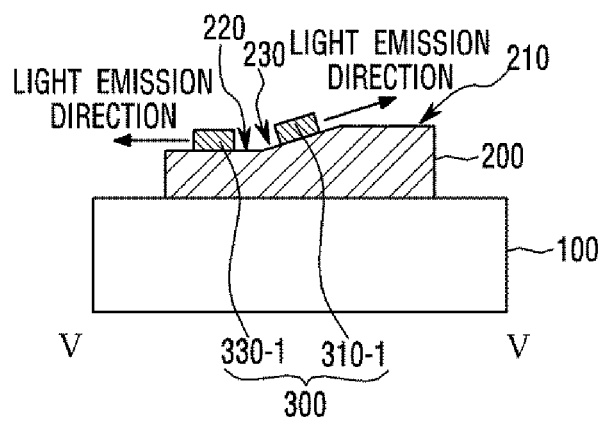

FIGS. 29a to 29c are cross sectional views showing light emission directions of the light sources according to FIG. 18b.

As shown in FIGS. 29a to 29c, the second substrate 200 may include the first upper surface 210 and the second upper surface 220, and the side surface 230 between the first upper surface 210 and the second upper surface 220.

Here, the first upper surface 210 of the second substrate 200 may be higher than the second upper surface 220 of the second substrate 200. A side surface 230 between the first upper surface 210 of the second substrate 200 and the second upper surface 220 of the second substrate 200 may be tilted at a certain angle with respect to the first upper surface 210 of the second substrate 200 or the second upper surface 220 of the second substrate 200.

That is, an angle between the side surface 230 of the second substrate 200 and the second upper surface 220 of the second substrate 200 may be an obtuse angle.

The light sources 330-1 included in the second light source array 330 may be disposed on the second upper surface 220 of the second substrate 200, the light sources 310-1 included in the first light source array 310 may be disposed on the side surface 230 of the second substrate 200, and no light source may be disposed on the first upper surface 210 of the second substrate 200.

Here, as shown in FIG. 29a, the light sources 330-1 included in the second light source array 330 may emit light in a first direction, and the light sources 310-1 included in the first light source array 310 may emit light in a third direction forming a predetermined angle with the first direction.

The reason that the light sources 310-1 included in the first light source array 310 emit light in the third direction is that the light sources 310-1 included in the first light source array 310 are disposed on the inclined side surface of the second substrate 200.

As shown in FIG. 29b, the light sources 330-1 included in the second light source array 330 may emit light in the first direction, and the light sources 310-1 included in the first light source array 310 may emit light in a fourth direction forming a predetermined angle with the first direction.

Also, as shown in FIG. 29c, the light sources 330-1 included in the second light source array 330 may emit light in a second direction perpendicular to the first direction, and the light sources 310-1 included in the first light source array 310 may emit light in the fourth direction.

As such, in the embodiment, the light emission directions of the light sources may be varied, thereby realizing various beam patterns.

Figure 30A:
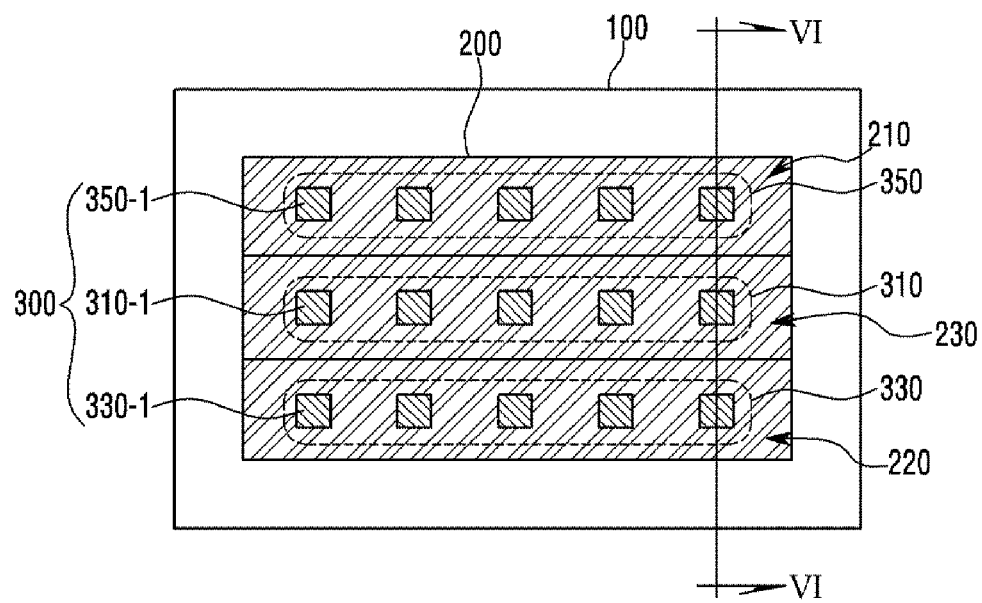
FIGS. 30a and 30b are views showing the distribution of light sources according to a sixth embodiment.
Figure 30B:
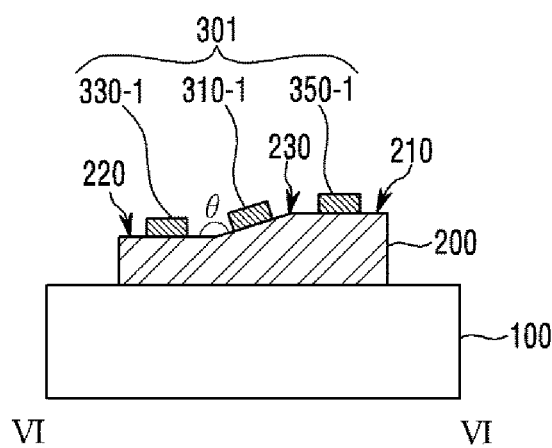

FIGS. 30a and 30b are views showing the distribution of light sources according to a sixth embodiment.

FIG. 30a is a plan view showing the arrangement of the light source arrays. FIG. 30b is a cross sectional views taken along line VI-VI of FIG. 30a.

As shown in FIGS. 30a and 30b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the first, second, and third light source arrays 310, 330 and 350.

The second substrate 200 may include the first upper surface 210 and the second upper surface 220, and the side surface 230 between the first upper surface 210 and the second upper surface 220.

Here, the first upper surface 210 of the second substrate 200 may be higher than the second upper surface 220 of the second substrate 200. A side surface 230 between the first upper surface 210 of the second substrate 200 and the second upper surface 220 of the second substrate 200 may be tilted at a certain angle with respect to the first upper surface 210 of the second substrate 200 or the second upper surface 220 of the second substrate 200.

That is, an angle between the side surface 230 of the second substrate 200 and the second upper surface 220 of the second substrate 200 may be an obtuse angle.

Light sources 350-1 included in the third light source array 350 may be disposed on the first upper surface 210 of the second substrate 200, the light sources 310-1 included in the first light source array 310 may be disposed on the side surface 230 of the second substrate 200, and the light sources 330-1 included in the second light source array 330 may be disposed on the second upper surface 220 of the second substrate 200.

Accordingly, the light sources 310-1 included in the first light source array 310, the light sources 330-1 included in the second light source array 330, and the light sources 350-1 included in the third light source array 350 may be disposed on different planes.

For example, the light sources 310-1 included in the first light source array 310 may be disposed on an area higher than the light sources 330-1 included in the second light source array 330, the light sources 350-1 included in the third light source array 350 may be disposed on an area higher than the light sources 310-1 included in the first light source array 310 and the light sources 330-1 included in the second light source array 330.

This intends that the light sources 310-1 included in the first light source array 310, the light sources 330-1 included in the second light source array 330, and the light sources 350-1 included in the third light source array 350 are disposed on different planes as described above to vary light emission directions of the light sources 300, thereby realizing various beam patterns.

Figure 31A:
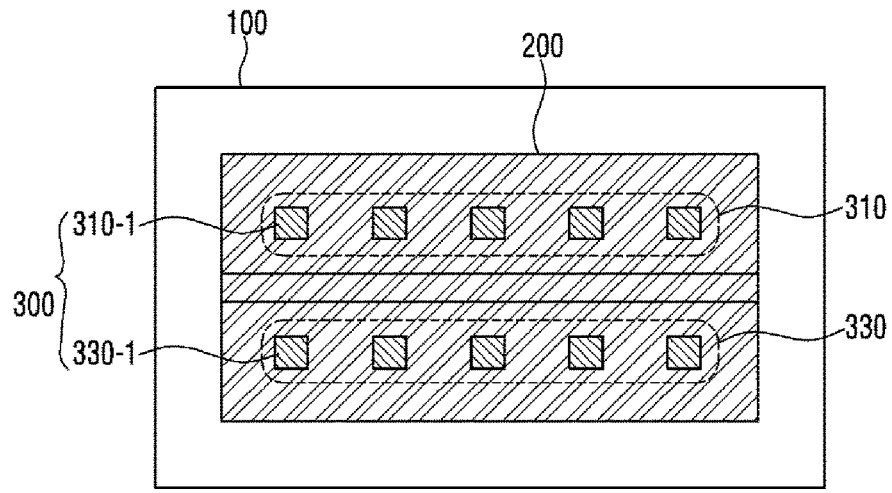
FIGS. 31a to 31c are views showing the structure of the light source according to the embodiment.
Figure 31B:
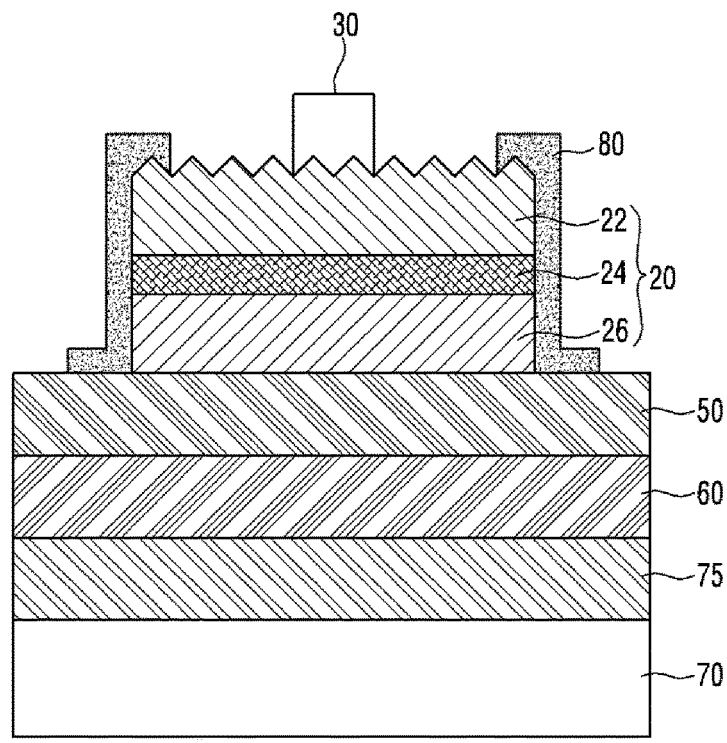
Figure 31C:
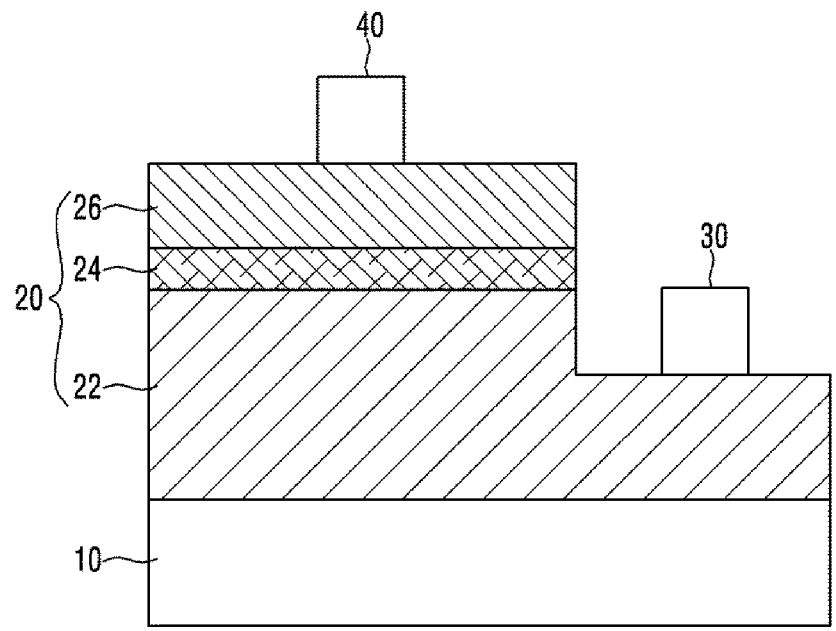

FIGS. 31a to 31c are views showing the structure of the light source according to the embodiment.

FIG. 31a is a plan view showing the arrangement of the light source arrays. FIG. 31b is a cross sectional view showing the structure of a top view type light source. FIG. 31c is a cross sectional view showing the structure of a side view type light source.

As shown in FIG. 31a, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

The light sources 310-1 included in the first light source array 310 and the light sources 330-1 included in the second light source array 330 may be top view type light emitting diodes. According to circumstances, a plurality of the light sources 300 may be side view type light emitting diodes.

In another case, the plurality of the light sources 300 may be formed by mixing the top view type light emitting diodes and the side view type light emitting diodes.

For example, the light sources 310-1 included in the first light source array 310 are top view type light emitting diodes including a first electrode disposed on a light emitting structure, a second electrode disposed under the light emitting structure, and a reflective layer disposed between the second electrode and the light emitting structure.

Also, the light sources 330-1 included in the second light source array 330 are side view type light emitting diodes including the first and the second electrodes disposed on the light emitting structure and a transparent substrate disposed under the light emitting structure.

As shown in FIG. 31b, the top view type light source may include a support substrate 70, a coupling layer 75 disposed on the support substrate 70, a reflective layer 60, an ohmic layer 50, and a light emitting structure 20 disposed on the support substrate 70.

Here, the support substrate 70 may be a conductive substrate. The support substrate 70 may be formed of a material having high electrical conductivity and high thermal conductivity.

The coupling layer 75 may include barrier metal or bonding metal. For example, the coupling layer 75 may include at least one of Ti, Au, Sn, Ni, Cr, Ga, In, Bi, Cu, Ag, and Ta. However, there is no limit to this.

The reflective layer 60 may be formed of, for example, any one selected from the group consisting of Ag, Ni, Al, Rh, Pd, Ir, Ru, Mg, Zn, Pt, Au, Hf, and through a selective combination thereof. Alternatively, the reflective layer 60 may be formed in the form of multi-layers by using a metallic material and a light-transmitting conductive material.

Also, the reflective layer 60 may be formed by stacking IZO/Ni, AZO/Ag, IZO/Ag/Ni, AZO/Ag/Ni, etc.

When the reflective layer 60 is formed of a material which comes in ohmic contact with the light emitting structure, the ohmic layer 50 is not necessary to be formed. There is no limit to this.

As such, the reflective layer 60 is able to greatly improve light extraction efficiency of the light source by effectively reflecting light generated from an active layer 24 of the light emitting structure.

The light-transmitting conductive material and the metallic material may be selectively used to form the ohmic layer 50. For example, the ohmic layer 50 may be formed of at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf. However, the material of the ohmic layer 50 is not limited to this.

The light emitting structure 20 may include a first conductive semiconductor layer 22, the active layer 24, and a second conductive semiconductor layer 26.

Here, the first conductive semiconductor layer 22 may be formed of a semiconductor compound, such as a Group III-V or II-VI compound semiconductor.

When the first conductive semiconductor layer 22 is an n type semiconductor layer, a first conductive dopant may be an n type dopant, such as Si, Ge, Sn, Se, or Te. However, there is no limit to this.

The active layer 24 is a layer in which electrons injected through the first conductive semiconductor layer 22 encounter electron holes injected through the second conductive semiconductor layer 26, so that light is emitted from the active layer 24.

Here, the active layer 24 may be formed to have at least any one of a single well structure, a multiple well structure, a quantum wire structure, and a quantum dot structure.

For example, the active layer 24 may have the multiple quantum well structure formed by injecting trimethylgallium (TMGa), ammonia (NH3), nitrogen (N2), and trimethylindium (TMIn). However, there is no limit to this.

Also, a well layer/barrier layer of the active layer 24 may be formed in a pair structure of at least one of InGaN/GaN, InGaN/InGaN, GaN/AlGaN, InAlGaN/GaN, GaAs(InGaAs)/AlGaAs, and GaP(InGaP)/AlGaP. However, embodiments are not limited thereto.

A conductive clad layer (not shown) may be formed on and/or under the active layer 24. The conductive clad layer may be formed of a semiconductor having a band gap larger than that of the barrier layer of the active layer 24.

For example, the conductive clad layer may include GaN, AlGaN, InAlGaN or a superlattice structure. The conductive clad layer may be n-type or p-type doped.

Also, the second conductive semiconductor layer 26 may be formed of a semiconductor compound, such as a Group III-V compound semiconductor doped with a second conductive dopant.

Here, the second conductive semiconductor layer 26 may include a semiconductor material having an empirical formula of, for example, $In_xAl_yGa_{1-x-y}N$ ($0 \leq x \leq 1$, $0 \leq y \leq 1$, $0 \leq x+y \leq 1$).

When the second conductive semiconductor layer 26 is a p type semiconductor layer, the second conductive dopant is a p type dopant, including Mg, Zn, Ca, Sr, or Ba. However, there is no limit to this.

Here, the first conductive semiconductor layer 22 may include a p type semiconductor layer, and the second conductive semiconductor layer 26 may include an n type semiconductor layer.

Also, a third conductive semiconductor layer (not shown) including an n type or p type semiconductor layer may be formed on the first conductive semiconductor layer 22. Therefore, the light source according to the embodiment may include at least one of n-p, p-n, n-p-n, and p-n-p junction structures.

An uneven pattern may be formed on the surface of the first conductive semiconductor layer 22.

Here, the uneven pattern may be provided to improve external extraction efficiency of light generated from the active layer 24. The uneven pattern may have a regular cycle or an irregular cycle.

Also, a passivation layer 80 may be formed on a side surface of the light emitting structure 20 and at least a portion of the first conductive semiconductor layer 22.

Here, the passivation layer 80 may be formed of an insulation material, such as a nonconductive oxide or nitride, to protect the light emitting structure 20.

As an example, the passivation layer 80 may be formed of a silicon oxide ($SiO_2$) layer, an oxide-nitride layer, or an aluminum oxide layer.

Meanwhile, as shown in FIG. 31*c*, a top view type light source may include the light emitting structure 20 including the first conductive semiconductor layer 22 disposed on a substrate 10, the active layer 24, and the second conductive semiconductor layer 26.

The light emitting structure 20 may be formed by using, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) and the like. However, the method for forming the light emitting structure 20 is not limited to this.

The substrate 10 may be formed of a material suitable for the growth of a semiconductor material or may be formed of a carrier wafer.

Also, the substrate 10 may be formed of a material having high thermal conductivity. The substrate 10 may be a conductive substrate or an insulating substrate.

A buffer layer (not shown) may be grown between the light emitting structure 20 and the substrate 10 to reduce lattice mismatch of materials and the difference between coefficients of thermal expansion.

The buffer layer may be formed of a Group III-V compound semiconductor. For example, the buffer layer may be formed of at least one of GaN, InN, AlN, InGaN, AlGaN, InAlGaN, and AlInN.

An undoped semiconductor layer may be formed on the buffer layer. However, there is no limit to this.

A portion of the first conductive semiconductor layer 22 of the light emitting structure 20 may be mesa-etched. A first electrode 30 may be disposed on an opening surface formed by mesa-etching. A second electrode 40 may be disposed on the second conductive semiconductor layer 26.

Here, the first electrode 30 and the second electrode 40 may be formed to have a single layer or a multiple layer structure including at least one selected from the group consisting of aluminum (Al), titanium (Ti), chrome (Cr), nickel (Ni), copper (Cu), and gold (Au).

As such, the light sources having different light emitting structures may be variously disposed in the first light source array 310 and the second light source array 330, thereby realizing various beam patterns.

Figure 32A:
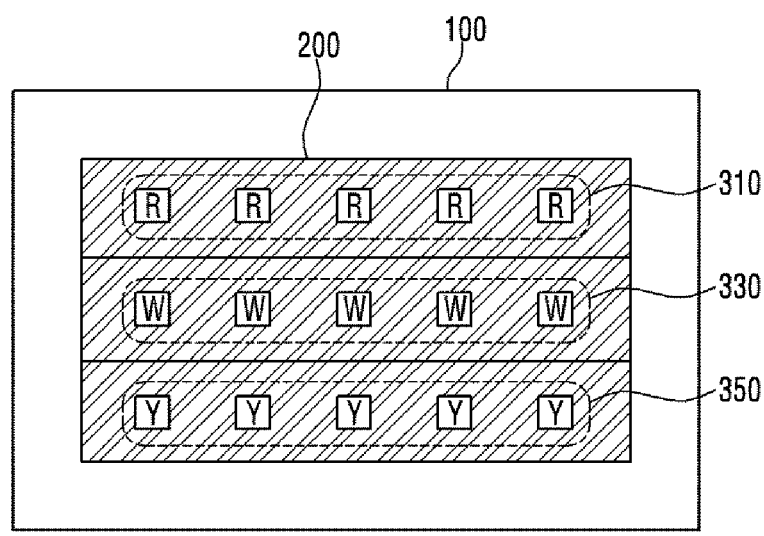
FIGS. 32a and 32b are plan views showing the light color distribution of the light source array according to the embodiment.
Figure 32B:
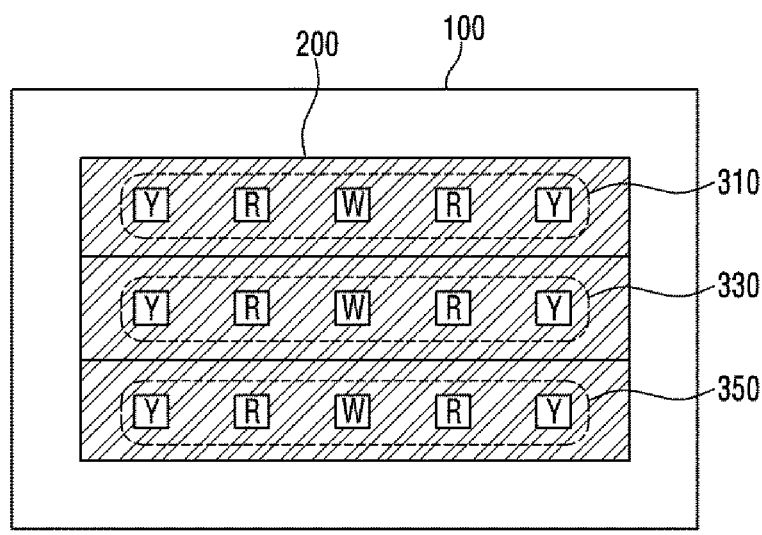

FIGS. 32*a* and 32*b* are plan views showing the light color distribution of the light source array according to the embodiment.

As shown in FIGS. 32*a* and 32*b*, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

For example, as shown in FIG. 32*a*, an odd number of the light source arrays may be provided. A first light source array 310, a second light source array 330, and a third light source arrays 350 may be disposed on the second substrate 200 in three rows in parallel with one another.

Here, the light sources included in the first light source array 310 may emit first color light, the light sources included in the second light source array 330 may emit second color light, and the light sources included in the third light source array 350 may emit third color light.

For example, the light sources included in the first light source array 310 may emit red color light, the light sources included in the second light source array 330 may emit white color light, and the light sources included in the third light source array 350 may emit yellow color light.

As shown in FIG. 32*b*, an odd number of the light source arrays may be provided. A first light source array 310, a second light source array 330, and a third light source arrays 350 may be disposed on the second substrate 200 in three rows in parallel with one another.

Here, the light sources included in the first light source array 310 may emit a plurality of color lights, the light sources included in the second light source array 330 may emit a plurality of color lights, and the light sources included in the third light source array 350 may emit a plurality of color lights.

In this case, neighboring ones of the light sources included in the first light source array 310 may emit mutually different color lights, and neighboring ones of the light sources included in the second light source array 330 may emit mutually different color lights.

According to circumstances, the light source included in the first light source array 310 may emit the same color light as the color light emitted from the neighboring ones of the light sources included in the second light source array 330.

In another example, the light source included in the first light source array 310 may emit the color light different from the color light emitted from the neighboring ones of the light sources included in the second light source array 330.

As described above, the light sources included in the light source array may generate the same color light, and, according to circumstances, at least one of the light sources included in the light source array may generate color light different from those generated from the other light sources.

Accordingly, in the embodiment, the light sources generating various color lights may be disposed in various ways in the light source arrays, thereby realizing beam patterns having various colors.

Figure 33A:
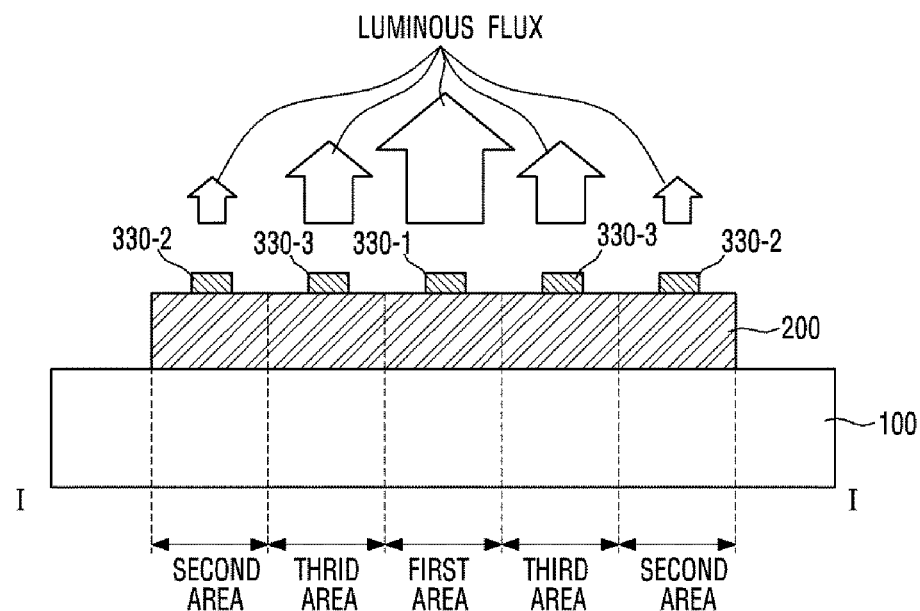
FIGS. 33a to 33c are cross sectional views showing the luminous flux of the light sources included in the light source array.
Figure 33B:
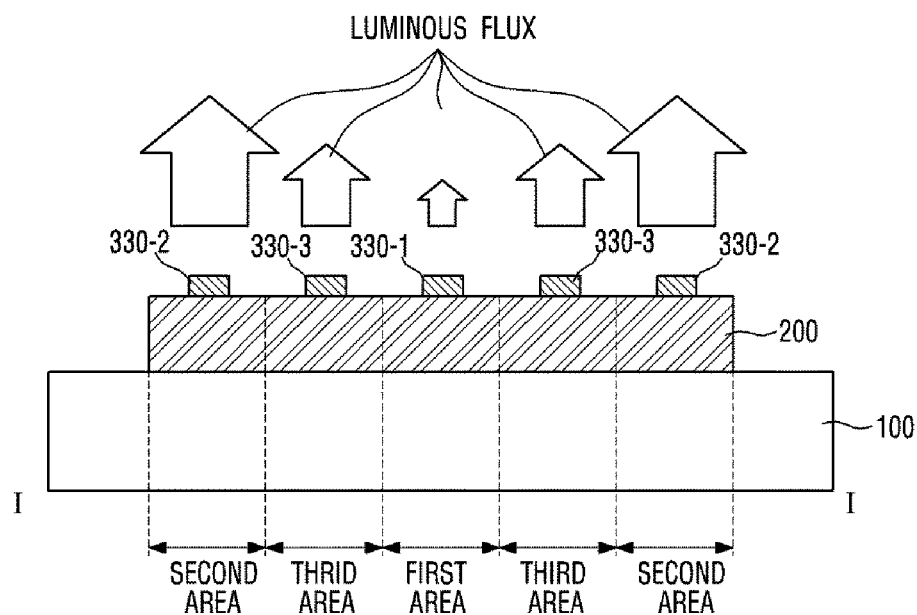
Figure 33C:
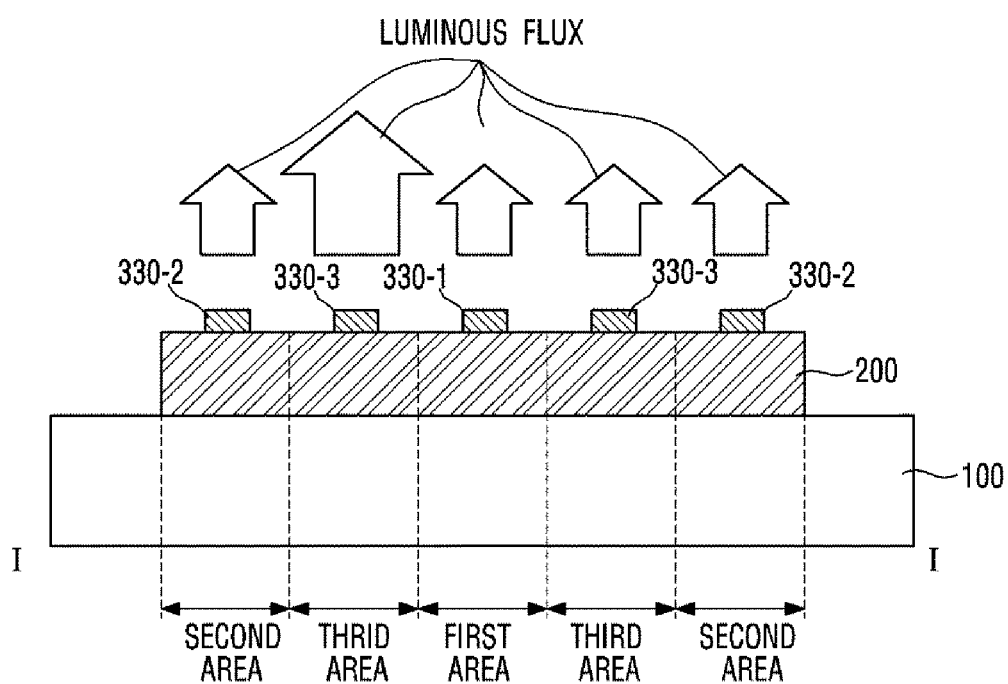

FIGS. 33*a* to 33*c* are cross sectional views showing the luminous flux of the light sources included in the light source array. More specifically, FIGS. 33*a* to 33*c* are cross sectional views taken along line I-I of FIG. 11*a*.

As shown in FIGS. 11*a* and 33*a* to 33*c*, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

The light source arrays may include neighboring first and second light source arrays 310 and 330.

The light sources included in the light source array may be disposed in a first area which is the central area of the second substrate 200, in a second area which is the edge area of the second substrate 200, and in a third area between the central area and the edge area of the second substrate 200.

For example, as shown in FIG. 33*a*, the luminous flux of the light source 330-1 located in the first area of the second substrate 200 among the plurality of the light sources included the second light source array 330 may be the largest, and the luminous flux of a light source 330-2 located in the second area of the second substrate 200 may be the smallest.

Also, the luminous flux of a light source 330-3 located in the third area of the second substrate 200 may be less than that of the light source 330-1 located in the first area of the second substrate 200 and may be larger than that of the light source 330-2 located in the second area of the second substrate 200.

As shown in FIG. 33*b*, the luminous flux of the light source 330-1 located in the first area of the second substrate 200 among the plurality of the light sources included the second light source array 330 may be the smallest, and the luminous flux of the light source 330-2 located in the second area of the second substrate 200 may be the largest.

Also, the luminous flux of the light source 330-3 located in the third area of the second substrate 200 may be larger than that of the light source 330-1 located in the first area of the second substrate 200 and may be smaller than that of the light source 330-2 located in the second area of the second substrate 200.

As shown in FIG. 33*c*, the luminous flux of the light source 330-3 located in the third area of the second substrate 200 among the plurality of the light sources included the second light source array 330 may be larger than that of the light source 330-2 located in the second area of the second substrate 200.

Also, the luminous flux of the light source 330-3 located in the third area of the second substrate 200 may be larger than that of the light source 330-1 located in the first area of the second substrate 200.

According to circumstances, the luminous flux of the light source 330-1 located in the first area of the second substrate 200 may be equal to that of the light source 330-2 located in the second area of the second substrate 200.

As described above, in the light sources 300 included in the light source array, the luminous flux of the light source 300 disposed in the central area of the light source array may or may not be equal to the luminous flux of the light source 300 disposed in the edge area of the light source array in accordance with circumstances.

For example, the luminous flux of the light source 300 disposed in the central area of the light source array may be larger than the luminous flux of the light source 300 disposed in the edge area of the light source array.

This intends that the luminance of the central area is increased in the beam pattern emitted to the outside.

Accordingly, in the embodiment, the light sources having different luminous fluxes may be disposed in the light source array in various ways, thereby realizing various beam patterns.

Figure 34A:
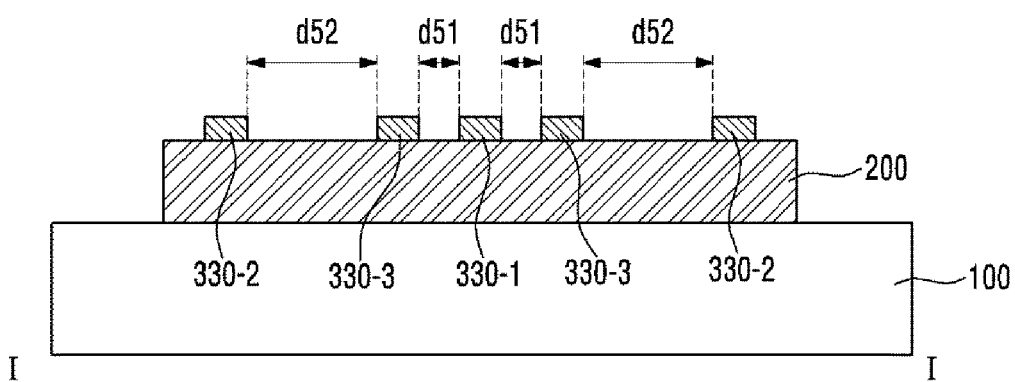
FIGS. 34a and 34b are cross sectional views showing the distance between the light sources included in the light source array.
Figure 34B:
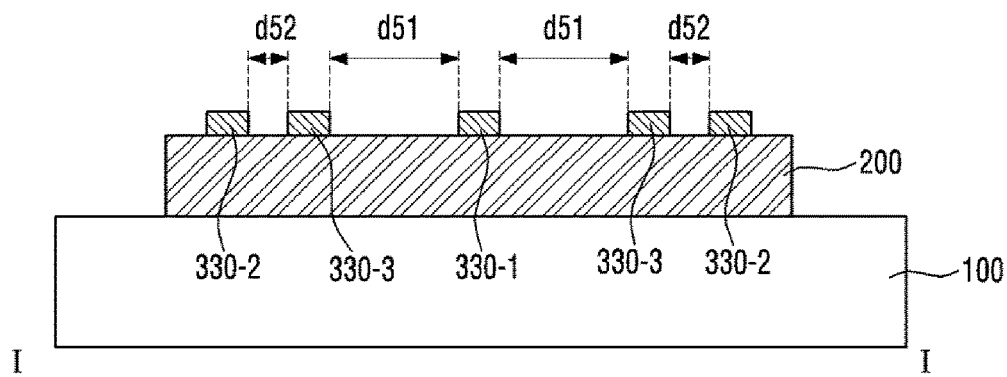

FIGS. 34*a* and 34*b* are cross sectional views showing the distance between the light sources included in the light source array. FIGS. 34*a* and 34*b* are cross sectional views taken along line I-I of FIG. 11*a*.

As shown in FIGS. 11*a*, 34*a* and 34*b*, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

The light source arrays may include neighboring first and second light source arrays 310 and 330.

Also, the distances between the light sources 300 included in the light source array may or may not be the same as each other according to circumstances.

For example, the distance between the light sources 300 included in the light source array may be gradually increased from the central area to the edge area of the light source array.

This intends that the luminance of the central area is increased in the beam pattern emitted to the outside.

For example, as shown in FIG. 34*a*, in the plurality of the light sources included the second light source array 330, a distance d51 between the light source 330-1 located in the central area of the second substrate 200 and the light source 330-3 adjacent to the light source 330-1 may be less than a distance d52 between the light source 330-2 located in the edge area of the second substrate 200 and the light source 330-3 adjacent to the light source 330-2.

As shown in FIG. 34*b*, in the plurality of the light sources included the second light source array 330, the distance d51 between the light source 330-1 located in the central area of the second substrate 200 and the light source 330-3 adjacent to the light source 330-1 may be greater than the distance d52 between the light source 330-2 located in the edge area of the second substrate 200 and the light source 330-3 adjacent to the light source 330-2.

As such, in the embodiment, the light source arrays having different distances between light sources may be disposed in various ways, thereby realizing various beam patterns.

Figure 35A:
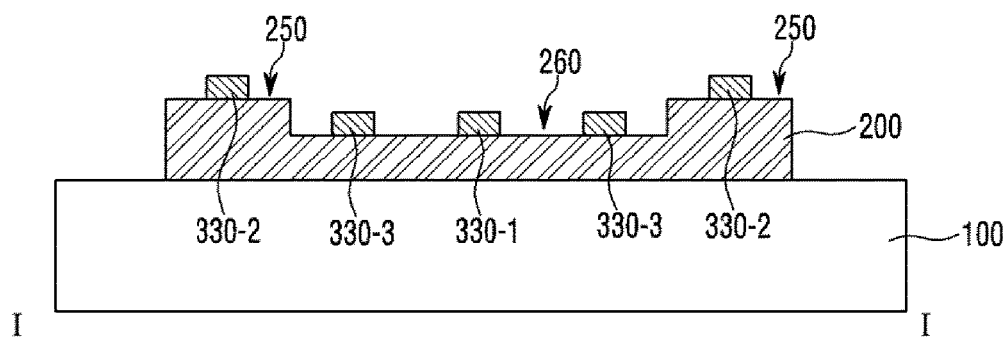
FIGS. 35a and 35b are cross sectional views showing the distribution of the light sources included in the light source array according to the first embodiment.
Figure 35B:
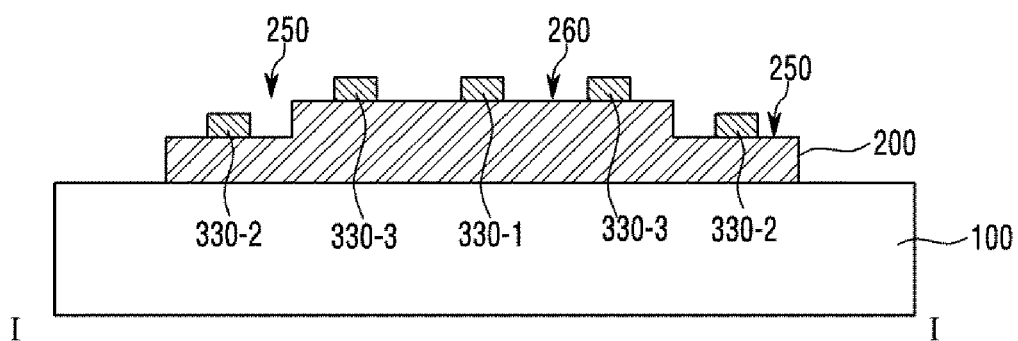

FIGS. 35a and 35b are cross sectional views showing the distribution of the light sources included in the light source array according to the first embodiment. FIGS. 35a and 35b are cross sectional views taken along line I-I of FIG. 11a.

As shown in FIGS. 11a, 35a and 35b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

The light source arrays may include neighboring first and second light source arrays 310 and 330.

The light sources 300 included in the light source array may be disposed on the same plane. According to circumstances, at least any one of the light sources 300 included in the light source array may be disposed on a plane different from the plane on which the other light sources 300 are disposed.

The light sources 300 included in the light source array may be disposed in a first area 260 which is the central area of the second substrate 200 and in a second area 250 which is the edge area of the second substrate 200.

For example, as shown in FIG. 35a, the light sources 330-1 and 330-3 located in the first area 260 of the second substrate 200 among the plurality of the light sources included the second light source array 330 may be disposed lower than the light sources 330-2 located in the second area 250 of the second substrate 200.

That is, the second area 250 of the second substrate 200 may protrude from the first area 260 of the second substrate 200 by a certain height.

As shown in FIG. 35b, the light sources 330-1 and 330-3 located in the first area 260 of the second substrate 200 among the plurality of the light sources included the second light source array 330 may be disposed higher than the light sources 330-2 located in the second area 250 of the second substrate 200.

That is, the first area 260 of the second substrate 200 may protrude from the second area 250 of the second substrate 200 by a certain height.

As such, the light sources included in the light source array are disposed on mutually different planes, thereby realizing various beam patterns.

Figure 36A:
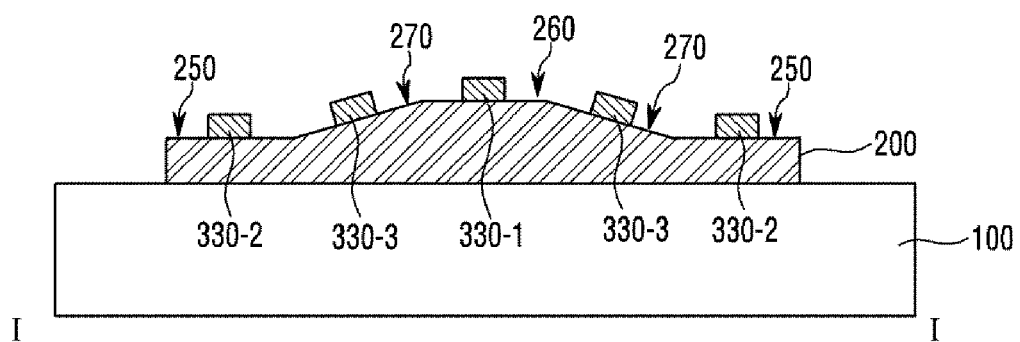
FIGS. 36a to 36c are cross sectional views showing the distribution of the light sources included in the light source array according to the second embodiment.
Figure 36B:
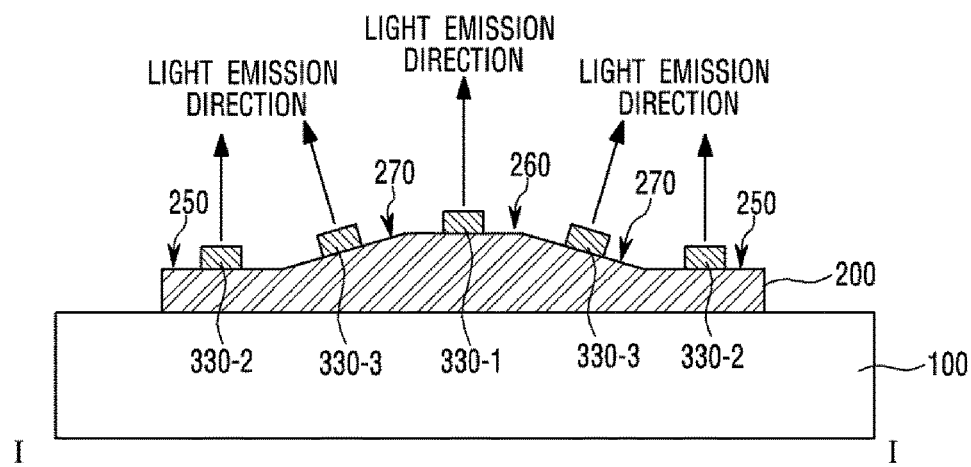
Figure 36C:
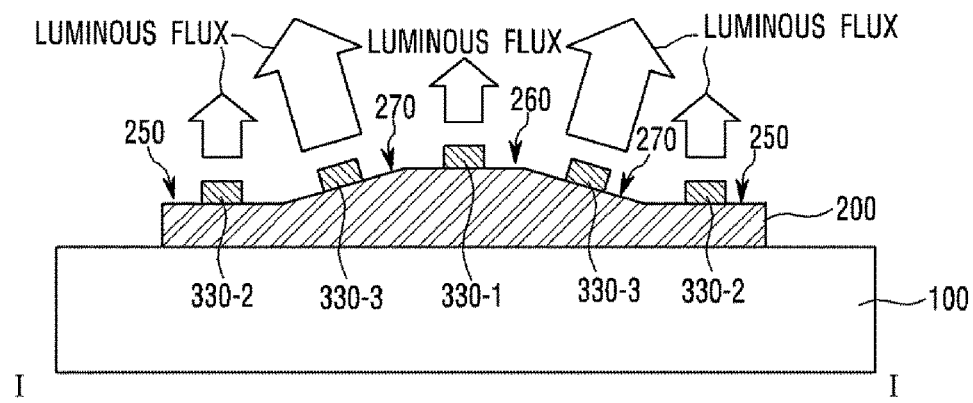

FIGS. 36a to 36c are cross sectional views showing the distribution of the light sources included in the light source array according to the second embodiment. FIGS. 36a to 36c are cross sectional views taken along line I-I of FIG. 11a.

As shown in FIGS. 11a, 36a and 36b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

The light source arrays may include neighboring first and second light source arrays 310 and 330.

The light sources 300 included in the light source array may be disposed on the same plane. According to circumstances, at least any one of the light sources 300 included in the light source array may be disposed on a plane different from the plane on which the other light sources 300 are disposed.

The light sources 300 included in the light source array may be disposed in the first area 260 which is the central area of the second substrate 200, in the second area 250 which is the edge area of the second substrate 200, and in a third area 270 between the central area and the edge area of the second substrate 200.

Here, the third area 270 of the second substrate 200 may be tilted at a certain angle with respect to the second area 250 of the second substrate 200.

That is, an angle between the third area 270 of the second substrate 200 and the second area 250 of the second substrate 200 may be an obtuse angle.

For example, as shown in FIG. 36a, the light source 330-1 located in the first area 260 of the second substrate 200 among the plurality of the light sources included the second light source array 330 may be disposed higher than the light source 330-2 located in the second area 250 of the second substrate 200 and the light source 330-3 located in the third area 270 of the second substrate 200.

Also, the light source 330-2 located in the second area 250 of the second substrate 200 may be disposed lower than the light source 330-3 located in the third area 270 of the second substrate 200.

The light sources 300 included in the light source array may have the same light emission direction. According to circumstances, at least one of the light sources 300 included in each light source array may have a light emission direction different from that of the other light sources 300.

For example, as shown in FIG. 36b, among the plurality of the light sources included the second light source array 330, the light emission direction of the light source 330-1 located in the first area 260 of the second substrate 200 may be the same as that of the light source 330-2 located in the second area 250 of the second substrate 200, however, may be different from that of the light source 330-3 located in the third area 270 of the second substrate 200.

The light sources 300 included in the light source array may have the same luminous flux. According to circumstances, at least one of the light sources 300 included in the light source array may have a luminous flux different from that of the other light sources 300.

For example, as shown in FIG. 36c, among the plurality of the light sources included the second light source array 330, the luminous flux of the light source 330-1 located in the first area 260 of the second substrate 200 may be equal to that of the light source 330-2 located in the second area 250 of the second substrate 200, however, may be smaller than that of the light source 330-3 located in the third area 270 of the second substrate 200.

As such, the light sources included in the light source array are disposed on mutually different planes, thereby realizing various beam patterns.

FIGS. 37a to 37e are cross sectional views showing the substrate structure of the lamp unit according to the embodiment.

As shown in FIGS. 37a to 37e, the first substrate 100, the second substrate 200, and a plurality of the light sources 300 may be included.

Here, the second substrate 200 may be disposed on the first substrate 100. The plurality of the light sources 300 may be disposed on the second substrate 200.

Figure 37A:
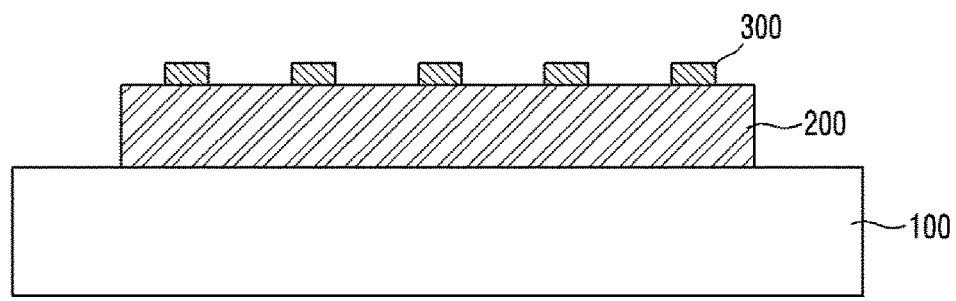
FIGS. 37a to 37e are cross sectional views showing the substrate structure of the lamp unit according to the embodiment.

As shown in FIG. 37a, the area of the second substrate 200 may be less than that of the first substrate 100.

Here, the first substrate 100 may be a metal substrate having a first thermal conductivity. The second substrate 200 may be an insulating substrate having a second thermal conductivity.

Here, the first thermal conductivity of the first substrate 100 may be greater than the second thermal conductivity of the second substrate 200.

This intends that heat generated from the light source 300 disposed on the second substrate 200 may be rapidly discharged to the outside.

Also, the first substrate 100 may be a heat dissipation plate having high thermal conductivity. The first substrate 100 may be made of any one selected from the group consisting of copper (Cu), aluminum (Al), silver (Ag), gold (Au), or of an alloy thereof.

The second substrate 200 may be made of a nitride, such as AlN, exhibiting high thermal conductivity.

Figure 37B:
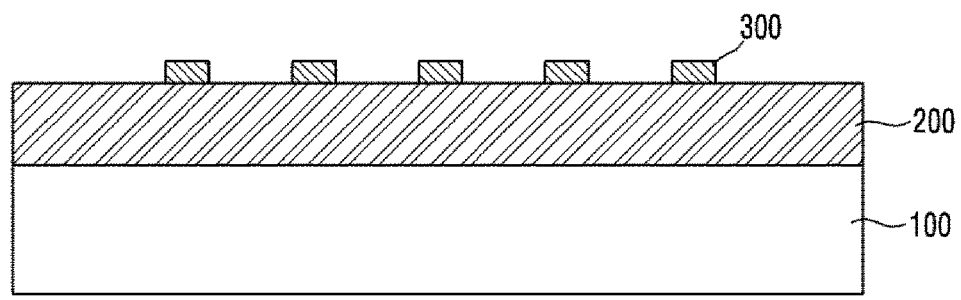

As shown in FIG. 37b, the area of the second substrate 200 may be equal to that of the first substrate 100.

That is, the first substrate 100 and the second substrate 200 may be sequentially stacked to form a laminated structure.

Here, the first substrate 100 may include at least any one of Al, Cu, and Au, and the second substrate 200 may include an anodized layer.

Figure 37C:
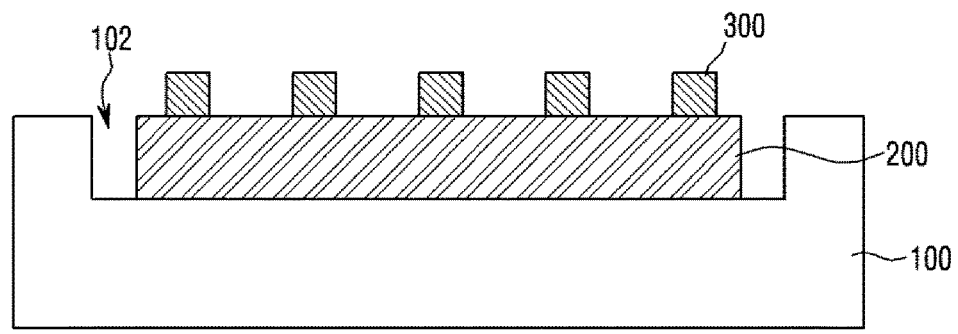

Also, as shown in FIG. 37c, the first substrate 100 may include a cavity 102 formed in a predetermined area thereof, and the second substrate 200 may be disposed in the cavity 102 of the first substrate 100.

In this case, the first substrate 100 may include at least one of Al, Cu, and Au, and the second substrate 200 may include AlN.

Figure 37D:
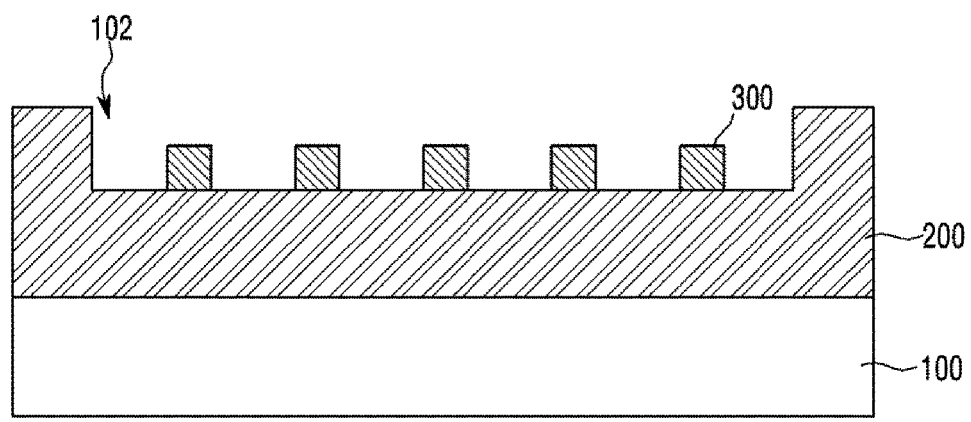

As shown in FIG. 37d, the second substrate 200 may include a cavity 202 formed in a predetermined area thereof and may be disposed on the first substrate 100.

Here, the plurality of the light sources 300 may be disposed in the cavity 202 of the second substrate 200.

In this case, the first substrate 100 may include at least one of Al, Cu, and Au, and the second substrate 200 may include AlN.

Figure 37E:
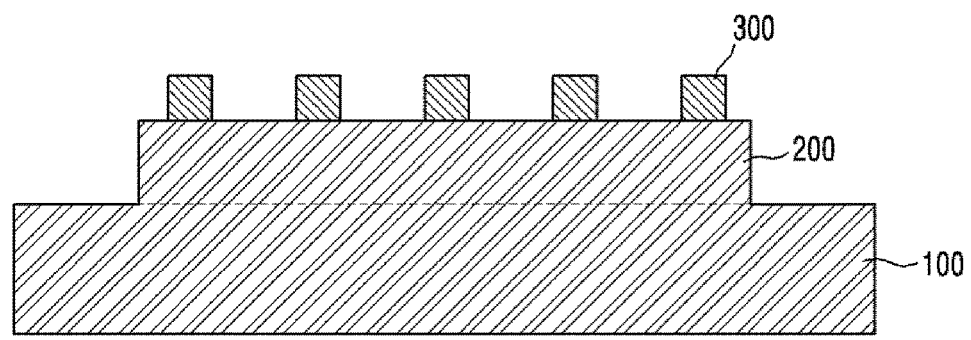

As shown in FIG. 37e, the first substrate 100 and the second substrate 200 may be formed of the same material. In this case, the first substrate 100 and the second substrate 200 may include at least one of AlN, Al, Cu, and Au.

As such, in the embodiment, the first substrate 100 and the second substrate 200 may be formed in various shapes.

Figure 38A:
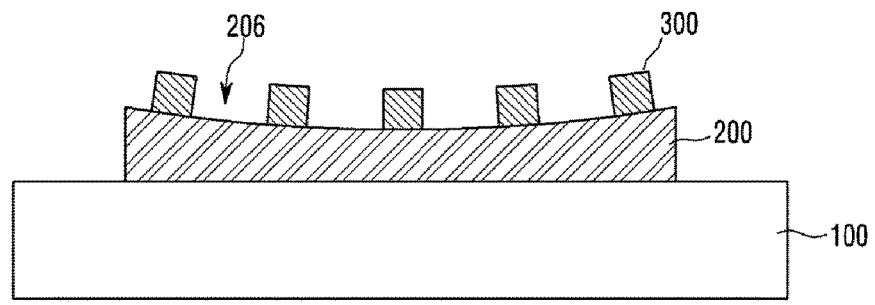
FIGS. 38a to 38c are cross sectional views showing the top surface of a second substrate.
Figure 38B:
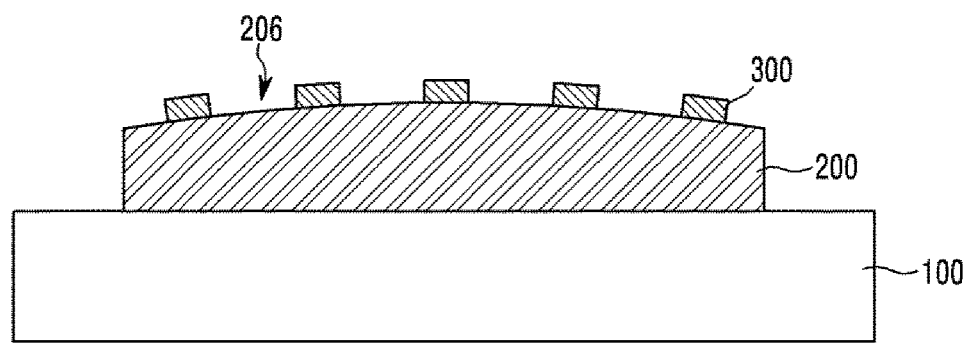
Figure 38C:
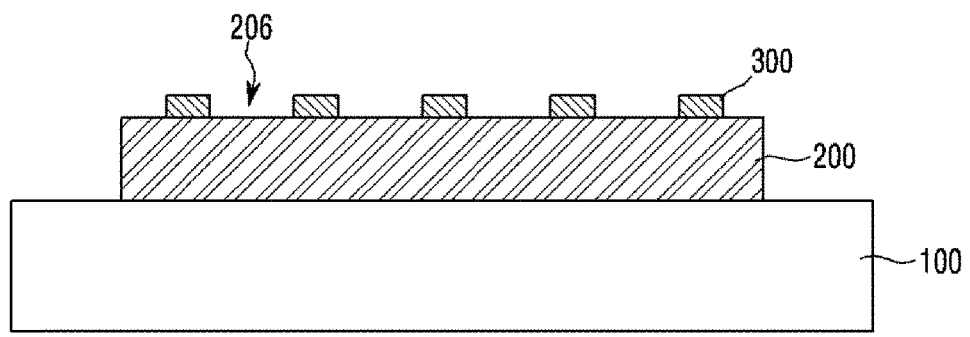

FIGS. 38a to 38c are cross sectional views showing the top surface of a second substrate.

As shown in FIGS. 38a to 38c, the first substrate 100, the second substrate 200, and a plurality of the light sources 300 may be included.

Here, the second substrate 200 may be disposed on the first substrate 100. The plurality of the light sources 300 may be disposed on the second substrate 200.

The area of the second substrate 200 may be less than that of the first substrate 100.

Here, the first substrate 100 may be a metal substrate having a first thermal conductivity. The second substrate 200 may be an insulating substrate having a second thermal conductivity.

Here, the first thermal conductivity of the first substrate 100 may be greater than the second thermal conductivity of the second substrate 200.

This intends that heat generated from the light source 300 disposed on the second substrate 200 may be rapidly discharged to the outside.

Also, the first substrate 100 may be a heat dissipation plate having high thermal conductivity. The first substrate 100 may be made of any one selected from the group consisting of copper (Cu), aluminum (Al), silver (Ag), gold (Au), or of an alloy thereof.

The second substrate 200 may be made of a nitride, such as AlN, exhibiting high thermal conductivity.

As shown in FIG. 38a, the second substrate 200 may have a concave upper surface 206, on which the light source 300 is disposed.

According to circumstances, as shown in FIG. 38b, the second substrate 200 may have a convex upper surface 206, on which the light source 300 is disposed. Also, as shown in FIG. 38c, the second substrate 200 may have a flat upper surface 206, on which the light source 300 is disposed.

As such, the light sources are disposed on the second substrate 200 having various surface shapes, thereby realizing various beam patterns.

Figure 39A:
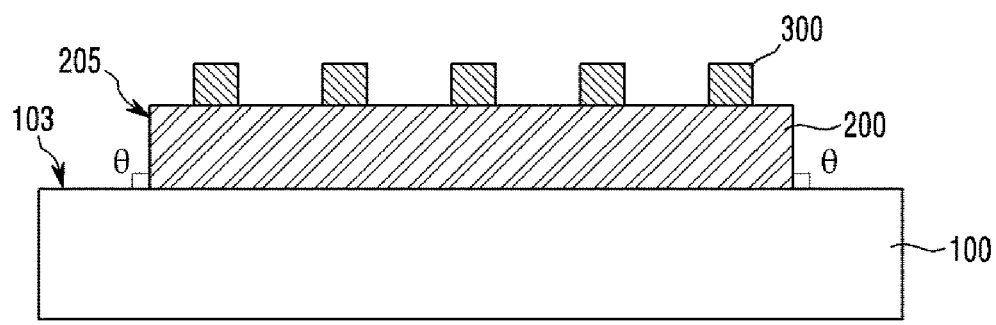
FIGS. 39a to 39c are cross sectional views showing the side of the second substrate.
Figure 39B:
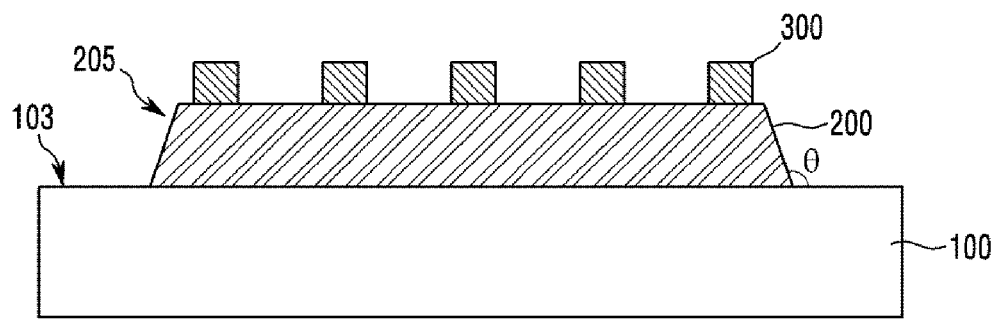
Figure 39C:
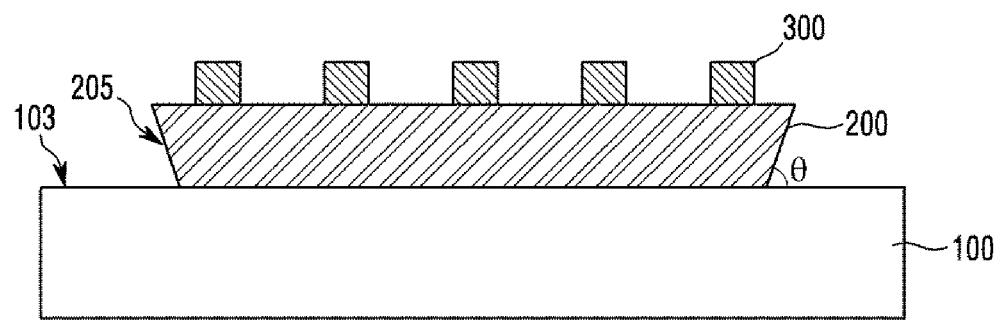

FIGS. 39a to 39c are cross sectional views showing the side of the second substrate.

As shown in FIGS. 39a to 39c, the first substrate 100, the second substrate 200, and a plurality of the light sources 300 may be included.

Here, the second substrate 200 may be disposed on the first substrate 100. The plurality of the light sources 300 may be disposed on the second substrate 200.

As shown in FIG. 39a, an angle between a side surface 205 of the second substrate 200 and an upper surface 103 of the first substrate 100 may be a right angle.

According to circumstances, as shown in FIG. 39b, an angle between the side surface 205 of the second substrate 200 and the upper surface 103 of the first substrate 100 may be an obtuse angle. Alternatively, as shown in FIG. 39c, an angle between the side surface 205 of the second substrate 200 and the upper surface 103 of the first substrate 100 may be an acute angle.

As such, in the embodiment, the first substrate 100 and the second substrate 200 may be formed in various shapes.

Figure 40A:
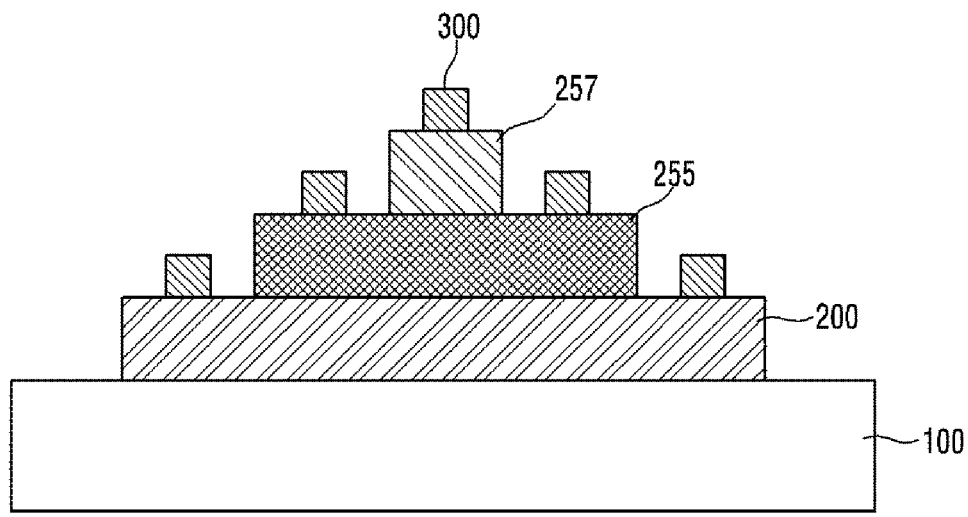
FIGS. 40a to 40c are cross sectional views showing protrusions of the second substrate according to the first embodiment.
Figure 40B:
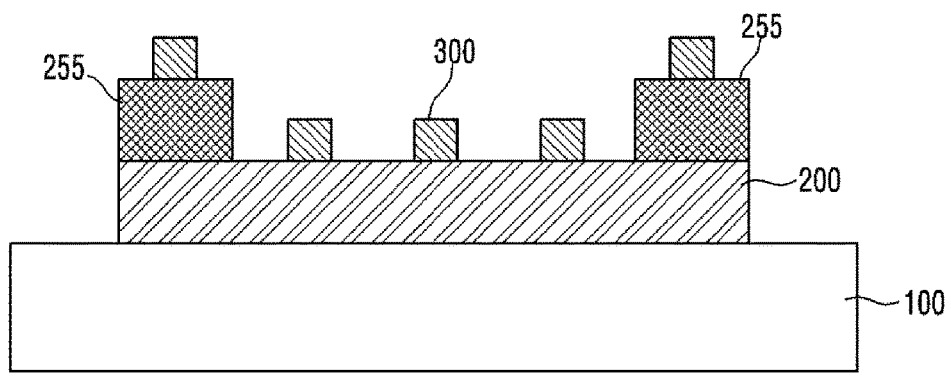
Figure 40C:
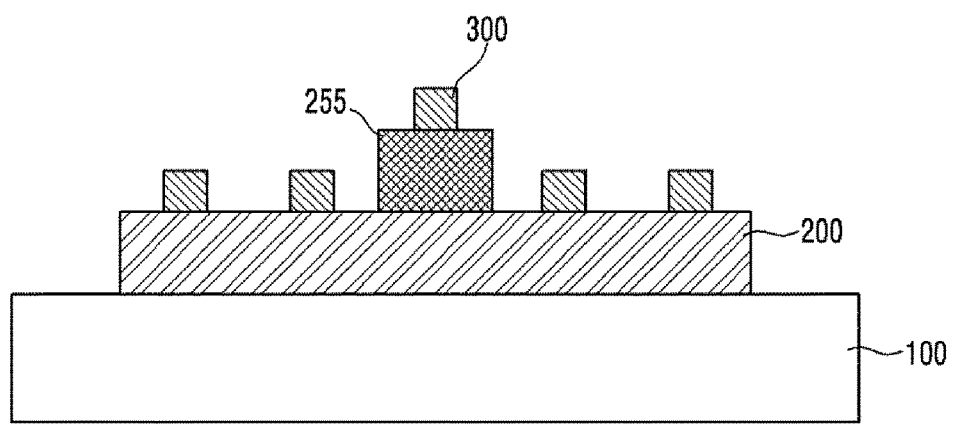

FIGS. 40a to 40c are cross sectional views showing protrusions of the second substrate according to the first embodiment.

As shown in FIGS. 40a to 40c, the first substrate 100, the second substrate 200, and a plurality of the light sources 300 may be included.

Here, the second substrate 200 may be disposed on the first substrate 100. The plurality of the light sources 300 may be disposed on the second substrate 200.

The area of the second substrate 200 may be less than that of the first substrate 100.

Here, the first substrate 100 may be a metal substrate having a first thermal conductivity. The second substrate 200 may be an insulating substrate having a second thermal conductivity.

Here, the first thermal conductivity of the first substrate 100 may be greater than the second thermal conductivity of the second substrate 200.

This intends that heat generated from the light source 300 disposed on the second substrate 200 may be rapidly discharged to the outside.

For example, the first substrate 100 may be a heat dissipation plate having high thermal conductivity. The first substrate 100 may be made of any one selected from the group consisting of copper (Cu), aluminum (Al), silver (Ag), gold (Au), or of an alloy thereof.

The second substrate 200 may be made of a nitride, such as AlN, exhibiting high thermal conductivity.

The second substrate 200 may include at least one projection protruding from the surface thereof by a predetermined height.

An angle between the surface of the second substrate 200 and a side of the projection may be a right angle.

For example, as shown in FIG. 40a, the second substrate 200 may include a first projection 255 and a second projection 257 which protrude from the central area thereof by a predetermined height.

Here, the second projection 257 may protrude from the central area of the first projection 255 by a predetermined height.

The light source 300 may be disposed on at least any one of the second substrate 200, the first projection 255, and the second projection 257.

Also, as shown in FIG. 40b, the second substrate 200 may include the first projection 255 protruding from the edge area thereof by a predetermined height.

The light source 300 may be disposed on at least any one of the second substrate 200 and the first projection 255.

As shown in FIG. 40c, the second substrate 200 may include the first projection 255 protruding from the central area thereof by a predetermined height.

The light source 300 may be disposed on at least any one of the second substrate 200 and the first projection 255.

As such, the light sources are disposed on the second substrate 200 having the projections, thereby realizing various beam patterns.

Figure 41A:
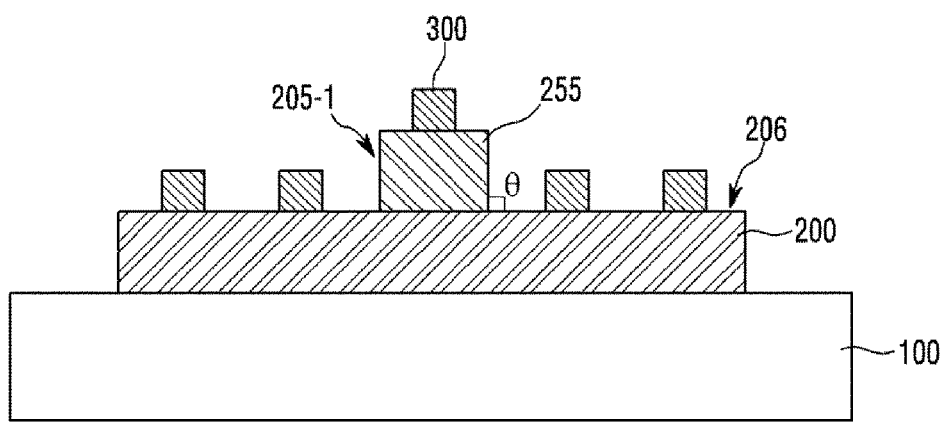
FIGS. 41a and 41b are cross sectional views showing protrusions of the second substrate according to the second embodiment.
Figure 41B:
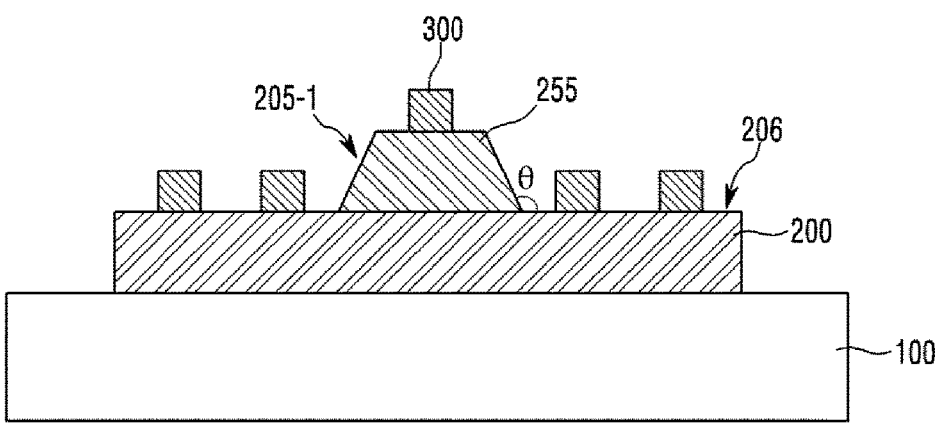

FIGS. 41a and 41b are cross sectional views showing protrusions of the second substrate according to the second embodiment.

As shown in FIGS. 41a and 41b, the first substrate 100, the second substrate 200, and a plurality of the light sources 300 may be included.

Here, the second substrate 200 may be disposed on the first substrate 100. The plurality of the light sources 300 may be disposed on the second substrate 200.

The second substrate 200 may include at least one projection 255 protruding from the surface 206 thereof by a predetermined height.

An angle between the upper surface 206 of the second substrate 200 and a side surface 205-1 of the first projection 255 may be a right angle or an obtuse angle.

As shown in FIG. 41a, the second substrate 200 may include the first projection 255 protruding from the central area thereof by a predetermined height.

Here, an angle between the upper surface 206 of the second substrate 200 and the side surface 205-1 of the first projection 255 may be a right angle.

The light source 300 may be disposed on at least any one of the second substrate 200 and the first projection 255.

As shown in FIG. 41b, the second substrate 200 may include the first projection 255 protruding from the central area thereof by a predetermined height.

Here, an angle between the upper surface 206 of the second substrate 200 and the side surface 205-1 of the first projection 255 may be an obtuse angle.

The light source 300 may be disposed on at least any one of the second substrate 200 and the first projection 255.

Figure 42:
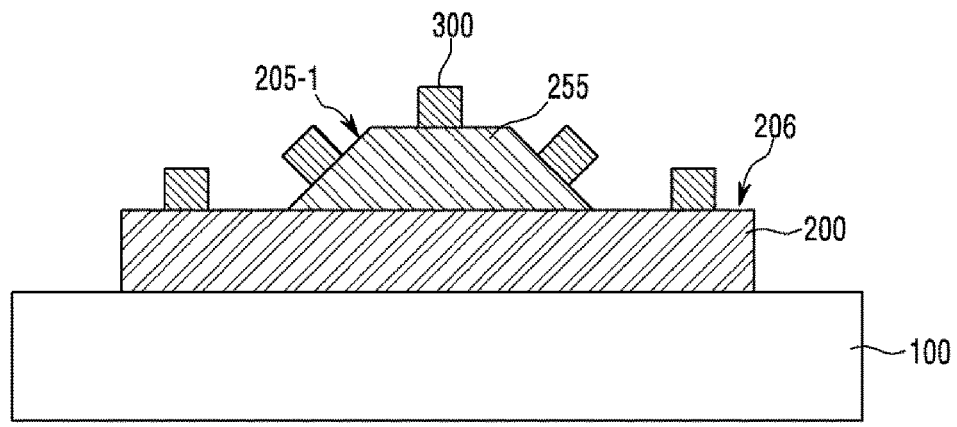
FIG. 42 is a cross sectional view showing protrusions of the second substrate according to the third embodiment.

FIG. 42 is a cross sectional view showing protrusions of the second substrate according to the third embodiment.

As shown in FIG. 42, the first substrate 100, the second substrate 200, and a plurality of the light sources 300 may be included.

Here, the second substrate 200 may be disposed on the first substrate 100. The plurality of the light sources 300 may be disposed on the second substrate 200.

The second substrate 200 may include at least one projection 255 protruding from the surface 206 thereof by a predetermined height.

Here, an angle between the upper surface 206 of the second substrate 200 and the side surface 205-1 of the first projection 255 may be an obtuse angle.

The light source 300 may be disposed on at least any one of the second substrate 200, the upper surface of the first projection 255, and the side surface 205-1 of the first projection 255.

As such, the light sources are disposed on the second substrate 200 having the projections, thereby realizing various beam patterns.

Figure 43A:
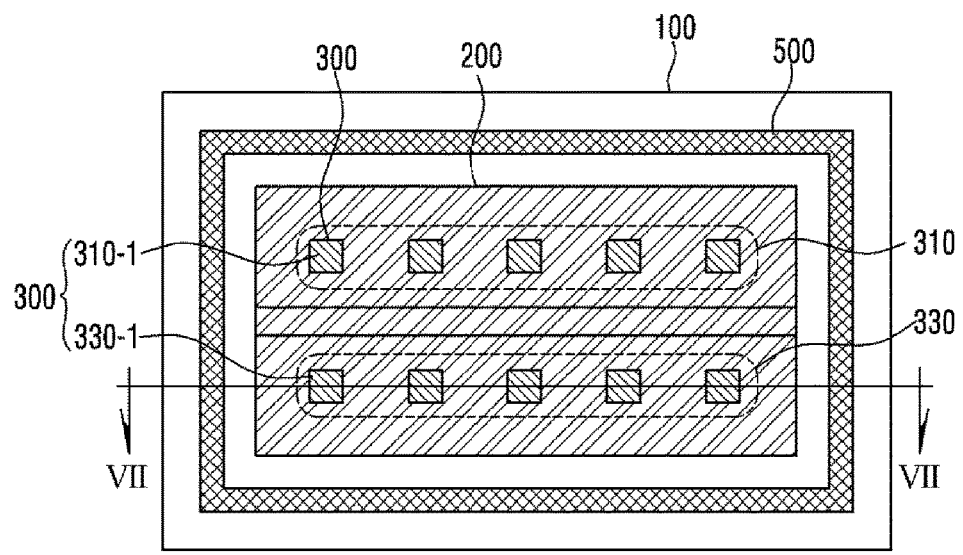
FIGS. 43a and 43b are views showing the barrier of the lamp unit according to the embodiment.
Figure 43B:
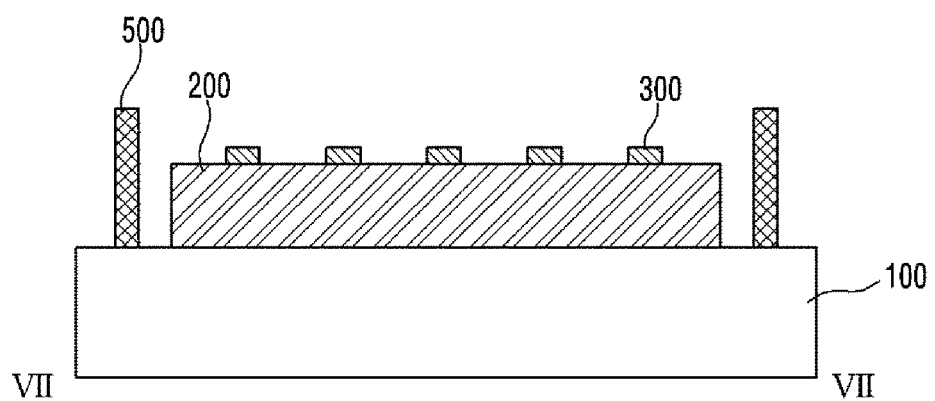

FIGS. 43a and 43b are views showing the barrier of the lamp unit according to the embodiment.

FIG. 43a is a plan view and FIG. 43b is a cross sectional view taken along line VII-VII of FIG. 43a.

As shown in FIGS. 43a and 43b, the first substrate 100, the second substrate 200, and a plurality of the light sources 300 may be included.

Here, the second substrate 200 may be disposed on the first substrate 100. The plurality of the light sources 300 may be disposed on the second substrate 200.

The embodiment may include a plurality of light source arrays, in each of which the plurality of the light sources 300 are disposed in a row.

Here, the plurality of the light source arrays may include the neighboring first and second light source arrays 310 and 330.

A barrier 500 may be disposed around the plurality of the light sources 300.

The barrier 500 may be provided to protect the light sources 300 and wires for electrical connection of the light sources 300. The barrier 500 may be formed in various shapes based on the shape of the second substrate 200.

For example, the barrier 500 may be formed in a polygonal shape or a ring shape.

The barrier 500 may include a metallic reflective material. The barrier may reflect light generated from the light source 300 to improve light extraction efficiency of the light source 300.

Here, the barrier 500 may include at least one of aluminum (Al), silver (Ag), platinum (Pt), rhodium (Rh), radium (Rd), palladium (Pd), and chrome (Cr).

Subsequently, the distance between the barrier 500 and the light source 300 and the height of the barrier 500 may be adjusted to control an orientation angle of light emitted from the light source 300.

FIGS. 44a to 44d are cross sectional views showing the distribution of the barrier of the lamp unit according to the embodiment.

As shown in FIGS. 44a to 44d, the first substrate 100, the second substrate 200, a plurality of the light sources 300 and the barrier 500 may be included.

Here, the second substrate 200 may be disposed on the first substrate 100. The plurality of the light sources 300 may be disposed on the second substrate 200.

As shown in FIG. 44, the area of the second substrate 200 may be less than that of the first substrate 100.

In this case, the barrier 500 may be disposed on the first substrate 100.

Here, the first substrate 100 may be a metal substrate having a first thermal conductivity. The second substrate 200 may be an insulating substrate having a second thermal conductivity.

Here, the first thermal conductivity of the first substrate 100 may be greater than the second thermal conductivity of the second substrate 200.

This intends that heat generated from the light source 300 disposed on the second substrate 200 may be rapidly discharged to the outside.

For example, the first substrate 100 may be a heat dissipation plate having high thermal conductivity. The first substrate 100 may be made of any one selected from the group consisting of copper (Cu), aluminum (Al), silver (Ag), gold (Au), or of an alloy thereof.

The second substrate 200 may be made of a nitride, such as AlN, exhibiting high thermal conductivity.

Figure 44A:
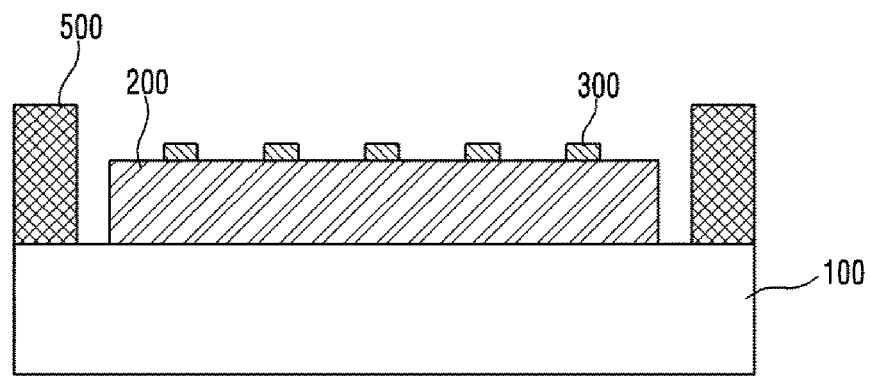
FIGS. 44a to 44d are cross sectional views showing the distribution of the barrier of the lamp unit according to the embodiment.
Figure 44B:
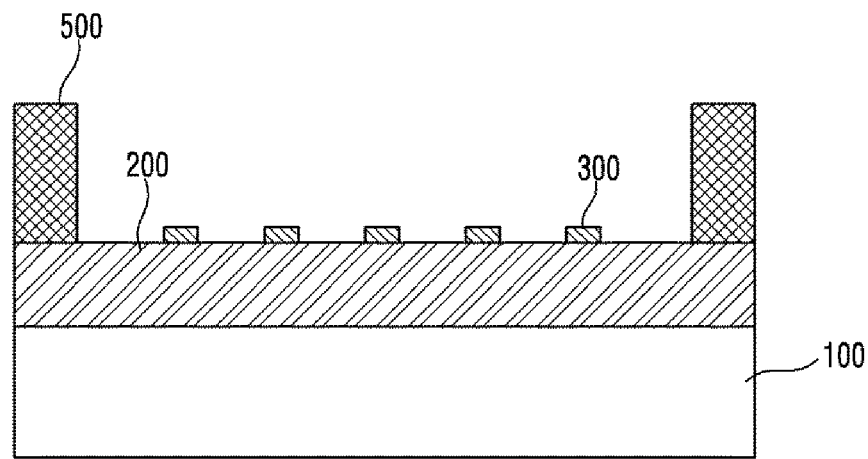

As shown in FIG. 44b, the area of the second substrate 200 may be equal to that of the first substrate 100.

That is, the first substrate 100 and the second substrate 200 may be sequentially stacked to form a laminated structure.

In this case, the barrier 500 may be disposed on the second substrate 200.

Here, the first substrate 100 may include at least any one of Al, Cu, and Au, and the second substrate 200 may include an anodized layer.

Figure 44C:
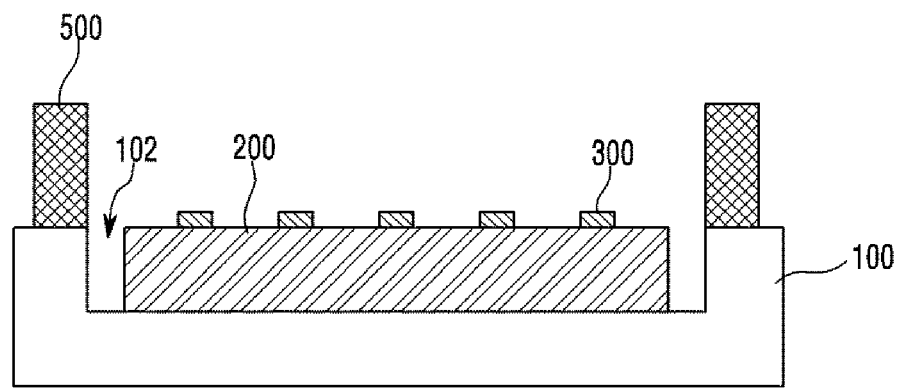

Also, as shown in FIG. 44c, the first substrate 100 may include a cavity 102 formed in a predetermined area thereof, and the second substrate 200 may be disposed in the cavity 102 of the first substrate 100.

In this case, the barrier 500 may be disposed on the first substrate 100.

In this case, the first substrate 100 may include at least one of Al, Cu, and Au, and the second substrate 200 may include AlN.

Figure 44D:
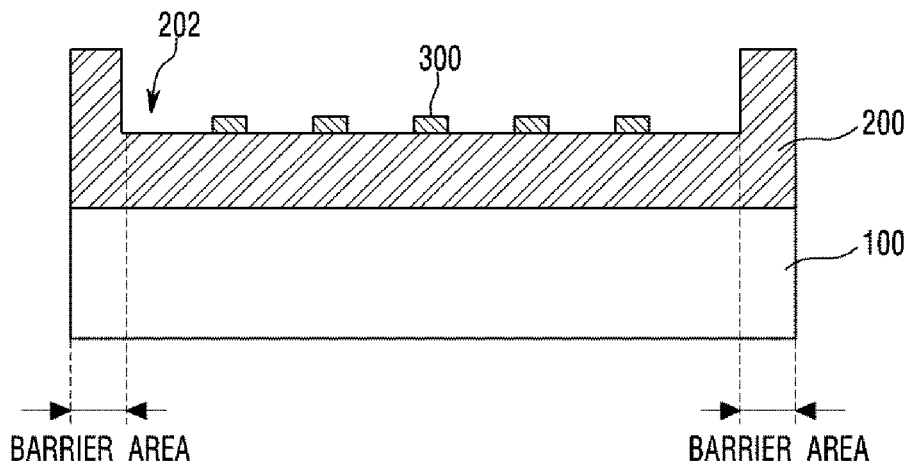

As shown in FIG. 44d, the second substrate 200 may include a cavity 202 formed in a predetermined area thereof and may be disposed on the first substrate 100.

Here, the plurality of the light sources 300 may be disposed in the cavity 202 of the second substrate 200.

In this case, the second substrate 200 may include a barrier area.

In this case, the first substrate 100 may include at least one of Al, Cu, and Au, and the second substrate 200 may include AlN.

As such, in the embodiment, the barrier may be disposed at different positions depending on the various shapes of the first substrate 100 and the second substrate 200.

Figure 45A:
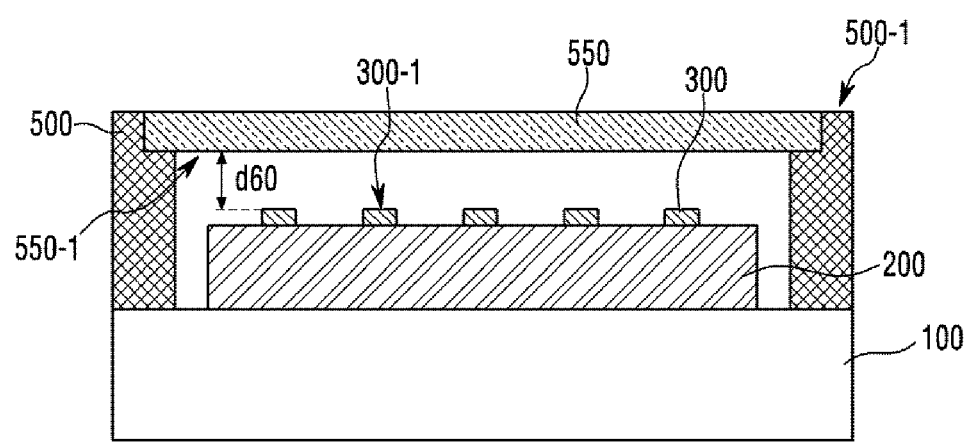
FIGS. 45a and 45b are cross sectional views showing the cover glass of the lamp unit according to the embodiment.
Figure 45B:
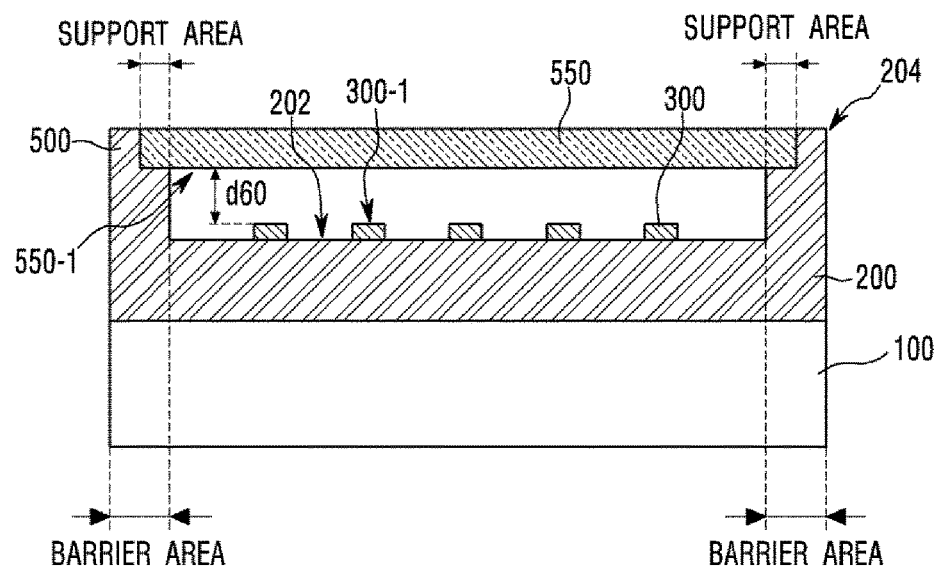

FIGS. 45a and 45b are cross sectional views showing the cover glass of the lamp unit according to the embodiment.

As shown in FIGS. 45a and 45b, the first substrate 100, the second substrate 200, a plurality of light sources 300, the barrier 500, and a cover glass 550 may be included.

Here, the second substrate 200 may be disposed on the first substrate 100. The plurality of the light sources 300 may be disposed on the second substrate 200.

The cover glass 550 may be spaced apart from the plurality of the light sources 300 by a predetermined distance.

Here, a distance d60 between the light sources 300 and a lower surface 550-1 of the cover glass 550 may be about 0.1 mm to 50 mm.

The cover glass may protect the light source 300 and transmit light generated from the light source 300.

The cover glass 550 may be anti-reflectively coated to improve the transmittance of the light generated from the light source 300.

Here, an anti-reflective coating film may be attached to a glass-based material, or an anti-reflective coating solution may be applied to a glass-based material by spin coating or spray coating to form an anti-reflective coating layer, so that the anti-reflective coating may be performed.

For example, the anti-reflective coating layer may include at least one of $TiO_2$, $SiO_2$, $Al_2O_3$, $Ta_2O_3$, $ZrO_2$, and $MgF_2$.

The cover glass 550 may include a hole (not shown) or an opening (not shown). Gas caused by heat generated from the light source 300 may be discharged through the hole or the opening.

The cover glass 550 may be formed in the shape of a dome having a hole or an opening. According to circumstances, the cover glass 550 may include a color filter which transmits only light having a specific wavelength among the light generated from the light source 300.

In another case, the cover glass may include a particular pattern (not shown) capable of adjusting an orientation angle of the light generated from the light source 300.

Here, the kind and shape of the pattern are not limited.

As shown in FIG. 45a, the area of the second substrate 200 may be less than that of the first substrate 100.

In this case, the barrier 500 may be disposed on the first substrate 100, and the cover glass 550 may be supported by a portion of an upper surface 500-1 of the barrier 500.

Here, the first substrate 100 may be a metal substrate having a first thermal conductivity. The second substrate 200 may be an insulating substrate having a second thermal conductivity.

Here, the first thermal conductivity of the first substrate 100 may be greater than the second thermal conductivity of the second substrate 200.

This intends that heat generated from the light source 300 disposed on the second substrate 200 may be rapidly discharged to the outside.

Also, the first substrate 100 may be a heat dissipation plate having high thermal conductivity. The first substrate 100 may be made of any one selected from the group consisting of copper (Cu), aluminum (Al), silver (Ag), gold (Au), or of an alloy thereof.

The second substrate 200 may be made of a nitride, such as AlN, exhibiting high thermal conductivity.

As shown in FIG. 45b, the second substrate 200 may include a cavity 202 formed in a predetermined area thereof and may be disposed on the first substrate 100.

Here, the plurality of the light sources 300 may be disposed in the cavity 202 of the second substrate 200.

In this case, the second substrate 200 may include a barrier area, and the cover glass 550 may be supported by a portion of an upper edge 204 of the second substrate 200.

Here, the width of the barrier area of the second substrate 200 may be greater than that of the support area of the second substrate 200, which supports the cover glass 550.

In this case, the first substrate 100 may include at least one of Al, Cu, and Au, and the second substrate 200 may include AlN.

As such, in the embodiment, the structure of the barrier supporting the cover glass may be changed depending on the various shapes of the first substrate 100 and the second substrate 200.

FIGS. 46a to 46d are cross sectional views showing the phosphor layer of the lamp unit according to the embodiment.

As shown in FIGS. 46a to 46d, the first substrate 100, the second substrate 200, the plurality of light sources 300, and a phosphor layer 590 may be included.

Here, the second substrate 200 may be disposed on the first substrate 100. The plurality of the light sources 300 may be disposed on the second substrate 200.

The phosphor layer 590 may be disposed on the plurality of the light sources 300.

Here, the phosphor layer 590 may be disposed corresponding respectively to the plurality of the light sources 300.

The phosphor layer 590 may include at least one of a red fluorescent substance, a yellow fluorescent substance, and a green fluorescent substance.

Figure 46A:
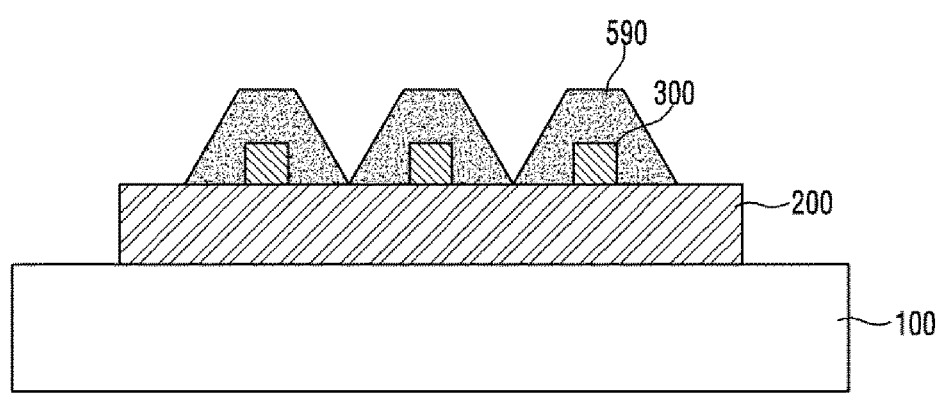
FIGS. 46a to 46d are cross sectional views showing the phosphor layer of the lamp unit according to the embodiment.
Figure 46B:
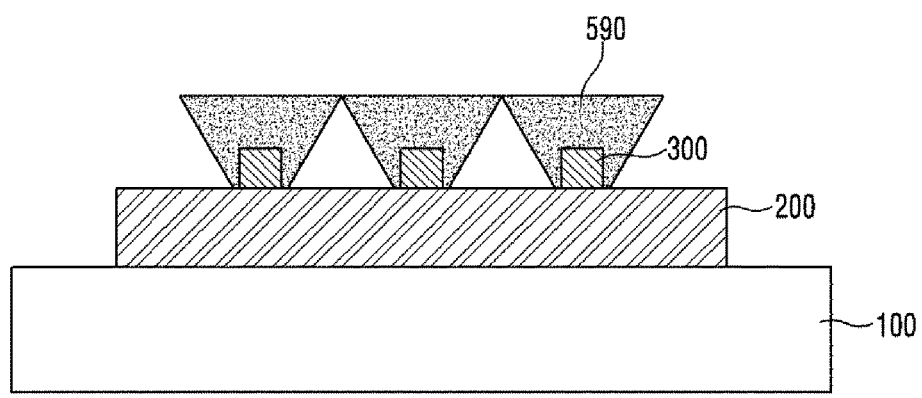

As shown in FIG. 46*a*, the phosphor layer 590 may be formed in a trapezoidal shape. The phosphor layer 590 may be formed in a reversed trapezoidal shape as shown in FIG. 46*b*.

Figure 46C:
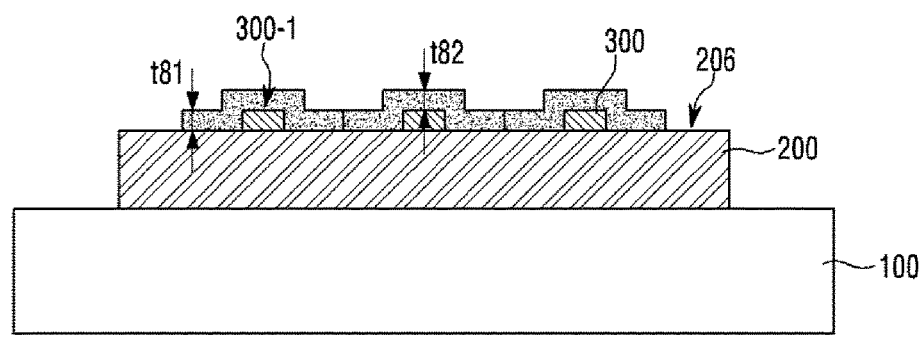
Figure 46D:
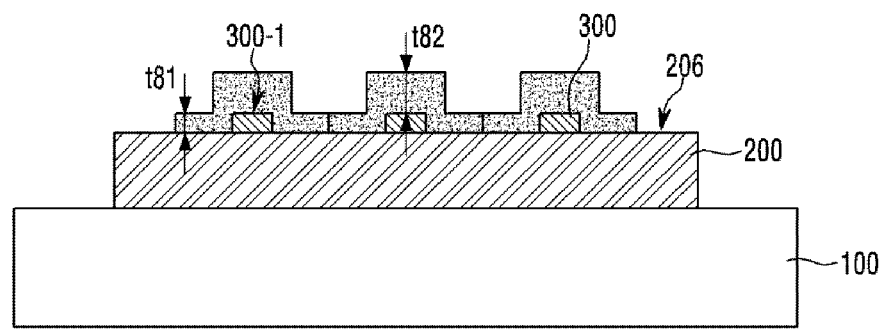

According to circumstances, as shown in FIGS. 46*c* and 46*d*, the phosphor layer 590 may be formed in a cap shape.

Here, as shown in FIG. 46*c*, the phosphor layer 590 may be formed on both the second substrate 200 and the light source 300. A thickness t81 of the phosphor layer 590 formed on the second substrate 200 may be equal to a thickness t82 of the phosphor layer 590 formed on the light source 300.

In another case, as shown in FIG. 46*d*, the thickness t81 of the phosphor layer 590 formed on the second substrate 200 may be different from the thickness t82 of the phosphor layer 590 formed on the light source 300.

For one example, the thickness t81 of the phosphor layer 590 formed on the second substrate 200 may be less than the thickness t82 of the phosphor layer 590 formed on the light source 300.

Figure 47:
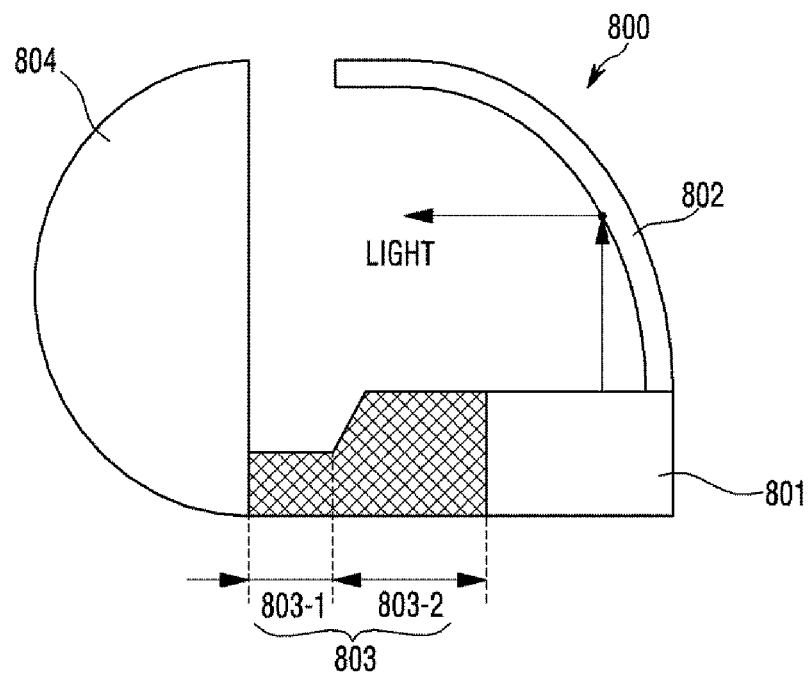
FIG. 47 is a cross sectional view showing the head lamp of the vehicle including the lamp unit according to the first embodiment.

FIG. 47 is a cross sectional view showing the head lamp of the vehicle including the lamp unit according to the first embodiment.

As shown in FIG. 47, a head lamp 800 may include a lamp unit 801, a reflector 802, a shade 803, and a lens 804.

Here, the reflector 802 may reflect light irradiated from the lamp unit 801 in a certain direction.

The shade 803 is disposed between the reflector 802 and the lens 804 to block or reflect a part of light reflected toward the lens 804 by the reflector 802, thereby providing a light distribution pattern desired by a designer.

The height of one side 803-1 of the shade 803 may be different from that of the other side 803-2 of the shade 803.

Light transmitted through the glass cover of the lamp unit 801 may be reflected by the reflector 802 and the shade 803, and then directed to the front of the vehicle through the lens 804.

Here, the lens 804 refracts light reflected by the reflector 802 to the front.

Figure 48:
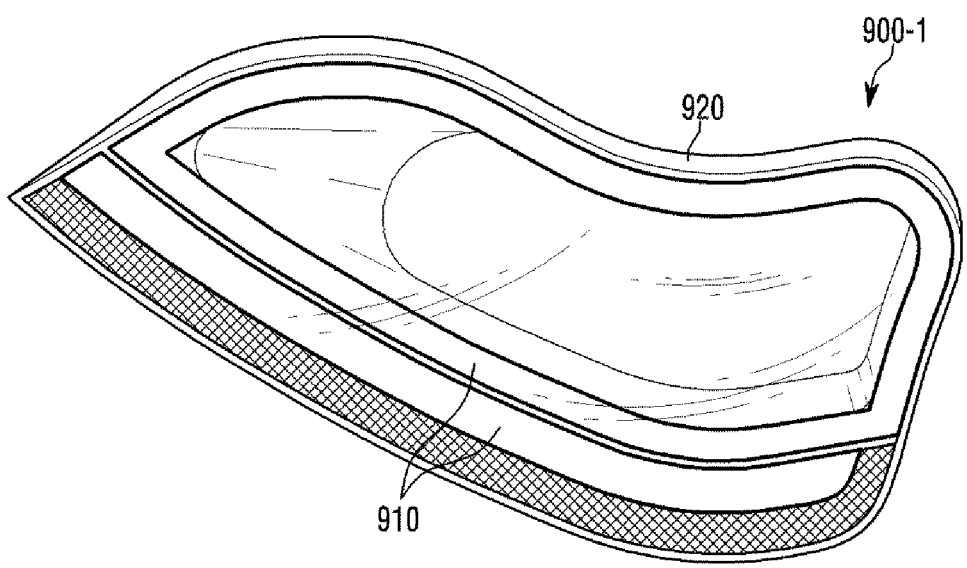
FIG. 48 is a front view showing the head lamp of the vehicle including the lamp unit according to the second embodiment.

FIG. 48 is a front view showing the head lamp of the vehicle including the lamp unit according to the second embodiment.

As shown in FIG. 48, a vehicle head lamp 900-1 may include a lamp unit 910 and a light housing 920.

Here, the lamp unit 910 may include the above-described embodiments. The light housing 920 may receive the lamp unit 910 and may be formed of a light-transmitting material.

The light housing 920 may be curved based on an installation position of a vehicle in which the light housing 920 is mounted and based on the design of the vehicle.

As such, in the vehicle head lamp including the lamp unit according to the embodiment, a plurality light source arrays which can be individually driven are disposed, thereby providing various light colors and luminous fluxes depending upon external environments.

In the vehicle head lamp including the lamp unit according to the embodiment, a plurality of light source arrays are efficiently disposed, thereby providing an optimum luminous flux by using a small number of the light sources and thereby reducing the size of the lamp unit.

Also, in the vehicle head lamp including the lamp unit according to the embodiment, the light source arrays having various light emission directions are disposed, thereby providing various beam patterns depending upon external environments.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lamp unit comprising:
a first substrate;
a second substrate disposed on the first substrate; and
a plurality of light sources disposed on the second substrate,
wherein at least two light source arrays are provided, in each of which a plurality of the light sources are disposed in a row,
wherein at least a first light source array and a second light source array among the light source arrays are individually driven,
wherein the second substrate comprises an upper surface including a first surface on which the first light source array is disposed and a second surface on which the second light source array, and
wherein the first surface is higher than the second surface.

2. The lamp unit of claim 1, wherein the upper surface of the second substrate includes a side surface disposed between the first surface and the second surface, and wherein the side surface is perpendicular to the first surface.

3. The lamp unit of claim 1, wherein a first light source included in the first light source array and a second light source included in the second light source array is disposed on different planes.

4. The lamp unit of claim 3, wherein an upper surface of the second light source is higher than the first surface.

5. The lamp unit of claim 3, wherein an upper surface of the second light source is coplanar with the first surface.

6. The lamp unit of claim 3, wherein an upper surface of the second light source is lower than the first surface.

7. The lamp unit of claim 3, wherein a first light emission direction of the first light source is different from a second light emission of the second light source.

8. The lamp unit of claim 7, wherein the first light emission is perpendicular to the second light emission.

9. The lamp unit of claim 7, wherein the first light emission is opposite to the second light emission.

10. The lamp unit of claim 1, wherein the upper surface of the second substrate includes a side surface disposed between the first surface and the second surface, and wherein the side surface is tilted at an obtuse angle with respect to the second surface.

11. The lamp unit of claim 10, wherein a third light source array is disposed on the side surface.

12. The lamp unit of claim 11, wherein a third light emission of a third light source included in the third light source array is different from a first light emission of a first light source included in the first light source array.

13. The lamp unit of claim 11, wherein a third luminous flux of a third light source included in the third light source array is different from a first luminous flux of a first light source included in the first light source array.

14. A lamp unit comprising:
a first substrate;
a second substrate disposed on the first substrate; and
a plurality of light sources disposed on the second substrate,
wherein at least two light source arrays are provided, in each of which a plurality of the light sources are disposed in a row,
wherein at least a first light source array and a second light source array among the light source arrays are individually driven,
wherein the second substrate comprises an upper surface, and
wherein the upper surface is concave or convex.

15. The lamp unit of claim 14, wherein a first light source included in the first light source array and a second light source included in the second light source array is disposed on the upper surface of the second substrate, and wherein a first light emission direction of the first light source is different from a second light emission of the second light source.

16. A lamp unit comprising:
a first substrate;
a second substrate disposed on the first substrate; and
a plurality of light sources disposed on the second substrate,
wherein at least two light source arrays are provided, in each of which a plurality of the light sources are disposed in a row,
wherein at least a first light source array and a second light source array among the light source arrays are individually driven,
wherein the second substrate comprises a projection protruded from an upper surface of the second substrate, and
wherein the first light source array is disposed on the projection, the second light source array is disposed on the upper surface.

17. The lamp unit of claim 16, wherein an angle between the upper surface of the second substrate and a side surface of the projection is a right angle.

18. The lamp unit of claim 16, wherein an angle between the upper surface of the second substrate and a side surface of the projection is an obtuse angle.

19. The lamp unit of claim 18, wherein a third light source array is disposed on the side surface of the projection.

20. The lamp unit of claim 19, wherein a first light emission direction of a first light source included in the first light source array is different from a third light emission of a third light source of the third light source array.

* * * * *